(12) United States Patent
Bessho et al.

(10) Patent No.: US 9,512,976 B2
(45) Date of Patent: Dec. 6, 2016

(54) LIGHT-EMITTING DEVICE, DISPLAY DEVICE AND ILLUMINATION DEVICE

(71) Applicant: SHARP KABUSHIKI KAISHA, Osaka (JP)

(72) Inventors: Hisanori Bessho, Osaka (JP); Mitsuhiro Koden, Osaka (JP); Yoshimasa Fujita, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 232 days.

(21) Appl. No.: 14/391,695

(22) PCT Filed: Apr. 10, 2013

(86) PCT No.: PCT/JP2013/060829
§ 371 (c)(1),
(2) Date: Oct. 9, 2014

(87) PCT Pub. No.: WO2013/154133
PCT Pub. Date: Oct. 17, 2013

(65) Prior Publication Data
US 2015/0077966 A1    Mar. 19, 2015

(30) Foreign Application Priority Data

Apr. 13, 2012  (JP) ................. 2012-092195

(51) Int. Cl.
*F21V 9/16* (2006.01)
*F21V 5/00* (2015.01)
(Continued)

(52) U.S. Cl.
CPC ............ *F21V 5/002* (2013.01); *F21V 9/08* (2013.01); *F21V 9/14* (2013.01); *F21V 13/02* (2013.01); *G02B 5/0242* (2013.01); *G02B 5/0278* (2013.01); *H01L 33/507* (2013.01); *H01L 33/60* (2013.01); *H01L 51/5268* (2013.01);
(Continued)

(58) Field of Classification Search
CPC .......... H01L 33/504; H01L 2399/0091; H01L 2924/0002; H01L 2924/00; H01L 51/5268; H01L 33/507; H01L 33/60; H01L 2933/0091; F21V 5/002; F21V 9/08; F21V 9/14; F21V 13/02; G02B 5/0242; G02B 5/0278; H05B 33/02; H05B 33/14
(Continued)

(56) References Cited

U.S. PATENT DOCUMENTS 4,402,827 A    9/1983  Joseph
6,469,755 B1   10/2002  Adachi et al.
(Continued)

FOREIGN PATENT DOCUMENTS

| JP | 2000-131683 A | 5/2000 |
| JP | 2001-202827 A | 7/2001 |
| JP | 2006-309225 A | 11/2006 |
| JP | 2008-040479 A | 2/2008 |
| JP | 2008-040480 A | 2/2008 |
| JP | 2008-262190 A | 10/2008 |

(Continued)

*Primary Examiner* — Anh Mai
*Assistant Examiner* — Glenn Zimmerman
(74) *Attorney, Agent, or Firm* — Morrison & Foerster LLP

(57) ABSTRACT

A light-scattering body includes at least light-transmitting resin, and first particles and second particles which are dispersed in the light-transmitting resin. An average grain size Da of the first particles is greater than an average grain size Db of the second particles. A refractive index na of the first particles is less than a refractive index nb of the second particles. The average grain size Db of the second particles is within a range of 150 nm≤Db≤300 nm.

18 Claims, 18 Drawing Sheets

(51) Int. Cl.
  *G02B 5/02* (2006.01)
  *H01L 51/52* (2006.01)
  *H05B 33/02* (2006.01)
  *H05B 33/14* (2006.01)
  *H01L 33/60* (2010.01)
  *F21V 9/08* (2006.01)
  *F21V 9/14* (2006.01)
  *F21V 13/02* (2006.01)
  *H01L 33/50* (2010.01)

(52) U.S. Cl.
  CPC ............. *H05B 33/02* (2013.01); *H05B 33/14* (2013.01); *H01L 33/504* (2013.01); *H01L 2924/0002* (2013.01); *H01L 2933/0091* (2013.01)

(58) Field of Classification Search
  USPC ....... 362/19, 84, 97.1, 97, 2, 97.3, 606, 607, 362/612, 617, 618, 619, 620; 313/501, 313/502, 504
  See application file for complete search history.

(56) References Cited

U.S. PATENT DOCUMENTS

| | | | |
|---|---|---|---|
| 6,762,553 | B1 | 7/2004 | Yokogawa et al. |
| 2002/0145685 | A1* | 10/2002 | Mueller-Mach .. G02F 1/133621 349/61 |
| 2006/0240286 | A1 | 10/2006 | Park et al. |
| 2008/0030860 | A1 | 2/2008 | Chang |
| 2008/0030994 | A1 | 2/2008 | Chang |
| 2008/0260997 | A1 | 10/2008 | Iwata et al. |
| 2009/0140630 | A1* | 6/2009 | Kijima ................ C09K 11/661 313/498 |
| 2010/0079704 | A1* | 4/2010 | Cho .................. G02F 1/133617 349/71 |
| 2012/0326180 | A1* | 12/2012 | Ohe ...................... H01L 27/322 257/88 |
| 2014/0168572 | A1* | 6/2014 | Iwata ................... H01L 51/5268 349/61 |

FOREIGN PATENT DOCUMENTS

| | | |
|---|---|---|
| JP | 4279971 B | 6/2009 |
| JP | 2009-244383 A | 10/2009 |

* cited by examiner

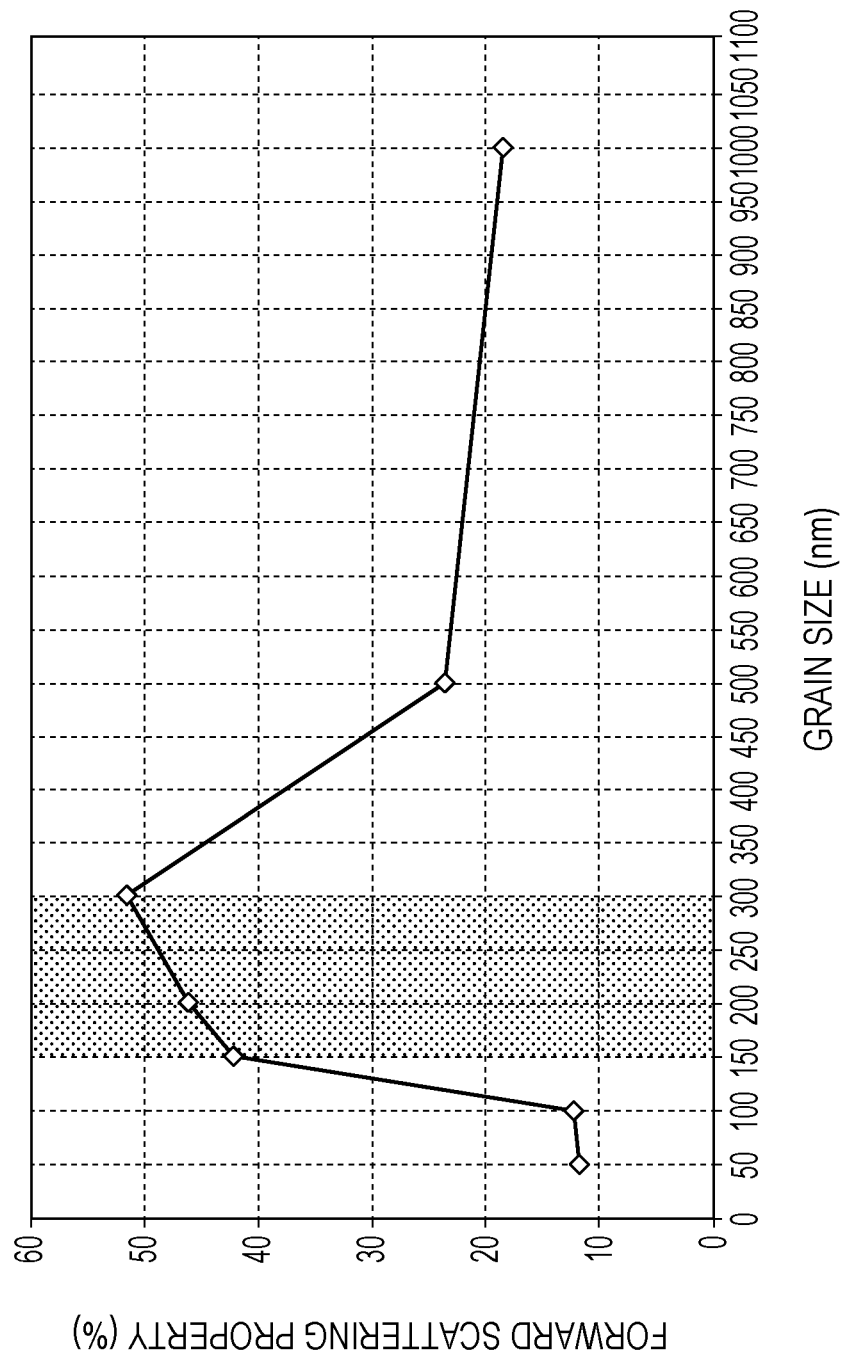

LIGHT-EMITTING DEVICE, DISPLAY DEVICE AND ILLUMINATION DEVICE

CROSS REFERENCE TO RELATED APPLICATIONS

This is a U.S. National Phase patent application of PCT/JP2013/060829, filed Apr. 10, 2013, which claims priority to Japanese patent application no. 2012-092195, filed Apr. 13, 2012, each of which is hereby incorporated by reference in the present disclosure in its entirety.

TECHNICAL FIELD

The present invention relates to a light-scattering body capable of efficiently diffusing incident light and emitting the incident light to the outside, a light-scattering body film, a light-scattering body substrate, a light-scattering body device, a light-emitting device, a display device, and an illumination device.

This application claims the benefit of priority of Japanese Patent Application No. 2012-092195 filed in Japan on Apr. 13, 2012, the entire contents of which are incorporated by reference herein.

BACKGROUND ART

In recent years, needs for flat panel displays (FPD) have increased with the development of highly-information oriented societies. Examples of the flat panel displays include a non-self-luminous liquid crystal display (LCD), a self-luminous plasma display (PDP), an inorganic electroluminescence (inorganic EL) display, and an organic electroluminescense (hereinafter, also referred to as an "organic EL" or an "organic LED") display.

Among these flat panel displays, the liquid crystal display has generally enhanced viewability by providing an illumination device as a light source on the rear surface of a transmitting liquid crystal display element and illuminating the liquid crystal element from the rear surface thereof.

According to such a liquid crystal display, outgoing light from the light source is generally unpolarized light. 50% or more of the outgoing light is absorbed by a polarizer arranged on an illumination light incident side of the liquid crystal display element, and efficiency of using the light from the light source is low. In addition, in a color liquid crystal display device in which a white light source is used as a light source and micro color filters corresponding to three primary colors or four primary colors are arranged in a display surface and which performs color display by additive process, over 70% of the light is absorbed by the color filters. Accordingly, efficiency of using the light from the light source is low, and an improvement in efficiency of using the light has been required.

In order to solve such a problem, PTLs 1 and 2 disclose the following color display devices, for example. The color display devices include a pair of transparent substrates, a liquid crystal layer, a liquid crystal display element, an illumination device, a first wavelength transformation phosphor, a second wavelength transformation phosphor, and a color filter. The pair of transparent substrates is arranged with a certain gap such that transparent electrode formation surfaces face each other. The liquid crystal layer is held between the transparent substrates. The liquid crystal display element includes voltage application means for applying a voltage corresponding to an image signal to pixels in a matrix shape, which are formed by transparent electrodes of the pair of transparent substrates. The illumination device emits light from a blue range to a blue green range. The first wavelength transformation phosphor emits red light by using the light from the blue range to the blue green range as excitation light. The second wavelength transformation phosphor emits green light by using the light from the blue range to the blue green range as excitation light. The color filter cuts light other than the blue range to the blue green range.

According to the aforementioned configuration, it is possible to use blue light emitted from a blue light source as it is for a pixel displaying blue color and to thereby enhance efficiency of using light.

However, according to the liquid crystal display device which uses the blue light source, when an image displayed is viewed from an oblique direction, the image has a yellowish tone, and a view angle color display property deteriorates.

Accordingly, PTL 3 discloses the following liquid crystal display device, for example. The liquid crystal display device includes a blue light source, a liquid crystal element, a color filter, and a light-scattering film. The blue light source emits blue light. The liquid crystal element includes a liquid crystal cell and a pair of polarizers which holds the liquid crystal cell therebetween. The color filter includes first and second phosphors. The first phosphor is excited with the blue light and emits red fluorescence. The second phosphor is excited with the blue light and emits green fluorescence. The light-scattering film scatters at least the blue light.

In addition, PTL 4 discloses a light-diffusing sheet, in which light-diffusing particles configuring a light-diffusing sheet are composed of first particles and second particles with a higher refractive index and a smaller grain size as compared with the first particles, a light-diffusing performance of which is thus enhanced, and which prevents occurrence of variations in luminance.

CITATION LIST

Patent Literature

PTL 1: Japanese Unexamined Patent Application Publication No. 2000-131683
PTL 2: Japanese Unexamined Patent Application Publication No. 2006-309225
PTL 3: Japanese Unexamined Patent Application Publication No. 2009-244383
PTL 4: Japanese Unexamined Patent Application Publication No. 2008-40479A

SUMMARY OF INVENTION

Technical Problem

According to the color display devices described in PTLs 1 and 2, it is possible to use blue light emitted from a blue light source as it is for a pixel displaying blue color and to thereby enhance efficiency of using light.

However, according to the liquid crystal display device which uses the blue light source, an image displayed has a yellowish tone when viewed from an oblique direction, and a view angle color display property deteriorates.

As for the liquid crystal display device described in PTL 3, an example in which the light-scattering particles configuring the light-scattering film are composed of two types with different grain sizes is described. However, since the grain sizes of the two types of particles are infinitely larger than a wavelength of light, a scattering property is insufficient so as to cause a scattering profile of scattered light to coincide with a light emission profile of fluorescence which is isotropically emitted, and the view angle color display property is not sufficiently enhanced.

In addition, a configuration in which nanoparticles with a high refractive index in addition to the above light-scattering particles are dispersed in light-transmitting resin configuring the light-scattering film is disclosed. However, the nanoparticles are dispersed to raise the refractive index of the light-transmitting resin and are not intended to be dispersed to apply scattering. The reason is that an average grain size of the particles is as significantly small as 100 nm or less and the grain size does not indicate the application of a wide scattering property.

According to the light-diffusing sheet described in PTL 4, it is possible to enhance the light diffusing performance and to prevent occurrence of variations in luminance. However, the range of grain sizes of the second particles is significantly wide from 10 nm to 1000 nm, and the grain sizes are not the grain sizes with which it is possible to apply a maximum forward diffusing performance with respect to the wavelength of light. Therefore, it is not possible to obtain a sufficient diffusing effect.

Some embodiments of the present invention were made in view of the above circumstances, and an object thereof is to provide a light-scattering body, a light-scattering body film, a light-scattering body substrate, a light-scattering body device, a light-emitting device, a display device, and an illumination device capable of efficiently emitting incident light to the outside, diffusing the incident light at a wide view angle, and emitting the incident light to the outside.

Solution to Problem

Some embodiments of the present invention provide a light-scattering body, a light-scattering body film, a light-scattering body substrate, a light-scattering body device, a light-emitting device, a display device, and an illumination device as follows.

A light-scattering body according to an aspect of the present invention includes at least light-transmitting resin; and first particles and second particles which are dispersed in the light-transmitting resin, in which an average grain size Da of the first particles is greater than an average grain size Db of the second particles, a refractive index na of the first particles is smaller than a refractive index nb of the second particles, and the average grain size Db of the second particles is within a range of 150 nm≤Db≤300 nm.

A light-scattering body according to the present invention includes at least light-transmitting resin; and first particles and second particles which are dispersed in the light-transmitting resin, in which an average grain size Da of the first particles is greater than an average grain size Db of the second particles, a refractive index na of the first particles is smaller than a refractive index nb of the second particles, and a relationship between mass concentration Ca of the first particles and mass concentration Cb of the second particles with respect to a mass of the light-transmitting resin is within a range of 5≤Ca/Cb≤20.

A relationship between the average grain size Da and the average grain size Db may be within a range of Da/Db≥2.

The average grain size Da may be 600 nm or more.

The average grain size Db may be 200 nm or more.

A relationship between the refractive index na and the refractive index nb may be within a range of nb−na≥0.4.

The refractive index na and the refractive index nb may be greater than a refractive index nc of the light-transmitting resin.

A relationship of the refractive index na, the refractive index nb, and the refractive index nc may be within a range of |na−nc|≥0.05 and |nb−nc|≥0.05.

The relationship between the mass concentration Ca and the mass concentration Cb may be within a range of Ca≥Cb.

The light-scattering body may further include third particles which are dispersed in the light-transmitting resin, in which the third particles have an average grain size which is different from the average grain size Da and the average grain size Db and have a refractive index which is different from the refractive index na and the refractive index nb.

The mass concentration Ca may be 10 wt % or higher.

The mass concentration Cb may be within a range of 0.5 wt %≤Cb≤5 wt %.

The first particles may be made of a polymer-based material.

The second particles may be made of a titanium oxide-based material.

At least one of the first particles and the second particles may be made of blue phosphor particles which are excited by ultraviolet light or blue light and emit blue fluorescence.

A light-scattering body film according to another aspect of the present invention includes at least the light-scattering body.

A film thickness T of the light-scattering body may be within a range of 1 μm≤T≤15 μm.

A light-scattering body substrate according to still another aspect of the present invention includes at least the light-scattering body film.

A base material which forms the light-scattering body substrate may be glass.

The refractive index nc of the light-transmitting resin may satisfy nc≈1.5.

A light-scattering body device according to still another aspect of the present invention includes a light source; and the light-scattering body substrate which is arranged so as to face the light source.

The light-scattering body device may further include a barrier with a light reflecting property which is formed along at least one side surface of the light-scattering film along a stacking direction of the light source and the light-scattering body substrate.

At least a region, which is in contact with the light-scattering film, of the barrier may have a light-scattering property.

The light-scattering body device may further include a low-refractive-index film provided on a surface, which faces the light source, of the light-scattering body substrate, the low-refractive-index film having a refractive index smaller than that of the light-scattering film.

The refractive index of the low-refractive-index film may be within a range of 1 or more and 1.5 or less.

The low-refractive-index film may be in the form of gas.

A light-emitting device according to still another aspect of the present invention includes an excitation light source which emits blue light; and a substrate, which is arranged so as to face the excitation light source, and on which a red phosphor film that forms a red pixel emitting red fluorescence by being excited with the blue light, a green phosphor film that forms a green pixel emitting green fluorescence by being excited with the blue light, and a blue scattering body film that forms a blue pixel scattering the blue light are formed, in which the substrate with the blue scattering body film formed thereon is configured of the light-scattering body device.

A light-emitting device according to still another aspect of the present invention includes an excitation light source which emits blue light; a substrate, which is arranged so as to face the excitation light source, and on which a red phosphor film that forms a red pixel emitting red fluorescence by being excited with the blue light and a green phosphor film that forms a green pixel emitting green fluorescence by being excited with the excitation light; and a blue light-scattering body film which scatters at least the blue light, in which the blue scattering body film is configured of the light-scattering body device.

A light-emitting device according to still another aspect of the present invention includes an excitation light source which emits blue light; a substrate, which is arranged so as to face the excitation light source, and on which a red phosphor film that forms a red pixel emitting red fluorescence by being excited with the blue light, a green phosphor film that forms a green pixel emitting green fluorescence by being excited with the blue light, and a blue phosphor film that forms a blue pixel emitting blue fluorescence by being excited with the blue light are formed; and a light-scattering body layer which scatters at least the fluorescence, in which the scattering body layer is configured of the light-scattering body device.

At least one of the red phosphor film and the green phosphor film may further include a light-scattering body, the light-scattering body may include at least light-transmitting resin and first particles and second particles which are dispersed in the light-transmitting resin, and an average grain size Da of the first particles may be greater than an average grain size Db of the second particles, a refractive index na of the first particles may be smaller than a refractive index nb of the second particles, and the average grain size Db of the second particles may be within a range of 150 nm≤Db≤300 nm.

The light-emitting device may further include a barrier with a light reflecting property which is formed along at least one side surface in a film thickness direction of the red phosphor film and the green phosphor film.

At least a region, which is in contact with the light-scattering film, of the barrier may have a light-scattering property.

The light-emitting device may further include a wavelength selecting transflective film provided on a side of incident surfaces, on which the blue light is incident, of the red phosphor film and the green phosphor film, the wavelength selecting transflective film transmitting at least light in a predetermined wavelength region around a peak wavelength of the blue light and reflecting at least light in a predetermined wavelength region around a light emission peak wavelength of the phosphor films.

The light-emitting device may further include a low-refractive-index film provided between the phosphor films and the substrate, the low-refractive-index film having a refractive index smaller than that of the substrate.

The refractive index of the low-refractive-index film may be within a range of 1 or more and 1.5 or less.

The low-refractive-index film may be in the form of a gas.

The light-emitting device may further include a light absorption layer provided in at least one of locations between the red phosphor film and the green phosphor film and between the red phosphor film and the blue scattering body film, which are adjacent to each other.

The light absorption layer may be formed on at least one of an upper surface and a lower surface of the barrier.

A display device according to still another aspect of the present invention includes at least the light-emitting device.

The display device may further include an active matrix drive element corresponding to the excitation light source.

The excitation light source may be any of a light-emitting diode, an organic electroluminescence element, and an inorganic electroluminescence element.

The display device may further include a liquid crystal element which is provided between the excitation light source and the substrate, the liquid crystal element being able to control transmittance of the blue light, and the excitation light source may be a plane-shaped light source.

The excitation light source may emit blue light with a directivity.

The display device may further include a polarizer which is provided between the excitation light source and the substrate, the polarizer having an extinction ratio of 10000 or more at a wavelength of 435 nm or more and 480 nm or less.

The display device may further include color filters between the substrate and the red phosphor film, the green phosphor film, and the blue scattering body film.

An illumination device according to still another aspect of the present invention includes the light-emitting device.

A storage container according to still another aspect of the present invention includes a reservoir chamber, an interior lamp which illuminates the inside of the reservoir chamber, a rack member which is provided in the reservoir chamber, and the light-scattering body film which is provided in at least a part of the rack member.

Advantageous Effects of Invention

According to some aspects of the present invention, it is possible to provide a light-scattering body, a light-scattering body film, a light-scattering body substrate, a light-scattering body device, a light-emitting device, a display device, and an illumination device capable of efficiently emitting incident light to the outside, to disperse the incident light at a wide view angle, and emit the incident light to the outside.

BRIEF DESCRIPTION OF DRAWINGS

FIG. 25 is a diagram showing a relationship between grain sizes of light-scattering particles which are dispersed in light-transmitting resin and a forward scattering property when light with a single wavelength of 450 nm is incident.

DESCRIPTION OF EMBODIMENTS

Figure 1:
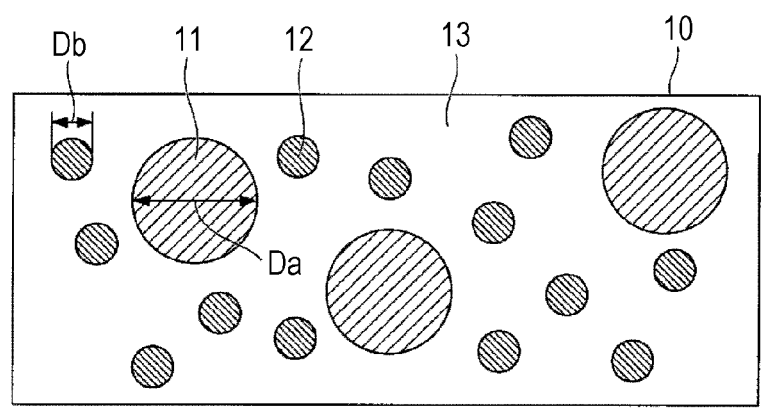
FIG. 1 is a schematic cross-sectional view showing a first embodiment of a light-scattering body according to the present invention.

Hereinafter, a description will be given of embodiments of a light-scattering body, a light-scattering body film, a light-scattering body substrate, a light-scattering body device, a light-emitting device, a display device, and an illumination device according to the embodiments with reference to drawings.

In addition, the embodiments shown below are for specific description in order to facilitate understanding of the gist of the present invention and are not intended to limit the present invention unless otherwise particularly designated.

Moreover, a part corresponding to a main part is enlarged in the drawings used in the following description for easier understanding of features of the embodiments for convenience in order to make it easier to understand features of the embodiments in some cases, and dimensional ratios and the like of the respective components are not necessarily the same as practical dimensional ratios and the like.

Light-Scattering Body

FIG. 1 is a schematic cross-sectional view showing a light-scattering body according to the embodiment.

A light-scattering body 10 is substantially configured of light-transmitting resin 13, first particles 11, and second particles 12. The first particles 11 are dispersed in the light-transmitting resin 13. The second particles 12 have a smaller average grain size and a large refractive index as compared with the first particles 11.

Hereinafter, a specific description will be given of the respective constituent members which configure the light-scattering body 10 and formation methods thereof. However, the embodiment is not limited to these constituent members and the formation methods.

As the first particles 11 and the second particles 12, any of an inorganic material and an organic material may be used.

In a case where an inorganic material is used as the particles which form the first particles 11 and the second particles 12, preferable examples thereof include particles (fine particles) and the like which contain, as a main constituent, an oxidative product of at least one kind of metal selected from a group consisting of silicon, titanium, zirconium, aluminum, indium, zinc, tin, and antimony. However, the embodiment is not limited to such inorganic materials.

In a case where particles (inorganic fine particles) which are made of the inorganic material are used as the particles, preferable examples thereof include silica beads (refractive index: 1.44), alumina beads (refractive index: 1.63), titanium oxide beads (refractive index of anatase type: 2.52, refractive index of rutile type: 2.71), zirconia oxide beads (refractive index: 2.05), zinc oxide beads (refractive index: 2.00), and barium titanate ($BaTiO_3$) (refractive index: 2.4). However, the embodiment is not limited to these inorganic fine particles.

In a case where particles (organic fine particles) which are made of the organic material are used as the particles, preferable examples thereof include polymethyl methacrylate beads (refractive index: 1.49), acrylic beads (refractive index: 1.50), acryl-styrene copolymer beads (refractive index: 1.54), melamine beads (refractive index: 1.57), high-refractive-index melamine beads (refractive index: 1.65), polycarbonate beads (refractive index: 1.57), styrene beads (refractive index: 1.60), cross-linked polystyrene beads (refractive index: 1.61), polyvinyl chloride beads (refractive index: 1.60), melamine formaldehyde beads (refractive index: 1.65), benzoguanamine-melamine formaldehyde beads (refractive index: 1.68), and silicone beads (refractive index: 1.50). However, the embodiment is not limited to these organic fine particles.

Examples of the light-transmitting resin 13 include acrylic resin (refractive index: 1.49), melamine resin (refractive index: 1.57), nylon (refractive index: 1.53), polystyrene (refractive index: 1.60), melamine beads (refractive index: 1.57), polycarbonate (refractive index: 1.57), polyvinyl chloride (refractive index: 1.60), polyvinylidene chloride (refractive index: 1.61), polyvinyl acetate (refractive index: 1.46), polyethylene (refractive index: 1.53), polymethylmethacrylate (refractive index: 1.49), polyMBS (refractive index: 1.54), medium-density polyethylene (refractive index: 1.53), high-density polyethylene (refractive index: 1.54), tetrafluoroethylene (refractive index: 1.35), poly trifluorochloroethylene (refractive index: 1.42), and polytetrafluoroethylene (refractive index: 1.35). However, the embodiment is not limited to the resin.

In addition, translucency described herein may be a property in which at least light (excitation light) emitted from a light source or the like or light emitted by the excitation light can be transmitted, and the light-transmitting resin is not necessarily colorless transparent resin.

The light-scattering body 10 can be formed by dispersing the resin in the aforementioned light-transmitting resin. As for a dispersion apparatus, examples thereof include dispersion methods using a general stirrer with a mechanism such as a propeller blade, a turbine blade, or a battle blade provided at the tip end thereof, a high-speed rotation centrifugal stirrer with a toothed disk-shaped impeller mechanism, which is obtained by alternately folding blades of a rim saw in a vertical direction and is provided at the tip end thereof, an ultrasonic emulsifying dispersion stirrer which performs dispersion processing by intensively generating ultrasonic energy, and a bead mill apparatus in which a container is filled with beads and is rotated and raw materials are ground, pulverized, and dispersed. However, the embodiment is not limited to these methods.

It is preferable that a relationship between an average grain size Da of the first particles 11 and an average grain size Db of the second particles 12 satisfy Da>Db, that a relationship between a refractive index na of the first particles 11 and a refractive index nb of the second particles 12 satisfy na<nb, and that the grain size Db of the second particles satisfy 150 nm≤Db≤300 nm.

In a case where only particles with grain sizes which are infinitely larger than the wavelength of light and with a low refractive index which is substantially the same as the refractive index of the light-transmitting resin are dispersed in the light-transmitting resin in the light-scattering body, spreading of outgoing light with respect to incident light which is incident on the particles is narrow, and a difference between refractive indexes of the particles and of the light-transmitting resin is significantly small. Accordingly, components which are reflected by the surfaces are small among the incident light which is incident on the particles, and therefore, a significantly high transmission property can be obtained. However, since the spreading of the outgoing light (scattered light) is narrow as described above, it is not possible to obtain a sufficient scattering property (view angle property).

In contrast, in a case where only particles with grain sizes which are equal to or less than the wavelength of the light and with a property of a higher refractive index than the refractive index of the light-transmitting resin are dispersed in the light-transmitting resin in the light-scattering body, the spreading of the outgoing light (scattered light) with respect to the incident light which is incident on the light-scattering particles is significantly large, and it is possible to obtain a scattering property of a wide view angle. However, since the difference between the refractive indexes of the particles and of the light-transmitting resin is large as described above, the components which are reflected by the surfaces are large among the incident light which is incident on the particles. Therefore, it is not possible to obtain a sufficient transmission property.

That is, it is possible to balance the high transmission property of the outgoing light (scattered light) with respect to the incident light and the wide view angle property by configuring the light-scattering body of two kinds of particles with different properties, which satisfy the aforementioned relationships, and the light-transmitting resin. In addition, it is possible to more widely scatter at least light with a wavelength in a visible light range forward by setting the average grain size of the second particles from 150 nm to 300 nm, and to thereby obtain a wider view angle property.

FIG. 25 is a diagram showing a relationship between grain sizes of the light-scattering particles which are dispersed in the light-transmitting resin and the forward scattering property when light with a single wavelength of 450 nm is incident. In FIG. 25, the forward scattering property is defined as a total light beam transmittance×a relative luminance ratio.

As shown in FIG. 25, it is possible to state that the forward scattering property deteriorates if the grain size is less than 150 nm. Similarly, it is possible to state that the forward scattering property deteriorates if the grain size is greater than 300 nm. Based on FIG. 25, it is possible to state that the grain size Db of the second particles 12 preferably satisfies 150 nm≤Db≤300 nm in order to secure the forward scattering property, that is, in order to balance the high transmission property and the wide scattering property.

In addition, it is also preferable that third particles in addition to the first particles 11 and the second particles 12 be further dispersed in the light-transmitting resin 13. The third particles are preferably particles with an average grain size which is different from the average grain size Da of the first particles 11 and the average grain size Db of the second particles 12 and with a refractive index which is different from the refractive index na of the first particles 11 and the refractive index nb of the second particles 12.

Furthermore, it is also preferable that four or more kinds of particles be dispersed in the light-transmitting resin 13.

In the light-scattering body 10, it is preferable that the relationship between the average grain size Da of the first particles 11 and the average grain size Db of the second particles 12 satisfy Da>Db, that the relationship between the refractive index na of the first particles 11 and the refractive index nb of the second particles 12 satisfy na<nb, and that a relationship between mass concentration Ca of the first particles 11 and mass concentration Cb of the second particles 12 with respect to the light-transmitting resin satisfy 5≤Ca/Cb≤20.

Since the refractive index of the second particles 12 is high, a rate of the components which are reflected by the surfaces of the particles is high as described above, and an excessively high concentration results in deterioration of the transmittance. In contrast, since the grain size of the first particles 11 is large, an excessively high concentration disturbs formation of a thin film. That is, it is possible to form a thin film and to balance the high transmission property and the wide view angle property by setting the relationship of the concentration (content) between the first particles 11 and the second particles 12 to the aforementioned relationship of 5≤Ca/Cb≤20.

Furthermore, the relationship between the grain size Da of the first particles 11 and the grain size Db of the second particles 12 is preferably within a range of Da/Db 2 in the light-scattering body 10. Generally, a scattering intensity parameter which determines the scattering property is represented by a relationship of a difference between the refractive index of the particles and the refractive index of an environment surrounding the particles, a grain size parameter $\alpha$ ($\alpha = \pi D/\lambda$ [D: a particle diameter of a particle, $\lambda$: a wavelength of light]), and a scattering angle $\theta$ (an angle between the incident light which is incident on a particle and the scattered light which is scattered due to contact with the particle).

Among them, a parameter which greatly affects the scattering property is the grain size parameter $\alpha$. In a case where $\alpha < 1$, scattering intensity distribution is in a range of so-called Rayleigh scattering in which forward scattering ($\theta$=about 0°) and backward scattering ($\theta$=about) 180° are dominant and substantially no light is scattered in a side direction ($\theta$=about 90°).

In addition, in a case where $\alpha \approx 1$, the scattering intensity distribution is in a range of so-called Mie scattering in which the forward scattering and the side scattering are dominant and substantially no light is scattered in the backward direction. Moreover, in a case where $\alpha \gg 1$, the scattering intensity distribution is in a range of so-called diffraction scattering based on geometric optics in which the forward scattering is dominant and substantially no light is scattered in the side and backward directions.

In the light-scattering body 10 according to the embodiment, the high transmission property and the wide view angle property are balanced by dispersing the first particles 11 with the aforementioned diffraction scattering property and the second particles 12 with the Mie scattering property in the light-transmitting resin 13. Accordingly, in a case where a ratio (Da/Db) of the grain sizes of the two kinds of particles is small, it is not possible to apply targeted scattering properties to the two kinds of particles with respect to the incident light, and as a result, it is not possible to balance the high transmission property and the wide view angle property. Particularly, if Da/Db is less than 2 and the light which is incident on the light-scattering body according to the embodiment ranges the entire visible light region (from about 350 nm to about 750 nm), there is a concern in that the targeted scattering property cannot be applied to the two kinds of light-scattering particles.

Furthermore, the grain size Da of the first particles 11 is preferably 600 nm or more. In general, a rate of the side scattering components increases as the grain size of the light-scattering particles decreases, from a region where the grain size of the particles is infinitely larger than the wavelength of the incident light to a region where the grain size of the particles is about the same as the wavelength of the incident light, as described above. In a case where a refractive index nc of the light-transmitting resin is 1.5 and the wavelength of the incident light is 460 nm, for example, a critical angle at which it is possible to extract the light to the outside (an air layer with a refractive index of 1.0) is about 42° according to Snell's law. In a case where the refractive index na of the first particles 11 is 1.6, the scattered light which is scattered at an angle of 42° or more is generated if the grain size Da thereof is less than 600 nm. Therefore, such scattered light cannot be extracted to the outside, and there is a concern in that the targeted high transmission property of the first particles 11 cannot be achieved.

Furthermore, the grain size Db of the second particles 12 preferably satisfies 150 nm≤Db≤200 nm. In general, the rate of the side scattering components decreases as the grain size of the particles increases, from a range in which the grain size of the particles is infinitely smaller than the wavelength of the incident light to a range in which the grain size of the particles is about the same as the wavelength of the incident light, as described above. In a case where the refractive index nc of the light-transmitting resin is 1.5 and the wavelength of the incident light is 460 nm, for example, a critical angle at which it is possible to extract the light to the outside (an air layer with a refractive index of 1.0) is about 42° according to Snell's law.

In order to widen the view angle of the scattered light, intensity of the scattering from the particles is ideally equally distributed when a scattering angle $\theta$ is from 0° to 42°. In a case where the refractive index na of the second particles 12 is 2.7 and the grain size Db is 200 nm, if a scattering intensity ratio at the scattering angle $\theta$ of 42° with respect to the scattering intensity of at the scattering angle $\theta$ of 0° is about 50% and Db becomes 200 nm or more, the scattering intensity ratio decreases, and there is a concern in that the targeted wide view angle property of the second particles 12 cannot be achieved.

It is further preferable that the relationship between the refractive index na of the first particles 11 and the refractive index nb of the second particles 12 satisfies nb−na≥0.4. As for the refractive index of the particles among the aforementioned scattering intensity parameters, a wider scattering property is generally achieved as the refractive index increases, and in a case where there is a small difference between the refractive indexes of the two kinds of particles, the scattering properties of the two kind of particles do not greatly differ, and it is not possible to balance the high transmission property and the wide view angle property.

It is further preferable that the refractive index na of the first particles 11 and the refractive index nb of the second particles 12 be greater than the refractive index nc of the light-transmitting resin 13. If the refractive index of the particles is made to decrease from the region where the refractive index is greater than the refractive index of the light-transmitting resin, the rate of the side scattering components decreases. If there becomes no difference between both the refractive indexes, substantially no light is scattered in the side direction in general. If the refractive index nb of the second particles 12, for which an increase in the side scattering components is important, becomes equal to the refractive index nc of the light-transmitting resin 13, for example, the side scattering components decrease, and the targeted wide view angle property of the second particles 12 cannot be achieved.

It is further preferable that the relationship among the refractive index na of the first particles 11, the refractive index nb of the second particles 12, and the refractive index nc of the light-transmitting resin 13 satisfy |na−nc|≥0.05 and |nb−nc|≥0.05. If the difference between the refractive index of the particles and the refractive index of the light-transmitting resin is made to decrease, the rate of the side scattering components decreases. If there becomes no difference between both the refractive indexes, substantially no light is scattered in the side direction in general.

It is further preferable that the relationship between the mass concentration Ca of the first particles 11 and the mass concentration Cb of the second particles 12 with respect to the mass of the light-transmitting resin 13 satisfy Ca≥Cb. If the rate of the particles with respect to the light-transmitting resin increases, the wide view angle scattering property can be obtained while the transmission property deteriorates, in general. The first particles 11 according to the embodiment are for applying the wide view angle property to the light-scattering body 10, and the second particles are for applying the high transmission property to the light-scattering body. Accordingly, it is possible to balance the high transmission property and the wide view angle property by satisfying the relationship of Ca≥Cb.

It is further preferable that the mass concentration Ca of the first light particles 11 satisfy Ca≥10 wt %. If the concentration is lower than 10 wt %, it is not possible to obtain a sufficient scattering property, and as a result, it is not possible to achieve the wide view angle property.

It is further preferable that the mass concentration Cb of the second particles 12 satisfy 0.5 wt %≤Cb≤5 wt %. If the concentration is lower than 0.5 wt %, it is not possible to obtain a sufficient scattering property, and as a result, it is not possible to achieve the wide view angle property. In addition, if the concentration is higher than 5 wt %, it is not possible to obtain a sufficient transmission property, and as a result, it is not possible to achieve the high transmission property.

It is further preferable that the first particles be made of a polymer-based material. The refractive index of the polymer-based material is generally from 1.5 to 1.6, and a difference of the refractive index from that of the light-transmitting resin is not excessively large. It is possible to minimize the components reflected by the surfaces of the particles, and as a result, it is possible to achieve the high transmission property.

It is further preferable that the second particles be made of a titanium oxide-based material. The titanium oxide-based material generally has a grain size from about 50 nm to about 400 nm and a refractive index of 2.0 or more and has a wide scattering property, and as a result, it is possible to achieve the wide view angle property.

It is further preferable that at least any of the first particles and the second particles are made of blue phosphor particles which emit blue fluorescence by being excited with ultraviolet light or blue light. In a case where the light which is incident on the light-scattering body is ultraviolet light or blue light including the ultraviolet light, it is possible to apply a function of converting a wavelength of the ultraviolet light which is incident by the blue phosphor particles into a wavelength of blue light, that is, a function as a so-called ultraviolet ray cutting filter.

Light-Scattering Body Film

Figure 2:
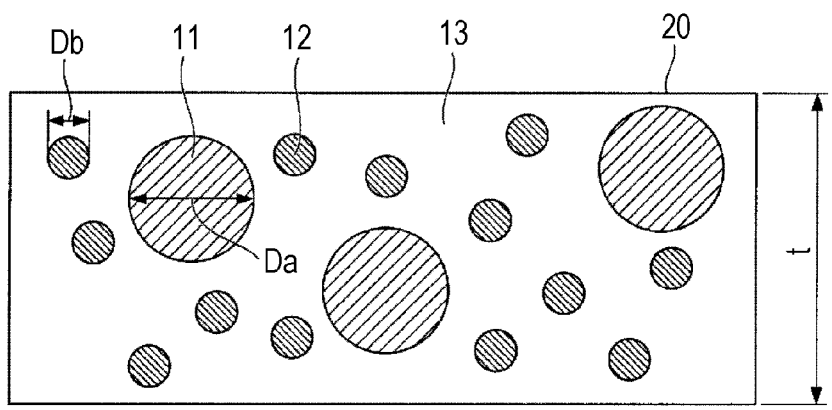
FIG. 2 is a schematic cross-sectional view showing an embodiment of a light-scattering body film according to the present invention.

FIG. 2 is a schematic cross-sectional view showing a light-scattering body film according to an embodiment. The light-scattering body film 20 is configured of the aforementioned light-scattering body and has an arbitrary film thickness.

Hereinafter, a specific description will be given of a formation method of the light-scattering body film 20. However, the embodiment is not limited to these constituent members and the formation methods.

The light-scattering body film 20 is provided with the aforementioned light-scattering body 10. As the formation method, it is possible to form the light-scattering body film 20 by a known wet process by an application method such as a spin coating method, a dipping method, a doctor blade method, an ejection coating method, or a spray coating method or by a printing method such as an ink jet method, a relief printing method, an intaglio printing method, a screen printing method, or a micro-gravure printing method, a known dry process such as a resistive heating deposition method, an electron beam (EB) deposition method, a molecular beam epitaxy (MBE) method, a sputtering method, or an organic vapor phase deposition (OVPD) method of the above materials, or a formation method such as a laser transfer method.

In addition, it is possible to pattern the light-scattering body film 20 by a photolithography method by using photosensitive resin as polymeric resin. Here, it is possible to use, as the photosensitive resin, one kind or a mixture of a plurality of kinds of photosensitive resin (photo-curable resist material) which includes a reactive vinyl group, such as acrylic acid-based resin, methacrylic acid-based resin, polyvinyl cinnamate-based resin, or hard rubber-based resin.

In addition, it is possible to directly pattern the light-scattering body by a wet process such as an ink jet method, a relief printing method, an intaglio printing method, a screen printing method, or a dispenser method, a known dry process such as a resistive heating deposition method using a shadow mask, an electron beam (EB) deposition method, a molecular beam epitaxy (MBE) method, a sputtering method, or an organic vapor phase deposition (OVPD) method, a laser transfer method, or the like.

A film thickness T of the light-scattering body film 20 preferably satisfies 1 μm≤t≤15 μm. If the thickness is thinner than 1 μm, it is not possible to obtain a sufficient scattering property, and as a result, it is not possible to achieve the wide view angle property. In addition, if the thickness is greater than 15 μm, it is not possible to obtain a sufficient transmission property, and as a result, it is not possible to achieve the high transmission property, which does not bring about an improvement in efficiency, brings about only consumption of the materials, and results in an increase in material cost. It is further preferable that the light-scattering body film 20 be a thin film within a range in which a sufficient transmission performance can be maintained.

Light-Scattering Body Substrate

Figure 3:
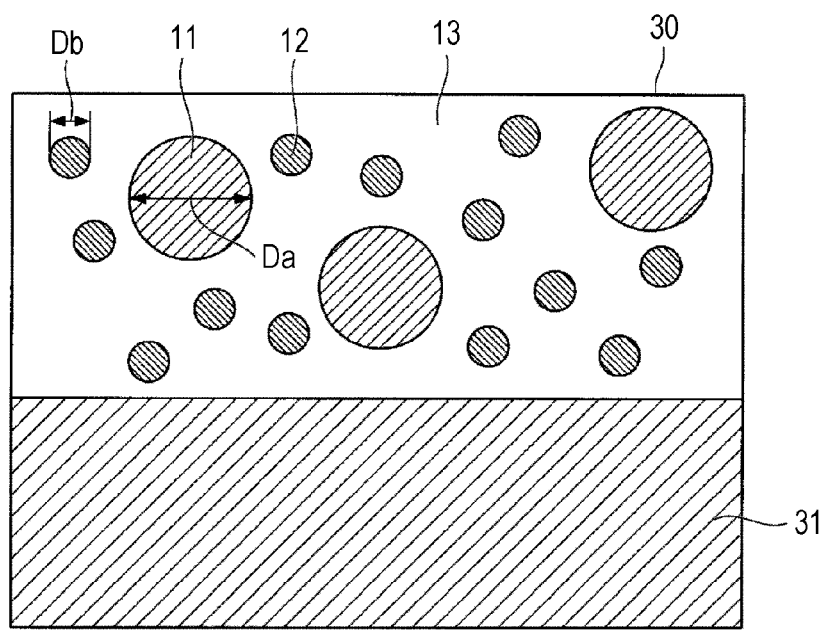
FIG. 3 is a schematic cross-sectional view showing an embodiment of a light-scattering body substrate according to the present invention.

FIG. 3 is a schematic cross-sectional view showing an embodiment of a light-scattering body substrate according to the embodiment. A light-scattering body substrate 30 according to the embodiment is obtained by forming the aforementioned light-scattering body film 20 on a substrate 31.

Hereinafter, a specific description will be given of the respective constituent members which configure the light-scattering body substrate 30 and formation methods thereof. However, the embodiment is not limited to the constituent members and the formation methods.

Since it is necessary to extract the scattered light from the light-scattering body film 20 to the outside, the substrate 31 is required to transmit the scattered light in a light wavelength region of the scattered light. Although examples thereof include an inorganic material substrate made of glass, quartz, or the like and a plastic substrate made of polyethylene terephthalate, polycarbazole, polyimide, or the like, the embodiment is not limited to these substrates.

The light-scattering body substrate 30 is configured of the aforementioned light-scattering body film 20 and the substrate 31. As a formation method of the light-scattering body film 20 on the substrate 31, it is possible to form the light-scattering body film 20 by a known wet process by an application method such as a spin coating method, a dipping method, a doctor blade method, an ejection coating method, or a spray coating method, or by a printing method such as an ink jet method, a relief printing method, an intaglio printing method, a screen printing method, or a micro-gravure printing method, a known dry process such as a resistive heating deposition method, an electron beam (EB) deposition method, a molecular beam epitaxy (MBE) method, a sputtering method, or an organic vapor phase deposition (OVPD) method of the above materials, or a formation method such as a laser transfer method.

In addition, it is possible to pattern the light-scattering body film 20 by the photolithography method by using photosensitive resin as polymer resin. Here, it is possible to use, as the photosensitive resin, one kind or a mixture of a plurality of kinds of photosensitive resin (photo-curable resist material) which includes a reactive vinyl group, such as acrylic acid-based resin, methacrylic acid-based resin, polyvinyl cinnamate-based resin, or hard rubber-based resin.

In addition, it is possible to directly pattern the light-scattering body by a wet process such as an ink jet method, a relief printing method, an intaglio printing method, a screen printing method, or a dispenser method, a known dry process such as a resistive heating deposition method using a shadow mask, an electron beam (EB) deposition method, a molecular beam epitaxy (MBE) method, a sputtering method, or an organic vapor phase deposition (OVPD) method, a laser transfer method, or the like.

The substrate 31 is preferably made of glass. Since glass generally has a transmittance in a visible light region which is as high as 90% or greater when the glass has a thickness of 3 mm or less, it is possible to configure the light-scattering body substrate with a high transmission property.

It is further preferable that a relationship between a refractive index nd of the substrate 31 and the refractive index nc of the light-transmitting resin 13 satisfy nd≈nc. With such a configuration, it is possible to guide light, which is directed from the light-scattering body film toward the substrate, to an interface with the outside without refracting or reflecting the light by an interface between the light-scattering body film and the substrate. That is, it is possible to cause the scattered light generated in the light-scattering body film to be incident on the inside of the film and to guide the scattered light to the interface with the outside without changing a profile of the scattered light.

Light-Scattering Body Device (1) First Embodiment

Figure 4:
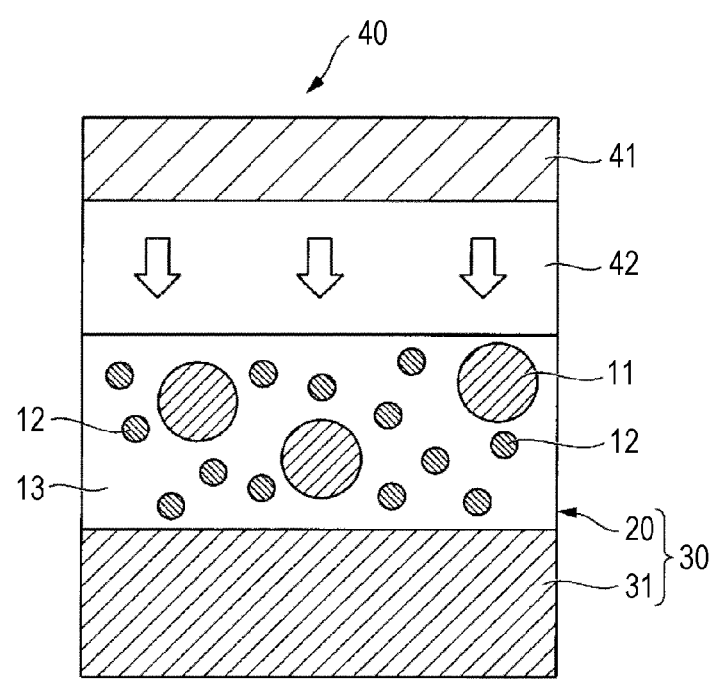
FIG. 4 is a schematic cross-sectional view showing a first embodiment of a light-scattering body device according to the present invention.

FIG. 4 is a schematic cross-sectional view showing a first embodiment of a light-scattering body device according to the embodiment.

A light-emitting device 40 is substantially configured of a light source 41 which emits incident light, a flattening film 42, and a light-scattering body substrate 30. The light-scattering body substrate 30 is arranged so as to face the light source 41 via the flattening film 42. The light-scattering body substrate 30 is configured of a substrate 31 on which a light-scattering body film 20 for scattering incident light is formed.

Hereinafter, a specific description will be given of the respective constituent members which configure the light-emitting device 40 and formation methods thereof. However, the embodiment is not limited to these constituent members and the formation methods.

As the light source 41, a light source which emits ultra-violet light or blue light is used. Examples of such a light source include an ultraviolet light emitting diode (hereinafter, also abbreviated as an "ultraviolet LED"), a blue light emitting diode (hereinafter, also abbreviated as a "blue LED"), an ultraviolet light emitting inorganic electroluminescence element (hereinafter, also abbreviated as an "ultraviolet light emitting inorganic EL element"), a blue light emitting inorganic electroluminescence element (hereinafter, also abbreviated as a "blue light emitting inorganic EL element"), an ultraviolet light emitting organic electroluminescence element (hereinafter, also abbreviated as an "ultraviolet light emitting organic EL element"), and a blue light emitting organic electroluminescence element (hereinafter, also abbreviated as a "blue light emitting organic EL element). Although it is possible to exemplify the above light sources as the light source 41, the light source 41 is not limited thereto.

In addition, it is possible to control ON/OFF of light emission for image display by directly switching the light source 41, or alternatively, it is also possible to control ON/OFF of the light emission by arranging a layer of a liquid crystal or the like with a shutter function between the light source 41 and the light-scattering body film 20 and controlling the layer. Moreover, it is also possible to control ON/OFF of both the layer of liquid crystal or the like with the shutter function and the light source 41.

The flattening film 42 is provided on the upper surface (the surface which faces the light source 41) of the light-scattering body film 20, and the upper surface of the light-scattering body film 20 is flattened. With such a configuration, it is possible to prevent a gap from being generated between the light source 41 and the light-scattering body film 20 and to enhance an adhesion property between the light source 41 and the light-scattering body film 20.

The light-scattering body film 20 and the substrate 31 are made of the aforementioned materials.

Since the formation method of the light-scattering body film 20 is the same as the aforementioned method, the description thereof will be omitted.

A description will be given of light emission of the light-scattering body device 40 with reference to FIG. 4.

If light is incident on the light-scattering body film 20 from the light source 41 and the incident light is brought into contact with particles in the light-scattering body device 40, the incident light is scattered in arbitrary directions based on grain sizes and refractive indexes of the particles as described above. Then, a part of components, which are directed to a light extraction side (the front direction, the side of the substrate 31), among the light which has been scattered (scattered light) can be extracted to the outside as effective light.

In addition, a large part of components, which is scattered to directions of the side surface and the bottom surface of the light-scattering body film 20, among the scattered light which has been scattered from the light-scattering body film 20 cannot be extracted to the outside. That is, in order to efficiently extract the light, which is incident on the light-scattering body film 20, to the outside, the scattered light preferably has a profile of being equally scattered within a critical angle generated by a difference between the refractive indexes of the light-transmitting resin 13 and of the substrate 31 that form the light-scattering body film 20 or within a critical angle generated by a difference between the refractive indexes of the substrate 31 and of the outside. The grain sizes, the refractive indexes, and the concentration which determine the profile of the scattered light are important parameters.

A light-scattering material which forms the light-scattering body film 20 according to the embodiment is made of first particles 11 with a scattering angle θ of scattered light with respect to the incident direction of the incident light, which varies in a narrow range, that is, the first particles 11 with a narrow scattering profile with which the light is scattered within the critical angle, and second particles 12 with a smaller grain size and a higher refractive index as compared with the first particles 11 and with a wide scattering profile with which the light is scattered within a wide range. Therefore, it is possible to significantly efficiently extract the incident light to the outside at a wide view angle.

(2) Second Embodiment

Figure 5A:
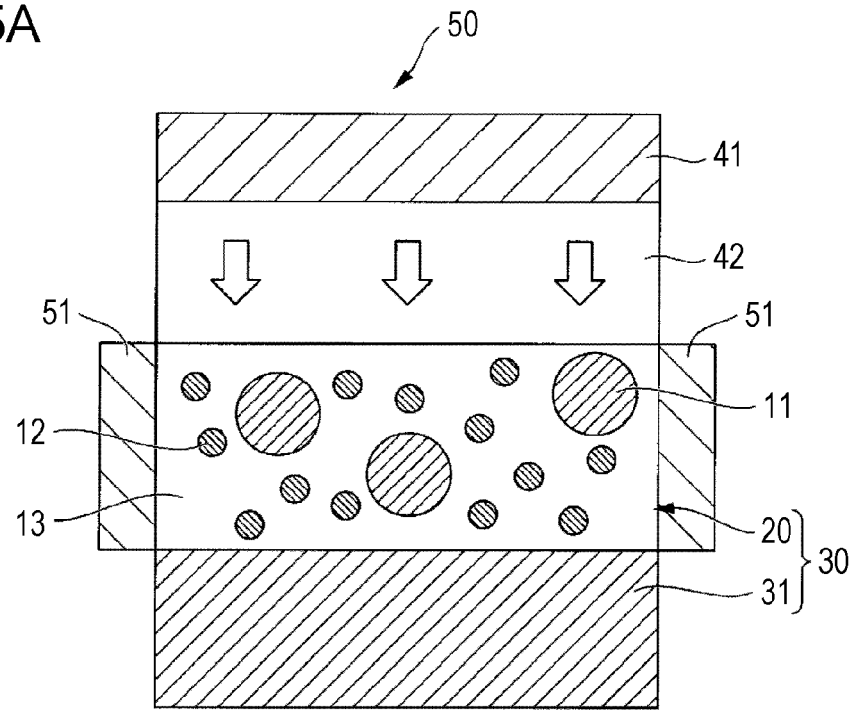
FIG. 5A is a schematic cross-sectional view showing a second embodiment of a light-scattering body device according to the present invention and a modification example thereof.

FIG. 5A is a schematic cross-sectional view showing a second embodiment of a light-scattering body device according to the embodiment. In FIG. 5A, a description of the same constituent elements as those in the light-scattering body device 40 shown in FIG. 4 will be omitted.

A light-scattering body device 50 is substantially configured of the light source 41, the substrate 31, the flattening film 42, the light-scattering body film 20, and a barrier 51. The substrate 31 is arranged so as to face the light source 41 via the flattening film 42. On the substrate 31, the light-scattering body film 20 which scatters the incident light is formed. The barrier 51 surrounds the side surface of the light-scattering body film 20 along a stacking direction of the light source 41 and the substrate 31.

At least a part, which faces the light-scattering body film 20, of the barrier 51 has a light-scattering property.

Examples of the configurations of the barrier 51 with the light-scattering property include a configuration in which the barrier 51 itself is formed of a material containing resin and light-scattering particles. Alternatively, it is possible to exemplify a configuration in which a light-scattering layer (light-scattering film) made of a material containing resin and light-scattering particles is provided on the side surface of the barrier 51, as a configuration in which the barrier 51 has a light egg-production property.

As a material for forming the barrier 51 itself (hereinafter, referred to as a "barrier material") or a material for forming the light-scattering layer (light-scattering film) provided on the side surface of the barrier 51 (hereinafter, referred to as a "light-scattering film material"), a material which contains resin and light-scattering particles is used.

Examples of the resin include acrylic resin (refractive index: 1.49), melamine resin (refractive index: 1.57), nylon (refractive index: 1.53), polystyrene (refractive index: 1.60), melamine beads (refractive index: 1.57), polycarbonate (refractive index: 1.57), polyvinyl chloride (refractive index: 1.60), polyvinylidene chloride (refractive index: 1.61), polyvinyl acetate (refractive index: 1.46), polyethylene (refractive index: 1.53), polymethylmethacrylate (refractive index: 1.49), polyMBS (refractive index: 1.54), medium-density polyethylene (refractive index: 1.53), high-density polyethylene (refractive index: 1.54), tetrafluoroethylene (refractive index: 1.35), poly trifluorochloroethylene (refractive index: 1.42), and polytetrafluoroethylene (refractive index: 1.35). However, the embodiment is not limited to the resin.

The light-scattering particles may be formed any of an inorganic material and an organic material.

In a case where an inorganic material is used as the light-scattering particles, examples thereof include particles (fine particles) or the like which contain, as a main constituent, an oxidative product of at least one kind of metal selected from a group consisting of silicon, titanium, zirconium, aluminum, indium, zinc, tin, and antimony. However, the embodiment is not limited to such inorganic materials.

In addition, in a case where particles (inorganic fine particles) made of the inorganic material are used as the light-scattering particles, examples thereof include silica beads (refractive index: 1.44), alumina beads (refractive index: 1.63), titanium oxide beads (refractive index of anatase type: 2.50, refractive index of rutile type: 2.70), zirconia oxide beads (refractive index: 2.05), zinc oxide beads (refractive index: 2.00), and barium titanate ($BaTiO_3$) (refractive index: 2.4). However, the embodiment is not limited to these inorganic fine particles.

In a case where particles (organic fine particles) which are made of an organic material are used as the light-scattering particles, examples thereof include polymethyl methacrylate beads (refractive index: 1.49), acrylic beads (refractive index: 1.50), acryl-styrene copolymer beads (refractive index: 1.54), melamine beads (refractive index: 1.57), high-refractive-index melamine beads (refractive index: 1.65), polycarbonate beads (refractive index: 1.57), styrene beads (refractive index: 1.60), cross-linked polystyrene beads (refractive index: 1.61), polyvinyl chloride beads (refractive index: 1.60), benzoguanamine-melamine formaldehyde beads (refractive index: 1.68), and silicone beads (refractive index: 1.50). However, the embodiment is not limited to these organic fine particles.

In addition, the barrier material and the light-scattering film material may contain a photopolymerization initiator and an antifoaming agent or a leveling agent such as dipropyleneglycol monomethyl ether, or 1-(2-methoxy-2-methylethoxy)-2-propanol.

Furthermore, a color of the barrier 51 may be white. Specifically, the barrier material and the light-scattering film material may contain white resist.

Examples of the white resist include a material which contains carboxyl group-containing resin that does not have an aromatic ring, a photopolymerization initiator, a hydrogenated epoxy compound, rutile-type titanium oxide, and a diluent.

It is possible to turn the barrier material and the light-scattering film material into photoresist and to pattern the light-scattering layer provided on the barrier 51 or on the side surface of the barrier 51 based on the photolithography method, by selecting alkaline soluble resin as resin which forms the barrier material and adding photopolymerization monomer, a photopolymerization initiator, a solvent, and the like.

A description will be given of light emission of the light-scattering body device 50 with reference to FIG. 5A.

If light is incident on the light-scattering body film 20 from the light source 41 and the incident light is brought into contact with the light-scattering particles in the light-scattering body device 50, the incident light is scattered in arbitrary directions based on grain sizes and refractive indexes of the particles as described above. Then, a part of components, which are directed to a light extraction side (the front direction, the side of the substrate 31), among the light which has been scattered (scattered light) can be extracted to the outside as effective light. In addition, scattered light components, which advances in a direction to the side surface of the light-scattering body film 20, among the scattered light are scattered at the side surface of the barrier 51 with the light-scattering property, and a part of the scattered light can be effectively extracted to the outside as emitted light.

A light-scattering material which forms the light-scattering body film 20 according to the embodiment is made of the first particles 11 with a scattering angle θ of scattered light with respect to the incident direction of the incident light, which varies in a narrow range, that is, the first particles 11 with a narrow scattering profile with which the light is scattered within the critical angle, and the second particles 12 with a smaller grain size and a higher refractive index as compared with the first particles 11 and with a wide scattering profile with which the light is scattered within a wide range. Therefore, it is possible to significantly efficiently extract the incident light to the outside at a wide view angle. Furthermore, according to the light-emitting device 50, the scattered light components which are directed in the direction to the side surface of the light-scattering body film 20 are also scattered at the barrier 51 with the light-scattering property and are recycled, and therefore, it is possible to further enhance the efficiency of using the light.

(2) Modification Example of Second Embodiment

Figure 5B:
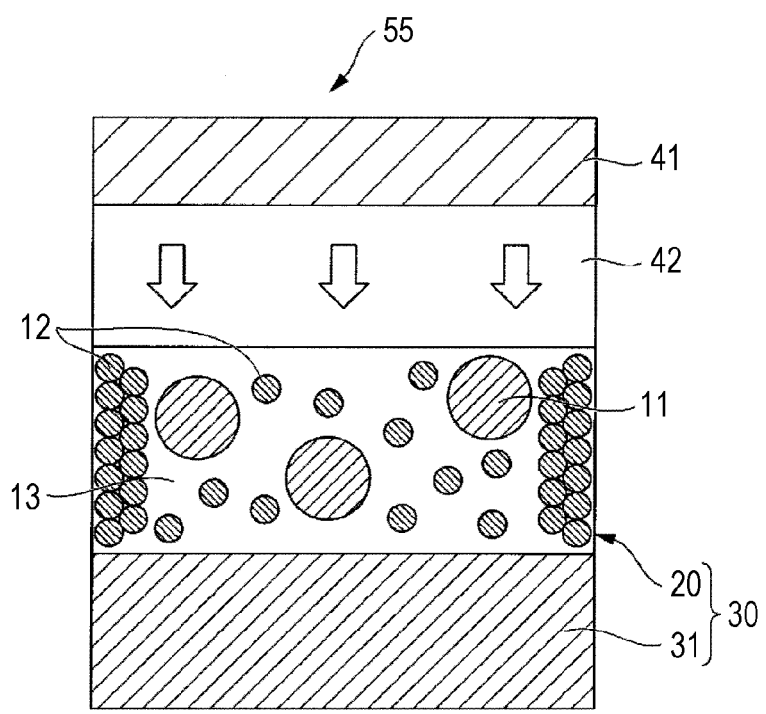
FIG. 5B is a schematic cross-sectional view showing the second embodiment of the light-scattering body device according to the present invention and a modification example thereof.

FIG. 5B is a schematic cross-sectional view showing a modification example of the second embodiment of a light-scattering body device according to the embodiment. In FIG. 5B, the description of the same constituent elements as those in the light-scattering body device 40 shown in FIG. 4 will be omitted.

A light-scattering body device 55 is substantially configured of the light source 41 which emits incident light, the flattening film 42, and the light-scattering body substrate 30. The light-scattering body substrate 30 is configured of the light-scattering body film 20 and the substrate 31. The substrate 31 is arranged so as to face the light source 41 via the flattening film 42. On the substrate 31, the light-scattering body film 20 which scatters the incident light is formed. A particle dispersion state in the light-scattering body film 20 is substantially configured as a state where the second particles 12 are densely dispersed in the side surface thereof.

A description will be given of light emission of the light-scattering body device 55 with reference to FIG. 5B.

If light is incident on the light-scattering body film 20 from the light source 41 and the incident light is brought into contact with the light-scattering particles in the light-scattering body device 55, the incident light is scattered in arbitrary directions based on grain sizes and refractive indexes of the particles as described above. Then, a part of components, which are directed to a light extraction side (the front direction, the side of the substrate 31), among the light which has been scattered (scattered light) can be extracted to the outside as effective light.

In addition, the scattered light components, which advance in the direction to the side surface of the light-scattering body film 20, among the scattered light are scattered (reflected) backward by the second particles 12 which are densely dispersed in the side surface and have a high refractive index, and a part of the scattered light can be effectively extracted to the outside as emitted light.

According to the configuration, it is possible to effectively extract a part of the light-scattering components, which advance in direction to the side surface, to the outside as emitted light without providing the barrier as in the second embodiment shown in FIG. 5A.

(3) Third Embodiment

Figure 6:
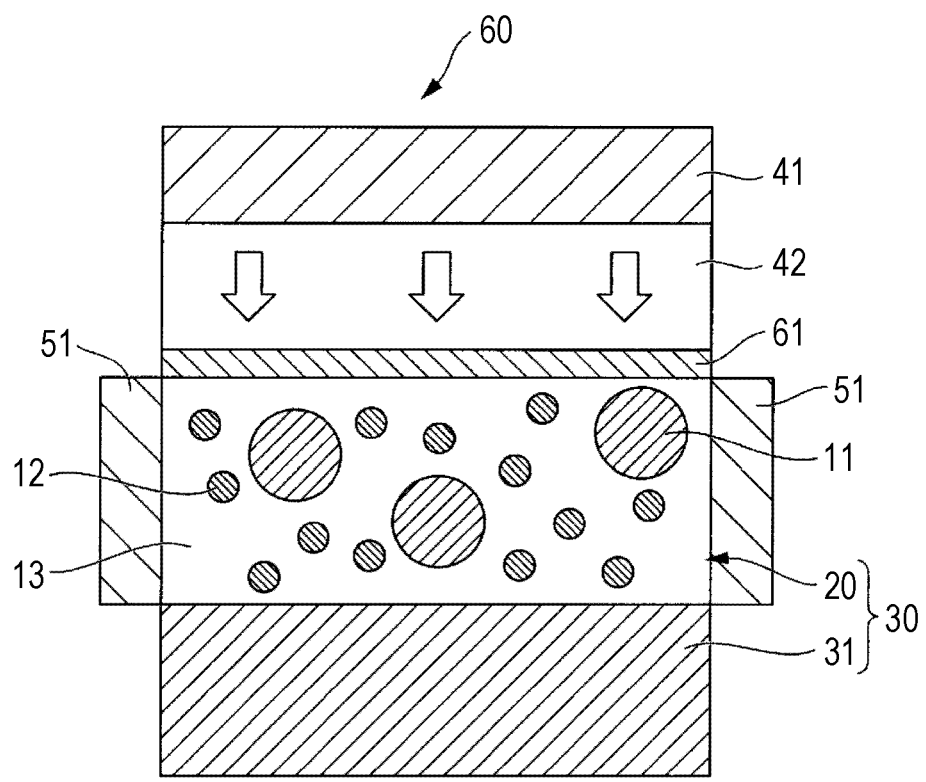
FIG. 6 is a schematic cross-sectional view showing a third embodiment of a light-scattering body device according to the present invention.

FIG. 6 is a schematic cross-sectional view showing a third embodiment of a light-scattering body device according to the embodiment. In FIG. 6, a description of the same constituent elements as those in the light-scattering body device 50 shown in FIGS. 5A and 5B will be omitted.

A light-scattering body device 60 is substantially configured of the light source 41 which emits incident light, the flattening film 42, the light-scattering body substrate 30, the barrier 51, and a low-refractive-index film 61. The light-scattering body 30 is configured of the light-scattering body substrate 30 and the substrate 31. The substrate 31 is arranged so as to face the light source 41 via the flattening film 42. On the substrate 31, the light-scattering body film 20 which scatters the incident light is formed. The barrier 51 surrounds the side surface of the light-scattering body film 20 along the stacking direction of the light source 41 and the substrate 31. The low-refractive-index film 61 is formed between the light-scattering body film 20 and the flattening film 42. The low-refractive-index film 61 has a refractive index which is lower than that of the light-scattering body film 20.

The low-refractive-index film 61 is provided between the light-scattering body film 20 and the flattening film 42. The low-refractive-index film 61 has a characteristic of reflecting scattered light (backward scattered light) which is scattered in the direction of the flattening film 42, or scattered light of a component with a large angle between the scattered light and the interface between the flattening film 42 and the light-scattering body film 20, among the scattered light emitted from the light-scattering body film 20.

Examples of a material for the low-refractive-index film 61 include transparent materials such as fluorine resin with a refractive index from about 1.35 to about 1.4, silicone resin with a refract index from about 1.4 to about 1.5, silica aerogel with a refractive index from about 1.003 to about 1.3, and porous silica with a refractive index from about 1.2 to about 1.3. However, the embodiment is not limited to these materials.

A refractive index of the low-refractive-index film 61 is preferably such a value that it is possible to reflect the scattered light (backward scattered light), which is scattered in the direction of the flattening film 42, among the scattered light emitted from the light-scattering body film 20 as much as possible. It becomes possible to reflect the scatted light (backward scattered light), which is scattered in the direction of the flattening film 42, among the scattered light emitted from the light-scattering body film 20, to return the scattered light to the inside of the light-scattering body film 20, to recycle the scattered light, and to thereby significantly effectively extract the scattered light to the outside.

The low-refractive-index film 61 is obtained by uniquely forming a transparent material between the light-scattering body film 20 and the flattening film 42. The refractive index of the low-refractive-index film 61 is preferably within a range from 1.0 to 1.5.

If the refractive index of the low-refractive-index film 61 is greater than 1.5, the scattered light (backward scattered light), which is scattered in the direction of the flattening film 42, among the scattered light emitted from the light-scattering body film 20 is not reflected and cannot be recycled.

A lower refractive index is more preferable for the low-refractive-index film 61, and in order to cause a hole or a gap to be present in the low-refractive-index film 61 for lowering the refractive index, the low-refractive-index film 61 is more preferably formed of silica aerogel, porous silica, or the like. The silica aerogel is particularly preferable due to the significantly low refractive index.

The silica aerogel is produced by drying a gel-like compound in a wet state, which is made of a silica skeleton obtained by hydrolysis and a polymerization reaction of alkoxysilane, under presence of a solvent such as alcohol or carbon dioxide in a supercritical state of equal to or greater than a critical point of the solvent as disclosed in U.S. Pat.

No. 4,402,827, Japanese Patent No. 4279971, Japanese Unexamined Patent Application Publication No. 2001-202827, and the like.

In addition, the low-refractive-index film 61 is preferably in the form of gas. Although a lower refractive index is more preferable for the low-refractive-index film 61 as described above, the lower limit value of the refractive index is about 1.003 as disclosed in U.S. Pat. No. 4,402,827, Japanese Patent No. 4279971, Japanese Unexamined Patent Application Publication No. 2001-202827, and the like in a case where the low-refractive-index film 61 is formed of a material in the form of solid, liquid, gel, or the like.

In contrast, if the low-refractive-index film 61 is a gas layer made of gas such as oxygen or nitrogen, for example, it is possible to obtain a refractive index of 1.0, to reflect the scattered light (backward scattered light) which is scattered in the direction of the flattening film 42, among the scattered light emitted from the light-scattering body film 20, to return the scattered light to the inside of the light-scattering body film 20, to recycle the scattered light, and to thereby significantly efficiently extract the scattered light to the outside.

A description will be given of light emission of the light-scattering body device 60 with reference to FIG. 6.

If light is incident on the light-scattering body film 20 from the light source 41 and the incident light is brought into contact with the light-scattering particles in the light-scattering body device 50, the incident light is scattered in arbitrary directions based on grain sizes and refractive indexes of the particles as described above. Then, a part of components, which are directed to a light extraction side (the front direction, the side of the substrate 31), among the light which has been scattered (scattered light) can be extracted to the outside as effective light.

In addition, the scattered light components, which advance in the direction to the side surface of the light-scattering body film 20, among the scattered light are scattered at the side surface of the barrier 51 with the light-scattering property, and a part of the scattered light can be effectively extract to the outside as emitted light. In contrast, the scattered light (backward scattered light), which is scattered in the direction of the flattening film 42, among the scattered light emitted from the light-scattering body film 20 is reflected by the low-refractive-index film 61, is returned to the inside of the light-scattering body film 20, and is recycled to components which can be extracted on the side of the substrate 31 again.

A light-scattering material which forms the light-scattering body film according to the embodiment is made of the first particles 11 with a scattering angle θ of scattered light with respect to the incident direction of the incident light, which varies in a narrow range, that is, the first particles 11 with a narrow scattering profile with which the light is scattered within the critical angle, and the second particles 12 with a smaller grain size and a higher refractive index as compared with the first particles 11 and with a wide scattering profile with which the light is scattered within a wide range. Therefore, it is possible to significantly efficiently extract the incident light to the outside at a wide view angle.

Furthermore, according to the light-scattering body device 50, it is possible to enhance the efficiency of using the light by scattering the scattered light components which are directed in the direction to the side surface of the light-scattering body film 20, recycling the scattered light components by the barrier 51, reflecting the scattered light components, which are directed to the backward direction of the light-scattering body film 20, by the low-refractive-index film 61, and recycling the scattered light components.

Light-Emitting Device (1) First Embodiment

Figure 7:
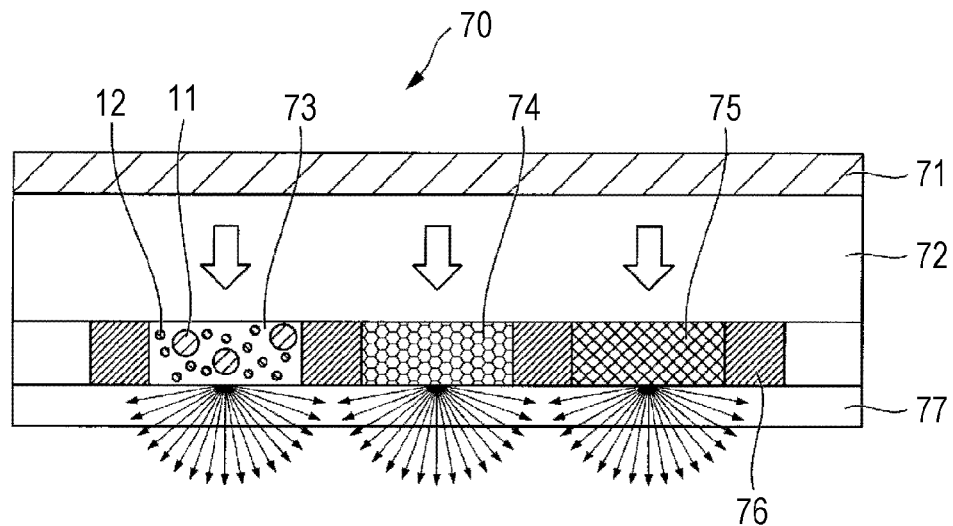
FIG. 7 is a schematic cross-sectional view showing a first embodiment of a light-emitting device according to the present invention.

FIG. 7 is a schematic cross-sectional view showing a first embodiment of a light-emitting device according to the embodiment.

A light-emitting device 70 is substantially configured of an excitation light source 71, a flattening film 72, a light-scattering body film 73, a red phosphor film 74, a green phosphor film 75, light absorption layers 76, and a substrate 77. The excitation light source 71 emits blue light which is excitation light. The substrate 77 is arranged so as to face the excitation light source 71 via the flattening film 72. The light-scattering body film 73 scatters blue light. The red phosphor film 74 emits red fluorescence by being excited with the blue light. The green phosphor film 75 emits green fluorescence by being excited with the blue light. The light absorption layers 76 are formed between the light-scattering body film 73 and the red phosphor film 74, between the light-scattering body film 73 and the green phosphor film 75, and between the red phosphor film 74 and the green phosphor film 75. The red phosphor film 74, the green phosphor film 75, the light-scattering body film 73, and the light absorption layers 76 are formed on the substrate 77.

Hereinafter, a specific description will be given of the respective constituent members which configure the light-emitting device 70 and formation methods thereof. However, the embodiment is not limited to the constituent members and the formation methods.

As the excitation light source 71 which excites the phosphors, a light source which emits blue light is used. Examples of such a light source include light emitting elements such as a blue light emitting diode (hereinafter, also abbreviated as a "blue LED"), a blue light emitting inorganic electroluminescence element (hereinafter, also abbreviated as a "blue light emitting inorganic EL element"), and a blue light emitting organic electroluminescence element (hereinafter, also abbreviated as a "blue light emitting organic EL element"). Although the above light sources are exemplified as the excitation light source 71, the excitation light source 71 is not limited thereto.

In addition, it is possible to control ON/OFF of light emission for image display by directly switching the excitation light source 71. It is also possible to control ON/OFF of the light emission by arranging a layer of a liquid crystal or the like with a shutter function between the excitation light source 71 and the films, namely the phosphor films and the light-scattering body film, and controlling the layer. Alternatively, it is also possible to control ON/OFF of both the layer of a liquid crystal or the like with the shutter function and the excitation light source 71.

The flattening film 72 is provided on the upper surfaces (surfaces which face the excitation light source 71) of the light-scattering body film 73, the red phosphor film 74, and the green phosphor film 75, and the upper surfaces of the light-scattering body film 73, the red phosphor film 74, and the green phosphor film 75 are flattened. With such a configuration, it is possible to prevent gaps from being generated between the excitation light source 71 and the films, namely the light-scattering body film 73, the red phosphor film 74, and the green phosphor film 75. In addition, it is possible to enhance the adhesion property between the excitation light source 71 and the films, namely the light-scattering body film 73, the red phosphor film 74, and the green phosphor film 75.

The red phosphor film 74 and the green phosphor film 75 are configured of a red phosphor layer and a green phosphor layer which absorb excitation light from the light-emitting elements such as the blue LED, the blue light emitting inorganic EL element, and the blue light emitting organic EL element and emit red and green light. The red phosphor layer and the green phosphor layer are made of thin films with rectangular shapes in a planar view, for example.

In addition, it is preferable to add phosphors which emit cyan light and yellow light to the respective pixels which configure the phosphor layers as necessary. Here, it is possible to further widen a color reproduction range of a display device, in which pixels emitting light of three primary colors of red, green, and blue are used, by setting color purity of the respective pixels emitting cyan light and yellow light outside a triangle obtained by coupling points of color purity of the pixels emitting red light, green light, and blue light on a chromaticity diagram.

The red phosphor film 74 and the green phosphor film 75 may be made of only a phosphor material exemplified below, an additive or the like may be arbitrarily contained, and a configuration in which these materials are dispersed in a polymeric material (bonding resin) or an inorganic material is also applicable.

It is possible to use known phosphor materials as a phosphor material which forms the red phosphor film 74 and the green phosphor film 75. Such phosphor materials are classified into organic phosphor materials and inorganic phosphor materials. Although specific compounds will be exemplified below, the embodiment is not limited to these materials.

As the organic phosphor materials, examples of a green fluorescence dye which converts blue light into green emitted light (fluorescence) include coumalin-based pigments: 2,3,5,6-1H,4H-tetrahydro-8-trifromethyl quinolizine (9,9a,1-gh) coumalin (coumalin 153), 3-(2'-benzothiazolyl)-7-diethylaminocoumalin (coumalin 6), 3-(2'-benzimidazolyl)-7-N, and N-diethylaminocoumalin (coumalin 7), and naphthalimide-based pigments: basic yellow 51, solvent yellow 11, and solvent yellow 116.

As the organic phosphor materials, examples of a red fluorescence dye which coverts blue light into red emitted light (fluorescence) include a cyanine-based pigment: 4-dicyanomethylene-2-methyl-6-(p-dimethylaminostyryl)-4H-pyran, a pyridine-based pigment: 1-ethyl-2-[4-(p-dimethylaminophenyl)-1,3-butadienyl]-pyridinium-perchlorate, rhodamine-based pigments: rhodamine B, rhodamine 6G, rhodamine 3B, rhodamine 101, rhodamine 110, basic violet 11, and sulhorhodamine 101.

As the inorganic phosphor materials, examples of a green phosphor which converts blue light into green emitted light (fluorescence) include $(BaMg)Al_{16}O_{27}$: $Eu^{2+}$, $Mn^{2+}$, $Sr_4Al_{14}O_{25}:Eu^{2+}$, $(SrBa)Al_{12}Si_2O_8:Eu^{2+}$, $(BaMg)_2SiO_4$: $Eu^{2+}$, $Y_2SiO_5:Ce^{3+}$, $Tb^{3+}$, $Sr_2P_2O_7-Sr_2B_2O_5:Eu^{2+}$, $(BaCaMg)_5(PO_4)_3Cl:Eu^{2+}$, $Sr_2Si_3O_8\text{-}2SrCl_2:Eu^{2+}$, $Zr_2SiO_4$, $MgAl_{11}O_{19}:Ce^{3+}$, $Tb^{3+}$, $Ba_2SiO_4:Eu^{2+}$, $Sr_2SiO_4:Eu^{2+}$, and $(BaSr)SiO_4:Eu^{2+}$.

As the inorganic phosphor materials, examples of a red phosphor which converts blue light into red emitted light (fluorescence) include $Y_2O_2S:Eu^{3+}$, $YAlO_3:Eu^{3+}$, $Ca_2Y_2(SiO_4)_6:Eu^{3+}$, $LiY_9(SiO_4)_6O_2:Eu^{3+}$, $YVO_4:Eu^{3+}$, $CaS:Eu^{3+}$, $Gd_2O_3:Eu^{3+}$, $Gd_2O_2S:Eu^{3+}$, $Y(P,V)O_4:Eu^{3+}$, $Mg_4GeO_{5.5}F:Mn^{4+}$, $Mg_4GeO_6:Mn^{4+}$, $K_5Eu_{2.5}(WO_4)_{6.25}$, $Na_5Eu_{2.5}(WO_4)_{6.25}$, $K_5Eu_{2.5}(MoO_4)_{6.25}$, and $Na_5Eu_{2.5}(MoO_4)_{6.25}$.

In addition, surface modification processing may be performed on the above inorganic phosphor material as necessary. Examples of a method for the surface modification processing include a method based on chemical processing by a silane coupling agent or the like, a method based on physical processing by adding fine particles or the like of a submicron order, and a method using both the chemical processing and the physical processing.

In addition, it is preferable to use the inorganic phosphor material if stability such as degradation due to the excitation light and degradation due to the light emission is taken into consideration.

In a case of using the inorganic phosphor material, an average grain size ($d_{50}$) is preferably from 0.5 μm to 50 μm. If the average grain size of the inorganic phosphor material is less than 0.5 μm, light emitting efficiency of the phosphor steeply deteriorates. In addition, if the average grain size of the inorganic phosphor material is greater than 50 μm, it becomes significantly difficult to form the flattening film. In addition, a gap (a gap (refractive index: 1.0) between the excitation light source 71 and the phosphor layers (refractive index: about 2.3)) is generated between the phosphor layers and the excitation light source 71, the light from the excitation light source 71 does not efficiently reach the phosphor layers, and the light emitting efficiency of the phosphor layers deteriorates. Furthermore, it becomes difficult to flatten the phosphor layers, and a liquid crystal layer cannot be formed (this is because the liquid crystal layer is not uniformly operated, for example, since distances between electrodes pinching the liquid crystal layer vary and an electric field is not uniformly applied).

In addition, the red phosphor film 74 and the green phosphor film 75 can be formed with the use of a phosphor layer formation coating solution, in which the above phosphor materials and resin materials are dissolved and dispersed in solvents, by a known wet process by an application method such as a spin coating method, a dipping method, a doctor blade method, an ejection coating method, or a spray coating method, a printing method such as an ink jet method, a relief printing method, an intaglio printing method, a screen printing method, or a micro-gravure printing method, a known dry process such as a resistive heating deposition method, an electron beam (EB) deposition method, a molecular beam epitaxy (MBE) method, a sputtering method, or an organic vapor phase deposition (OVPD) method of the above materials, or a formation method such as a laser transfer method.

In addition, it is possible to pattern the red phosphor film 74 and the green phosphor film 75 by the photolithography method by using photosensitive resin as polymeric resin.

Here, it is possible to use, as the photosensitive resin, one kind or a mixture of a plurality of kinds of photosensitive resin (photo-curable resist material) which includes a reactive vinyl group, such as acrylic acid-based resin, methacrylic acid-based resin, polyvinyl cinnamate-based resin, or hard rubber-based resin.

In addition, it is possible to directly pattern the phosphor material by a wet process such as an ink jet method, a relief printing method, an intaglio printing method, a screen printing method, or a dispenser method, a known dry process such as a resistive heating deposition method using a shadow mask, an electron beam (EB) deposition method, a molecular beam epitaxy (MBE) method, a sputtering method, or an organic vapor phase deposition (OVPD) method, a laser transfer method, or the like.

Film thicknesses of the red phosphor film 74 and the green phosphor film 75 are generally from about 100 nm to about 100 μm and are preferably from 1 μm to 100 μm. If the film thickness is less than 100 nm, it is not possible to sufficiently absorb the light emitted from the excitation light source 71.

Therefore, color purity deteriorates due to degradation in the light emitting efficiency and mixture of blue transmitted light into a required color. Furthermore, in order to enhance absorption of the light emitted from the excitation light source 71 and reduce the blue transmitted light to a level in which the blue transmitted light does not adversely affect the color purity, the film thickness is preferably 1 µm or more. In addition, if the film thickness is greater than 100 µm, the thickness does not bring about an improvement in efficiency, brings about only material consumption, and results in an increase in material cost since the blue light emitted from the excitation light source 71 is already sufficiently absorbed.

The light absorption layers 76 are made of a material with a light absorption property, and are formed so as to correspond to regions between adjacent pixels. By the light absorption layers 76, it is possible to enhance display contrast.

A film thickness of each light absorption layer 76 is generally from about 100 nm to about 100 µm and is preferably from 100 nm to about 10 µm.

(2) Second Embodiment

Figure 8:
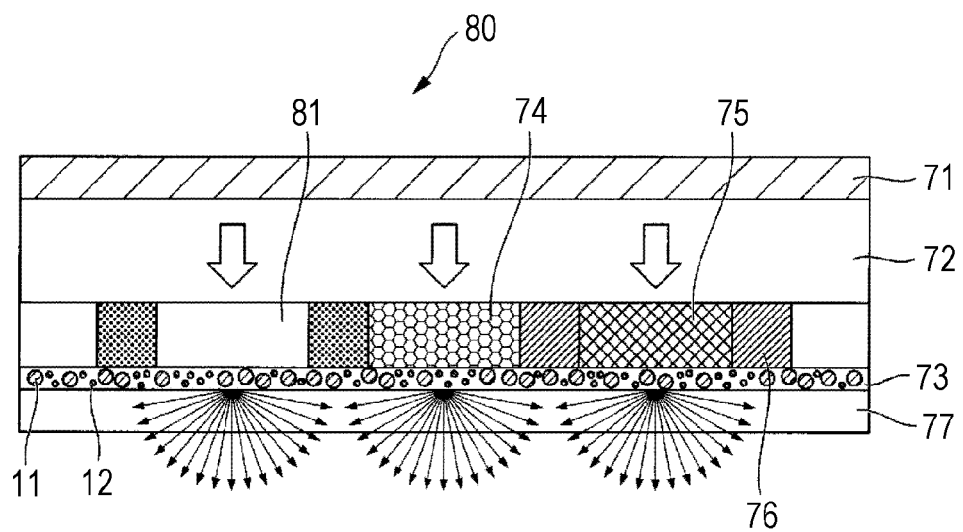
FIG. 8 is a schematic cross-sectional view showing a second embodiment of a light-emitting device according to the present invention.

FIG. 8 is a schematic cross-sectional view showing a second embodiment of a light-emitting device according to the embodiment. In FIG. 8, a description of the same constituent members as those in the light-emitting device 70 shown in FIG. 7 will be omitted.

A light-emitting device 80 is substantially configured of the excitation light source 71, the flattening film 72, the read phosphor film 74, the green phosphor film 75, a blue scattering body layer 81, the light absorption layers 76, the substrate 77, and the light-scattering body film 73. The excitation light source 71 emits blue light. The substrate 77 is arranged so as to face the excitation light source 71 via the flattening film 72. The red phosphor film 74 emits red fluorescence by being excited with the blue light. The green phosphor film 75 emits green fluorescence by being excited with the blue light. The blue scattering body layer 81 scatters at least the blue light. The light absorption layer 76 is formed between the red phosphor film 74 and the green phosphor film 75. The red phosphor film 74, the green phosphor film 75, the blue scattering body layer 81, and the light absorption layers 76 are formed on the substrate 77. The light-scattering body film 73 is formed on the substrate 77.

The blue light-scattering body layer 81 is made of the same material as that of the light-scattering body film 73. The light-scattering body film 73 is uniformly formed at least between the films, namely the red phosphor film 74 and the green phosphor film 75, and the substrate. With such a configuration, if a light emission profile of light emission from the red phosphor film 74 is different from a light emission profile of light emission from the green phosphor film 75, it is possible to match the light profiles by the light-scattering body film 73 uniformly formed on the red phosphor film 74 and the green phosphor film 75 and to thereby uniformly obtain a wide view angle property.

(3) Third Embodiment

Figure 9:
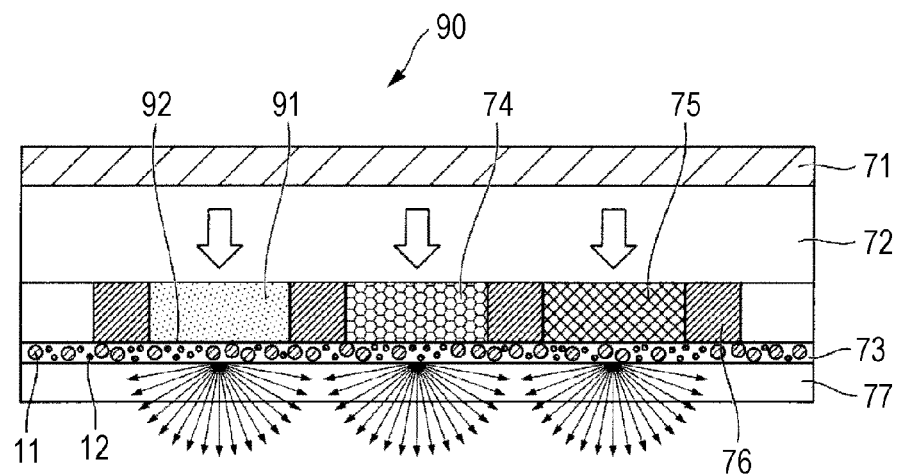
FIG. 9 is a schematic cross-sectional view showing a third embodiment of a light-emitting device according to the present invention.

FIG. 9 is a schematic cross-sectional view showing a third embodiment of a light-emitting device according to the embodiment. In FIG. 9, a description of the same constituent elements as those in the light-emitting device 80 shown in FIG. 8 will be omitted.

A light-emitting device 90 is substantially configured of the excitation light source 71, the flattening film 72, the red phosphor film 74, the green phosphor film 75, a blue phosphor film 91, the light absorption layers 76, the substrate 77, and a scattering body layer 92. The excitation light source 71 emits blue light. The substrate 77 is arranged so as to face the excitation light source 71 via the flattening film 72. The red phosphor film 74 emits red fluorescence by being excited with the blue light. The green phosphor film 75 emits green fluorescence by being excited with the blue light. The blue phosphor film 91 emits blue fluorescence by being excited with the blue light. The light absorption layers 76 are formed between the respective phosphor films. The red phosphor film 74, the green phosphor film 75, the blue phosphor film 91, and the light absorption layers 76 are formed on the substrate 77. The scattering body layer 92 scatters at least the fluorescence.

The light-scattering body layer 92 is configured of the light-scattering body film 73. The light-scattering body layer 92 is uniformly formed at least on the red phosphor film 74, the green phosphor film 75, and the blue phosphor film 91. With such a configuration, if a light emission profile of light emission from the red phosphor film 74, a light emission profile of light emission from the green phosphor film 75, and a light emission profile of light emission from the blue phosphor film 91 differ from each other, it is possible to match the light profiles by the light-scattering body layer 92 uniformly formed on the red phosphor film 74, the green phosphor film 75, and the blue phosphor film 91 and to thereby uniformly obtain a wide view angle property.

The blue phosphor film 91 is configured of a blue phosphor layer which absorbs excitation light from a light-emitting element such as a blue LED, a blue light-emitting inorganic EL element, or a blue light-emitting organic EL element and emits blue light. The blue phosphor layer is configured of a thin film with a rectangular shape in a planar view, for example.

The blue phosphor film 91 may be configured only of a phosphor material which will be exemplified below or may arbitrarily contain an additive or the like, and a configuration in which such materials are dispersed in a polymeric material (bonding resin) or an inorganic material is also applicable.

As the phosphor material which forms the blue phosphor film 91, it is possible to use known phosphor materials. Such phosphor materials are classified into organic phosphor materials and inorganic phosphor materials. Although specific compounds will be exemplified below, the embodiment is not limited to these materials.

As organic phosphor materials, examples of a blue fluorescence dye which converts blue excitation light into blue emitted light include stilbenzene-based pigments: 1,4-bis(2-methylstyryl)benzene and trans-4,4'-diphenylstilbenzene and a coumalin-based pigment: 7-hydroxy-4-methylcoumalin.

As inorganic phosphor materials, examples of a blue phosphor which converts blue excitation light into blue emitted light include $Sr_2P_2O_7$: $Sn^{4+}$, $Sr_4Al_{14}O_{25}$:$Eu^{2+}$, $BaMgAl_{10}O_{17}$:$Eu^{2+}$, $SrGa_2S_4$:$Ce^{3+}$, $CaGa_2S_4$:$Ce^{3+}$, $(Ba,Sr)(Mg,Mn)Al_{10}O_{17}$:$Eu^{2+}$, $(Sr,Ca,Ba_2,0Mg)_{10}(PO_4)_6Cl_2$:$Eu^{2+}$, $BaAl_2SiO_8$:$Eu^{2+}$, $Sr_2P_2O_7$:$Eu^{2+}$, $Sr_5(PO_4)_3Cl$:$Eu^{2+}$, $(Sr,Ca,Ba)_5(PO_4)_3Cl$:$Eu^{2+}$, $BaMg_2Al_{16}O_{27}$:$Eu^{2+}$, $(Ba,Ca)_5(PO_4)_3Cl$:$Eu^{2+}$, $Ba_3MgSi_2O_8$:$Eu^{2+}$, and $Sr_3MgSi_2O_8$:$Eu^{2+}$.

In addition, surface modification processing may be performed on the above inorganic phosphor material as necessary. Examples of a method for the surface modification processing include a method based on chemical processing by a silane coupling agent or the like, a method based on physical processing by adding fine particles or the like of a submicron order, and a method using both the chemical processing and the physical processing.

In addition, it is preferable to use the inorganic phosphor material if stability such as degradation due to the excitation light and degradation due to the light emission is taken into consideration.

In a case of using the inorganic phosphor material, an average grain size ($d_{50}$) is preferably from 0.5 μm to 50 μm. If the average grain size of the inorganic phosphor material is less than 0.5 μm, light emitting efficiency of the phosphor steeply deteriorates. In addition, if the average grain size of the inorganic phosphor material is greater than 50 μm, it becomes significantly difficult to form the flattening film. In addition, a gap (a gap (refractive index: 1.0) between the excitation light source 71 and the phosphor layers (refractive index: about 2.3)) is generated between the phosphor layers and the excitation light source 71, the light from the excitation light source 71 does not efficiently reach the phosphor layers, and the light emitting efficiency of the phosphor layers deteriorates. Furthermore, it becomes difficult to flatten the phosphor layers, and a liquid crystal layer cannot be formed (this is because the liquid crystal layer is not uniformly operated, for example, since distances between electrodes pinching the liquid crystal layer vary and an electric field is not uniformly applied).

In addition, the blue phosphor film 91 can be formed with the use of a phosphor layer formation coating solution, in which the above phosphor material and the resin material are dissolved and dispersed in a solvent, by a known wet process by an application method such as a spin coating method, a dipping method, a doctor blade method, an ejection coating method, or a spray coating method, a printing method such as an ink jet method, a relief printing method, an intaglio printing method, a screen printing method, or a microgravure printing method, a known dry process such as a resistive heating deposition method, an electron beam (EB) deposition method, a molecular beam epitaxy (MBE) method, a sputtering method, or an organic vapor phase deposition (OVPD) method of the above materials, or a formation method such as a laser transfer method.

In addition, it is possible to pattern the blue phosphor film 91 by a photolithography method by using photosensitive resin as polymeric resin.

Here, it is possible to use, as the photosensitive resin, one kind or a mixture of a plurality of kinds of photosensitive resin (photo-curable resist material) which includes a reactive vinyl group, such as acrylic acid-based resin, methacrylic acid-based resin, polyvinyl cinnamate-based resin, or hard rubber-based resin.

In addition, it is possible to directly pattern the phosphor material by a wet process such as an ink jet method, a relief printing method, an intaglio printing method, a screen printing method, or a dispenser method, a known dry process such as a resistive heating deposition method using a shadow mask, an electron beam (EB) deposition method, a molecular beam epitaxy (MBE) method, a sputtering method, or an organic vapor phase deposition (OVPD) method, a laser transfer method, or the like.

A film thicknesses of the blue phosphor film 75 is generally from about 100 nm to about 100 μm and is preferably from 1 μm to 100 μm. If the film thickness is less than 100 nm, it is not possible to sufficiently absorb the light emitted from the excitation light source 71. Therefore, color purity deteriorates due to degradation in the light emitting efficiency and mixture of blue transmitted light into a required color.

Furthermore, in order to enhance absorption of the light emitted from the excitation light source 71 and reduce the blue transmitted light to a level in which the blue transmitted light does not adversely affect the color purity, the film thickness is preferably 1 μm or more. In addition, if the film thickness is greater than 100 μm, the thickness does not bring about an improvement in efficiency, brings only about material consumption, and results in an increase in material cost since the blue light emitted from the excitation light source 71 is already sufficiently absorbed.

(4) Fourth Embodiment

Figure 10:
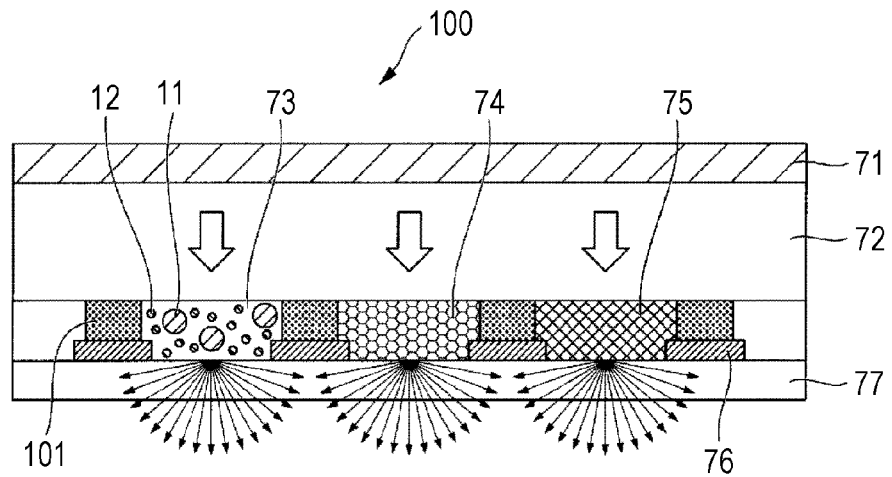
FIG. 10 is a schematic cross-sectional view showing a fourth embodiment of a light-emitting device according to the present invention.

FIG. 10 is a schematic cross-sectional view showing a second embodiment of a light-emitting device according to the embodiment. In FIG. 10, a description of the same constituent elements as those in the light-emitting device 70 shown in FIG. 7 will be omitted.

A light-emitting device 100 is substantially configured of the excitation light source 71, the flattening film 72, the light-scattering body film 73, the red phosphor film 74, the green phosphor film 75, the light absorption layers 76, a barrier 101, and the substrate 77. The excitation light source 71 emits blue light. The substrate 77 is arranged so as to face the excitation light source 71 via the flattening film 72. The light-scattering body film 73 scatters the blue light. The red phosphor film 74 emits red fluorescence by being excited with the blue light. The green phosphor film 75 emits green fluorescence by being excited with the blue light. The light absorption layers 76 are formed between the light-scattering body film 73 and the red phosphor film 74, between the light-scattering body film 73 and the green phosphor film 75, and between the red phosphor film 74 and the green phosphor film 75. The barrier 101 is formed on at least a part of the light absorption layers 76 on a side of an excitation light incident surface. The light-scattering body film 73, the red phosphor film 74, the green phosphor film 75, the light absorption layer 76, and the barrier 101 are formed on the substrate 77.

At least a part, which faces the light-scattering body film 73, the red phosphor film 74, and the green phosphor film 75, of the barrier 101 has a light-scattering property.

Examples of a configuration in which the barrier 101 has the light-scattering property include a configuration in which the barrier 101 itself is formed of a material containing resin and light-scattering particles and a configuration in which a light-scattering layer (light-scattering film) made of a material containing resin and light-scattering particles is provided on the side surface of the barrier 101.

As a material for forming the barrier 101 itself (hereinafter, referred to as a "barrier material") or a material for forming the light-scattering layer (light-scattering film) provided on the side surface of the barrier 101 (hereinafter, referred to as a "light-scattering film material"), a material which contains resin and light-scattering particles is used.

Examples of the resin include acrylic resin (refractive index: 1.49), melamine resin (refractive index: 1.57), nylon (refractive index: 1.53), polystyrene (refractive index: 1.60), melamine beads (refractive index: 1.57), polycarbonate (refractive index: 1.57), polyvinyl chloride (refractive index: 1.60), polyvinylidene chloride (refractive index: 1.61), polyvinyl acetate (refractive index: 1.46), polyethylene (refractive index: 1.53), polymethylmethacrylate (refractive index: 1.49), polyMBS (refractive index: 1.54), medium-density polyethylene (refractive index: 1.53), high-density polyethylene (refractive index: 1.54), tetrafluoroethylene (refractive index: 1.35), poly trifluorochloroethylene (refractive index:

1.42), and polytetrafluoroethylene (refractive index: 1.35). However, the embodiment is not limited to the resin.

The light-scattering particles may be formed any of an inorganic material and an organic material.

In a case where an inorganic material is used as the light-scattering particles, examples thereof include particles (fine particles) or the like which contain, as a main constituent, an oxidative product of at least one kind of metal selected from a group consisting of silicon, titanium, zirconium, aluminum, indium, zinc, tin, and antimony. However, the embodiment is not limited to such inorganic materials.

In addition, in a case where particles (inorganic fine particles) made of the inorganic material are used as the light-scattering particles, examples thereof include silica beads (refractive index: 1.44), alumina beads (refractive index: 1.63), titanium oxide beads (refractive index of anatase type: 2.50, refractive index of rutile type: 2.70), zirconia oxide beads (refractive index: 2.05), zinc oxide beads (refractive index: 2.00), and barium titanate ($BaTiO_3$) (refractive index: 2.4). However, the embodiment is not limited to these inorganic fine particles.

In a case where particles (organic fine particles) which are made of an organic material are used as the light-scattering particles, examples thereof include polymethyl methacrylate beads (refractive index: 1.49), acrylic beads (refractive index: 1.50), acryl-styrene copolymer beads (refractive index: 1.54), melamine beads (refractive index: 1.57), high-refractive-index melamine beads (refractive index: 1.65), polycarbonate beads (refractive index: 1.57), styrene beads (refractive index: 1.60), cross-linked polystyrene beads (refractive index: 1.61), polyvinyl chloride beads (refractive index: 1.60), benzoguanamine-melamine formaldehyde beads (refractive index: 1.68), and silicone beads (refractive index: 1.50). However, the embodiment is not limited to these organic fine particles.

In addition, the barrier material and the light-scattering film material may contain a photopolymerization initiator and an antifoaming agent or a leveling agent such as dipropyleneglycol monomethyl ether, or 1-(2-methoxy-2-methylethoxy)-2-propanol.

Furthermore, a color of the barrier 101 may be white. Specifically, the barrier material and the light-scattering film material may contain white resist.

Examples of the white resist include a material which contains carboxyl group-containing resin that does not have an aromatic ring, a photopolymerization initiator, a hydrogenated epoxy compound, rutile-type titanium oxide, and a diluent.

It is possible to turn the barrier material and the light-scattering film material into photoresist and to pattern the light-scattering layer provided on the barrier 81 or on the side surface of the barrier 81 based on the photolithography method, by selecting alkaline soluble resin as resin which forms the barrier material and adding photopolymerization monomer, a photopolymerization initiator, a solvent, and the like.

(5) Fifth Embodiment

Figure 11:
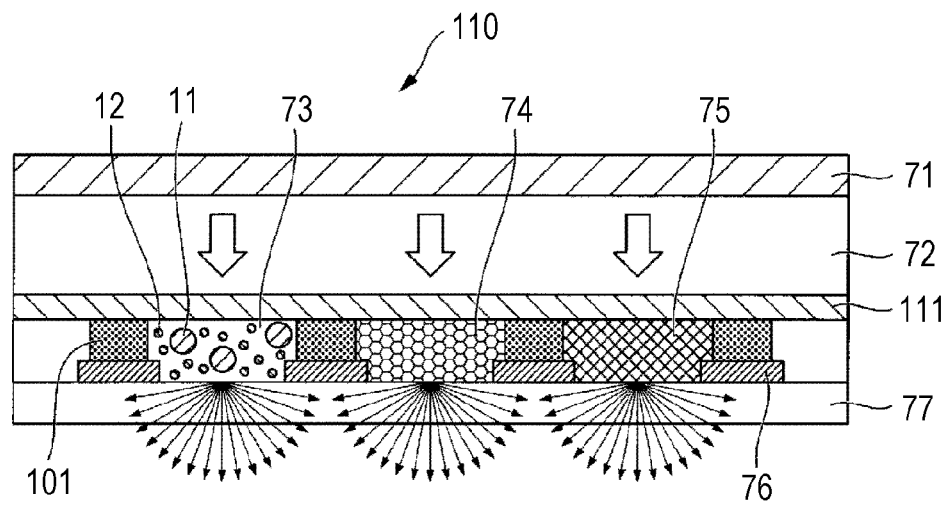
FIG. 11 is a schematic cross-sectional view showing a fifth embodiment of a light-emitting device according to the present invention.

FIG. 11 is a schematic cross-sectional view showing a fifth embodiment of a light-emitting device according to the embodiment. In FIG. 11, a description of the same constituent elements as those in the light-emitting device 100 shown in FIG. 10 will be omitted.

A light-emitting device 110 is substantially configured of the excitation light source 71, the flattening film 72, the light-scattering body film 73, the red phosphor film 74, the green phosphor film 75, the light absorption layers 76, the barrier 101, a wavelength selecting transflective film 111, and the substrate 77. The excitation light source 71 emits blue light. The substrate 77 is arranged so as to face the excitation light source 71 via the flattening film 72. The light-scattering body film 73 scatters the blue light. The red phosphor film 74 emits red fluorescence by being excited with the blue light. The green phosphor film 75 emits green fluorescence by being excited with the blue light. The light absorption layers 76 are formed between the light-scattering body film 73 and the red phosphor film 74, between the light-scattering body film 73 and the green phosphor film 75, and between the red phosphor film 74 and the green phosphor film 75. The barrier 101 is formed on at least a part of the light absorption layer 76 on a side of an excitation light incident surface. The wavelength selecting transflective film 111 is formed at least on a side of incident surfaces, on which the excitation light is incident, of the red phosphor film 74 and the green phosphor film 75. The light-scattering body film 73, the red phosphor film 74, the green phosphor film 75, the light absorption layer 76, the barrier 101, and the wavelength selecting transflective film 111 are formed on the substrate 77.

That is, the wavelength selecting transflective film 111 is provided on excitation light incident surfaces of the red phosphor film 74 and the green phosphor film 75 and on an upper surface of the barrier 101. The wavelength selecting transflective film 111 has a characteristic of transmitting at least light corresponding to a peak wavelength of the excitation light from the excitation light source 71 and reflecting at least light corresponding to a light emission peak wavelength of the red phosphor film 74 and the green phosphor film 75.

By providing the wavelength selecting transflective film 111 on the incident surfaces of the red phosphor film 74 and the green phosphor film 75, it is possible to efficiently reflect, in a front direction, fluorescence components, which are directed to a rear surface side of the light-emitting device 90, among fluorescence isotropically emitted from the red phosphor film 74 and the green phosphor film 75 in all directions. Therefore, it is possible to enhance light emission efficiency (improve luminance in the front direction).

Although examples of the wavelength selecting transflective film 111 include an inorganic material substrate made of a dielectric multilayered film, metal thin-film glass, quartz, or the like and a plastic substrate made of polyethylene terephthalate, polycarbazole, polyimide, or the like, the embodiment is not limited to these substrates.

(6) Sixth Embodiment

Figure 12:
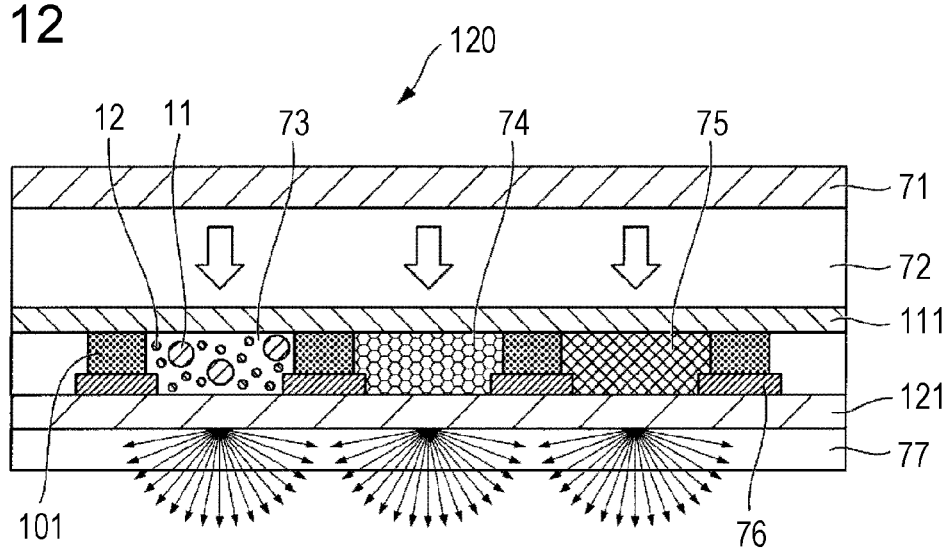
FIG. 12 is a schematic cross-sectional view showing a sixth embodiment of a light-emitting device according to the present invention.

FIG. 12 is a schematic cross-sectional view showing a sixth embodiment of a light-emitting device according to the embodiment. In FIG. 12, a description of the same constituent elements as those in the light-emitting device 110 shown in FIG. 11 will be omitted.

A light-emitting device 120 is substantially configured of the excitation light source 71, the flattening film 72, the light-scattering body film 73, the red phosphor film 74, the green phosphor film 75, the light absorption layers 76, the barrier 101, the wavelength selecting transflective film 111, the substrate 77, and a low-refractive-index film 121. The excitation light source 71 emits blue light. The substrate 77 is arranged so as to face the excitation light source 71 via the flattening film 72. The light-scattering body film 73 scatters the blue light. The red phosphor film 74 emits red fluorescence by being excited with the blue light. The green phosphor film 75 emits green fluorescence by being excited with the blue light. The light absorption layers 76 are formed between the light-scattering body film 73 and the red phosphor film 74, between the light-scattering body film 73 and the green phosphor film 75, and between the red phosphor film 74 and the green phosphor film 75. The barrier 101 is formed on at least a part of the light absorption layer 76 on a side of an excitation light incident surface. The wavelength selecting transflective film 111 is formed at least on a side of incident surfaces, on which the excitation light is incident, of the red phosphor film 74 and the green phosphor film 75. The light-scattering body film 73, the red phosphor film 74, the green phosphor film 75, the light absorption layers 76, the barrier 101, and the wavelength selecting transflective film 111 are formed on the substrate 77. The low-refractive-index film 121 is formed at least between the films, namely the light-scattering body film 73, the red phosphor film 74, and the green phosphor film 75 and the substrate 77. The low-refractive-index film 121 has a refractive index which is smaller than that of the substrate 77.

The low-refractive-index film 121 is provided at least between the films, namely the light-scattering body film 73, the red phosphor film 74, and the green phosphor film 75 and the substrate 77. The low-refractive-index film 121 has a characteristic of reducing an incident angle of the scattered light, which is incident on the substrate 77, among the emitted light emitted from the light-scattering body film 73, the red phosphor film 74, and the green phosphor film 75. Examples of a material for the low-refractive-index film 101 include transparent materials such as fluorine resin with a refractive index from about 1.35 to about 1.4, silicone resin with a refract index from about 1.4 to about 1.5, silica aerogel with a refractive index from about 1.003 to about 1.3, and porous silica with a refractive index from about 1.2 to about 1.3. However, the embodiment is not limited to these materials.

A refractive index of the low-refractive-index film 121 is preferably a value with which an outgoing angle (refracting angle) of incident light that is incident on the substrate 77 from the low-refractive-index film 101 is smaller than at least a critical angle of incident light that can be incident on the outside from the substrate 77. By transmitting the outgoing light which outgoes from the light-scattering body film 73, the red phosphor film 74, and the green phosphor film 75 through the low-refractive-index film 121, it is possible to reliably extract the light, which is transmitted through the low-refractive-index film 121 and is then incident on the substrate 77, to the outside and to thereby significantly efficiently extract the light to the outside.

The low-refractive-index film 121 is obtained by uniquely forming a transparent material on one surface of the substrate 77.

The refractive index of the low-refractive-index film 121 is preferably within a range from 1.0 to 1.5.

If the refractive index of the low-refractive-index film 121 is greater than 1.5, a difference in the refractive indexes between the substrate 77 and the low-refractive-index film 121 becomes small, and a most part of the light which is incident on the substrate 77 from the low-refractive-index film 121 is reflected at an interface between the substrate 77 and the outside and cannot be extracted to the outside.

A lower refractive index is more preferable for the low-refractive-index film 121, and in order to cause a hole or a gap to be present in the low-refractive-index film 121 for lowering the refractive index, the low-refractive-index film 121 is more preferably formed of silica aerogel, porous silica, or the like. The silica aerogel is particularly preferable due to the significantly low refractive index.

The silica aerogel is produced by drying a gel-like compound in a wet state, which is made of a silica skeleton obtained by hydrolysis and a polymerization reaction of alkoxysilane, under presence of a solvent such as alcohol or carbon dioxide in a supercritical state of equal to or greater than a critical point of the solvent as disclosed in U.S. Pat. No. 4,402,827, Japanese Patent No. 4279971, Japanese Unexamined Patent Application Publication No. 2001-202827, and the like.

In addition, the low-refractive-index film 121 is preferably in the form of gas. Although a lower refractive index is more preferable for the low-refractive-index film 121 as described above, the lower limit value of the refractive index is about 1.003 as disclosed in U.S. Pat. No. 4,402,827, Japanese Patent No. 4279971, Japanese Unexamined Patent Application Publication No. 2001-202827, and the like in a case where the low-refractive-index film 121 is formed of a material in the form of solid, liquid, gel, or the like.

In contrast, if the low-refractive-index film 61 is a gas layer made of gas such as oxygen or nitrogen, for example, it is possible to obtain a refractive index of 1.0, to transmit the outgoing light which outgoes from the light-scattering body film 73, the red phosphor film 74, and the green phosphor film 75 through the gas layer (low-refractive-index film 121), to reliably extract the light, which is incident on the substrate 77, to the outside, and to thereby significantly efficiently extract the light to the outside.

Display Device

Next, a detailed description will be given of embodiments of a display device which is configured of a phosphor and a light source.

In addition, the phosphor substrate in the display device according to the embodiments described below is the substrate 77 of the aforementioned light emitting device according to the first to sixth embodiments, on which the light-scattering body film 73, the red phosphor film 74, the green phosphor film 75, the light absorption layer 77, the barrier 101, the wavelength selecting transflective film 111, the low-refractive-index film 121, and the like are formed.

In addition, the light source in the display device according to the embodiments is the excitation light source 71 of the aforementioned light-emitting device according to the first to fourth embodiments. Although a known blue LED, a blue light-emitting inorganic EL element, a blue light-emitting organic EL element, or the like is used as the excitation light source in the display device according to the embodiments, the embodiments are not limited to these excitation light sources, and it is possible to use an excitation light source which is produced from a known material by a known manufacturing method. Here, light emission with a main light emission peak from 410 nm to 470 nm is preferable as the blue light.

(1) First Embodiment

Figure 13:
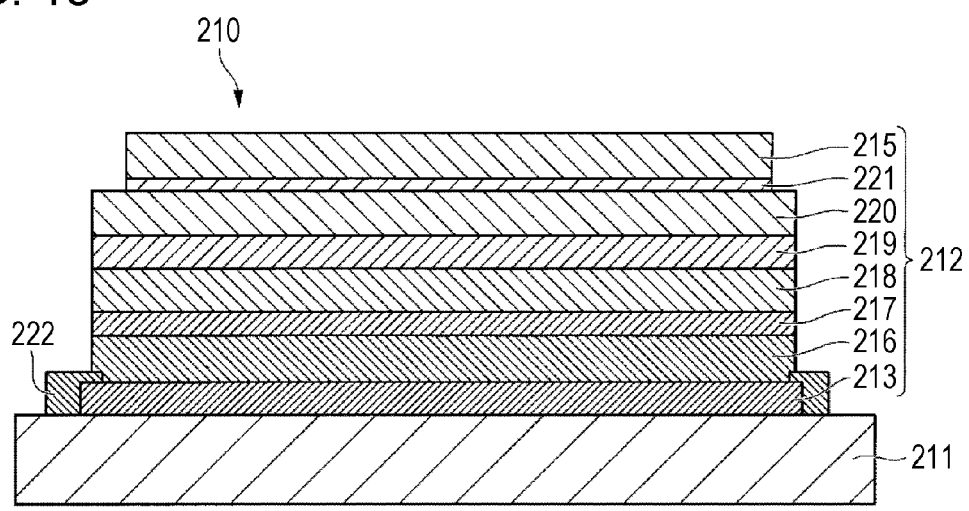
FIG. 13 is a schematic cross-sectional view showing an organic EL element substrate which configures a display device according to the present invention.

FIG. 13 is a schematic cross-sectional view showing an organic EL element substrate which configures a first embodiment of the display device according to the embodiment. The display device according to the embodiments is substantially configured of a phosphor substrate configured of the substrate 77 of the aforementioned light-emitting device according to the first to fourth embodiments, on which the light-scattering body film 73, the red phosphor film 74, the green phosphor film 75, the light absorption layer 76, the barrier 101, the wavelength selecting transflective film 111, the low-refractive-index film 121, and the like are formed, and an organic EL element substrate (light source) 210 which is attached to the phosphor substrate via the flattening film 72 and the like of the aforementioned light-emitting device according to the first to fourth embodiments.

The organic EL element substrate 210 is substantially configured of a substrate 211 and an organic EL element 212 which is provided on one surface of the substrate 211.

The organic EL element 212 is substantially configured of a first electrode 213, an organic EL layer 214, and a second electrode 215 which are provided in order on one surface of the substrate 211. That is, the organic EL element 212 includes, on one surface of the substrate 211, a pair of electrodes, namely the first electrode 213 and the second electrode 215 and an organic EL layer 214 which is pinched between the pair of electrodes.

The first electrode 213 and the second electrode 215 function as a pair of a positive pole and a negative pole of the organic EL element 212.

An optical distance between the first electrode 213 and the second electrode 215 is adjusted so as to configure a micro resonator structure (microcavity structure).

The organic EL layer 214 is configured of a hole injection layer 216, a hole transport layer 217, a light-emitting layer 218, a hole blocking layer 219, an electron transport layer 220, and an electron injection layer 221 which are laminated in order from a side of the first electrode 213 to a side of the second electrode 215.

Each of the hole injection layer 216, the hole transport layer 217, the light-emitting layer 218, the hole blocking layer 219, the electron transport layer 220, and the electron injection layer 221 may have a single-layered structure or a multi-layered structure. In addition, each of the hole injection layer 216, the hole transport layer 217, the light-emitting layer 218, the hole blocking layer 219, the electron transport layer 220, and the electron injection layer 221 may be any of an organic thin film and an inorganic thin film.

The hole injection layer 216 is for efficiently injecting holes from the first electrode 213.

The hole transport layer 217 is for efficiently transporting the holes to the light-emitting layer 218.

The electron transport layer 220 is for efficiently transporting electrons to the light-emitting layer 218.

The electron injection layer 221 is for efficiently injecting the electrons from the second electrode 215.

The hole injection layer 216, the hole transport layer 217, the electron transport layer 220, and the electron injection layer 221 correspond to a carrier injection transport layer.

In addition, the organic EL element 212 is not limited to the above configuration, and the organic EL layer 214 may have a single-layered structure of the light-emitting layer or a multi-layered structure of the light-emitting layer and the carrier injection transport layer. Specific configurations of the organic EL element 212 will be exemplified as follows:

(1) a configuration in which only the light-emitting layer is provided between the first electrode 213 and the second electrode 215;

(2) a configuration in which the hole transport layer and the light-emitting layer are laminated in this order from the side of the first electrode 213 to the side of the second electrode 215;

(3) a configuration in which the light-emitting layer and the electron transport layer are laminated in this order from the side of the first electrode 213 to the side of the second electrode 215;

(4) a configuration in which the hole transport layer, the light-emitting layer, and the electron transport layer are laminated in this order from the side of the first electrode 213 to the side of the second electrode 215;

(5) a configuration in which the hole injection layer, the hole transport layer, the light-emitting layer, and the electron transport layer are laminated in this order from the side of the first electrode 213 to the side of the second electrode 215;

(6) a configuration in which the hole injection layer, the hole transport layer, the light-emitting layer, the electron transport layer, and the electron injection layer are laminated in this order from the side of the first electrode 213 to the side of the second electrode 215;

(7) a configuration in which the hole injection layer, the hole transport layer, the light-emitting layer, the hole blocking layer, and the electron transport layer are laminated in this order form the side of the first electrode 213 to the side of the second electrode 215;

(8) a configuration in which the hole injection layer, the hole transport layer, the light-emitting layer, the hole blocking layer, the electron transport layer, and the electron injection layer are laminated in this order from the side of the first electrode 213 to the side of the second electrode 215; and (9) a configuration in which the hole injection layer, the hole transport layer, an electron blocking layer, the light-emitting layer, the hole blocking layer, the electron transport layer, and the electron injection layer are laminated in this order from the side of the first electrode 213 to the side of the second electrode 215.

Each of the light-emitting layer, the hole injection layer, the hole transport layer, the hole blocking layer, the electron blocking layer, the electron transport layer, and the electron injection layer may have a single-layered structure or a multi-layered structure. In addition, each of the light-emitting layer, the hole injection layer, the hole transport layer, the hole blocking layer, the electron blocking layer, the electron transport layer, and the electron injection layer may be any of an organic thin film and an inorganic thin film.

In addition, an edge cover 222 is formed so as to cover an end surface of the first electrode 213. That is, the edge cover 222 is provided so as to cover an edge portion of the first electrode 213, which is provided on one surface of the substrate 211, between the first electrode 213 and the second electrode 215 in order to prevent leakage from occurring between the first electrode 213 and the second electrode 215.

Hereinafter, a specific description will be given of the respective constituent members which configure the organic EL element substrate 210 and formation methods thereof. However, the embodiment is not limited to the constituent members and the formation methods.

Examples of the substrate 211 include an insulating substrate such as an inorganic material substrate made of glass, quartz, or the like, a plastic substrate made of polyethylene terephthalate, polycarbazole, polyimide, or the like, a metal substrate made of aluminum (Al), iron (Fe), or the like, a substrate obtained by coating one of the above substrates with an insulating material substance made of silicon oxide ($SiO_2$), an organic insulating material, or the like, and a substrate obtained by performing insulating processing on the surface of a metal substrate made of aluminum or the like by an anode oxidation method or the like. However, the embodiment is not limited to these substrates. Among these substrates, the plastic substrate or the metal substrate is preferably used since it is possible to form a curved portion and a bent portion without any stress.

Furthermore, it is preferable to use a substrate obtained by coating a plastic substrate with an inorganic material or a substrate obtained by coating a metal substrate with an inorganic insulating material. By using such a substrate coated with the inorganic material, it is possible to prevent transmission of moisture which may be generated in a case where the plastic substrate is used as the substrate of the organic EL element substrate. In addition, it is possible to prevent leakage (short-circuiting) (it is known that leakage (short-circuiting) of a current may occur at a pixel portion due to a projection since a film thickness of the organic EL layer is as significantly thin as about 100 nm to about 200 nm) due to a projection of a metal substrate, which may occur in a case where the metal substrate is used as the substrate of the organic EL element substrate.

In addition, in a case where a TFT is formed, it is preferable to use, as the substrate 211, a substrate which is not melted and does not cause any strain at a temperature of 500° C. or lower. Moreover, although it is difficult to form the TFT on a metal substrate by a conventional production apparatus since a general metal substrate has a different thermal expansion coefficient from that of glass, it becomes possible to form the TFT on the metal substrate by using the conventional production apparatus at a low cost by matching a linear expansion coefficient to that of glass by using a metal substrate made of an iron-nickel alloy with the liner expansion coefficient of $1 \times 10^{-5}$/° C. or less.

In addition, since an upper temperature limit is significantly low in a case of the plastic substrate, it is possible to transfer and form the TFT on the plastic substrate by forming the TFT on a glass substrate and then transferring the TFT on the glass substrate to the plastic substrate.

Furthermore, although there is no restriction for the substrate in a case where light emission from the organic EL layer 214 is extracted from a side opposite to the substrate 211, it is necessary to use a transparent or semi-transparent substrate in order to extract the light emission from the organic EL layer 214 to the outside in a case where the light emission from the organic EL layer 214 is extracted from a side of the substrate 211.

The TFT formed on the substrate 211 is formed on one surface 211a of the substrate 211 in advance before the organic EL element 212 is formed and functions as a pixel switching element and an organic EL element driving element.

As the TFT according to the embodiment, a known TFT can be exemplified. In addition, it is also possible to use a metal-insulating body-metal (MIM) diode instead of the TFT.

A TFT which can be used in the active drive-type organic EL display device or an organic EL display device can be formed by using known materials, structures, and formation methods.

Examples of the material of an active layer which configures the TFT include inorganic semiconductor materials such as non-crystalline silicon (amorphous silicon), polycrystalline silicon (polysilicon), microcrystalline silicon, and cadmium selenite, oxide semiconductor materials such as zinc oxide, indium oxide-gallium oxide-zinc oxide, and organic semiconductor materials such as a polythiophene derivative, thiophene oligomer, a poly(p-phenylenevinylene) derivative, naphthacene, and pentacene. In addition, examples of a structure of the TFT include a staggered type, an inversely-staggered type, a top-gate type, and a coplanar type.

Examples of a formation method of the active layer which configures the TFT include (1) a method by ion-doping of impurities into amorphous silicon which is formed into a film by a plasma-enhanced chemical vapor deposition (PECVD) method, (2) a method of forming amorphous silicon by a low pressure chemical vapor deposition (LP-CVD) method using silane ($SiH_4$) gas, crystallizing amorphous silicon by a solid-phase growth method to obtain polysilicon, and then performing ion-doping by an ion implantation method, (3) a method of forming amorphous silicon by an LPCVD method using $Si_2H_6$ gas or a PECVD method using $SiH_4$ gas, performing annealing with a laser such as an excimer laser, crystallizing amorphous silicon to obtain polysilicon, and then performing ion-doping (low-temperature process), (4) a method of forming a polysilicon layer by the LPCVD method or the PECVD method, forming a gate insulating film by thermal oxidation at a temperature of 1000° C. or higher, forming a gate electrode of n⁺ polysilicon thereon, and then performing ion-doping (high-temperature process), (5) a method of forming an organic semiconductor material by an ink jet method or the like, and (6) a method of obtaining a single-crystal film of an organic semiconductor material.

The gate insulating film which configures the TFT according to the embodiment can be formed by using known materials. Examples of the gate insulating film include an insulating film which is made of $SiO_2$ formed by the PECVD method, the LPCVD method, or the like or $SiO_2$ obtained by thermal oxidation of a polysilicon film.

In addition, a signal electrode line, a scanning electrode line, a common electrode line, a first drive electrode, and a second drive electrode of the TFT according to the embodiment can be formed by using known materials. Examples of the materials for the signal electrode line, the scanning electrode line, the common electrode line, the first drive electrode, and the second drive electrode include tantalum (Ta), aluminum (Al), and copper (Cu). Although the TFT of the organic EL element substrate 210 can be configured as described above, the embodiment is not limited to these materials, structures, and formation methods.

An inter-layer insulating film which can be used in the active drive-type organic EL display device or the organic EL display device can be formed by using a known material. Examples of the material for the interlayer insulating film include inorganic materials such as silicon oxide ($SiO_2$), silicon nitride (SiN or $Si_2N_4$), and tantalum oxide (TaO or $Ta_2O_5$) and organic materials such as acrylic resin and a resist material.

In addition, examples of a formation method of the interlayer insulating film include dry processes such as a chemical vapor deposition (CVD) method and a vacuum deposition method and wet processes such as a spin coating method. In addition, it is also possible to pattern the interlayer insulating film by a photolithography method or the like as necessary.

In a case where the light emission from the organic EL element 212 is extracted from the side opposite to the substrate 211 (from the side of the second electrode 215), it is preferable to form a light-blocking insulating film which also has a light-blocking property, for the purpose of preventing variations in the property of the TFT from occurring due to external light which is incident on the TFT formed on the one surface 211a of the substrate 211. In addition, it is also possible to use a combination of the above interlayer insulating film and the light-blocking insulating film.

Examples of the light-blocking insulating film include a material obtained by dispersing a pigment or a dye such as phthalocyanine or quinacridone in polymeric resin such as polyimide, a color resist, a black matrix material, and an inorganic insulating material such as $Ni_xZn_yFe_2O_4$. However, the embodiment is not limited to the materials and the formation methods.

In the case where the TFT and the like are formed on the one surface 211a of the substrate 211 in the active drive-type organic EL display device, there is a concern in that irregularity is formed in the surface thereof and phenomena such as deficiency of the pixel electrode, deficiency of the organic EL layer, disconnection of the second electrode, short-circuiting between the first electrode and the second electrode, and degradation in pressure resistance occur in the organic EL element 212 due to the irregularity. In order to prevent such phenomena, a flattening film may be provided on the interlayer insulating film.

Such a flattening film can be formed by using a known material. Examples of the material of the flattening film include inorganic materials such as silicon oxide, silicon nitride, and tantalum oxide and organic materials such as polyimide, acrylic resin, and a resist material. Examples of a formation method for the flattening film include dry processes such as a CVD method and a vacuum deposition method and wet processes such as a spin coating method. However, the embodiment is not limited to these materials and formation methods. In addition, the flattening film may have any of a single-layered structure and a multi-layered structure.

The first electrode 213 and the second electrode 215 function as a pair of a positive pole and a negative pole of the organic EL element 212. That is, the second electrode 215 functions as a negative pole in a case where the first electrode 213 functions as a positive pole, and the second electrode 215 functions as a positive pole in a case where the first electrode 213 functions as a negative pole.

As electrode materials for forming the first electrode 213 and the second electrode 215, it is possible to use known electrode materials. Examples of the electrode material for forming the positive pole include transparent electrode materials of metal such as gold (Au), platinum (Pt), and nickel (Ni) with a work function of 4.5 eV or higher and transparent electrode materials of an oxidative product (ITO) made of indium (In) and tin (Sn), an oxidative product ($SnO_2$) made of tin (Sn), an oxidative product (IZO) made of indium (In) and zinc (Zn), or the like, in terms of more efficient injection of holes into the organic EL layer 214.

In addition, examples of the electrode material for forming the negative pole include metal such as lithium (Li), calcium (Ca), cerium (Ce), barium (Ba), and aluminum (Al) with a work function of 4.5 eV or lower and alloys such as Mg:Ag alloy and Li:Al alloy which contain the metal, in terms of more efficient injection of electrodes into the organic EL layers 214.

Although the first electrode 213 and the second electrode 215 can be formed with the use of the above materials by a known method such as an EB deposition method, a sputtering method, an ion plating method, or a resistive heating deposition method, the embodiment is not limited to these formation methods. In addition, it is also possible to pattern electrodes which are formed by the photolithography method or a laser peeling method or to form directly patterned electrodes by a combination with a shadow mask.

Film thicknesses of the first electrode 213 and the second electrode 215 are preferably 50 nm or more.

If the film thicknesses are less than 50 nm, there is a concern in that an interconnection resistance increases and a drive voltage rises.

In a case of using a microcavity effect for the purpose of an improvement in color purity, an improvement in light emission efficiency, an improvement in front luminance, and the like of the display device, it is preferable to use a semi-transparent electrode as the first electrode 213 or the second electrode 215 in a case of extracting the light emission from the organic EL layer 214 from the side of the first electrode 213 or the side of the second electrode 215.

As a material of the semi-transparent electrode, it is possible to use a semi-transparent electrode single body of metal or a combination of a semi-transparent electrode of metal and a transparent electrode material. Silver is particularly preferable as the material of the semi-transparent electrode in terms of a reflectance and a transmittance.

A film thickness of the semi-transparent electrode is preferably from 5 nm to 30 nm. If the film thickness of the semi-transparent electrode is less than 5 nm, it is not possible to sufficiently reflect light and to sufficiently obtain an effect of interference. In addition, if the film thickness of the semi-transparent electrode exceeds 30 nm, light transmittance steeply decreases, and therefore, there is a concern in that luminance and light emission efficiency of the display device decrease.

In addition, it is preferable to use an electrode with high reflectance which reflects light, as the first electrode 213 or the second electrode 215. Examples of the electrode with high reflectance include a reflective metal electrode (reflective electrode) made of aluminum, silver, gold, aluminum-lithium alloy, aluminum-neodymium alloy, aluminum-silicon alloy or the like and an electrode obtained by combining the reflective metal electrode and a transparent electrode.

An electrical charge injection transport layer is classified into electrical charge injection layers (the hole injection layer 216 and the electron injection layer 221) and electrical charge transport layers (the hole transport layer 217 and the electron transport layer 220) for the purpose of more efficiently injecting electrical charge (holes and electrons) from the electrodes and transporting (injecting) the electrical charge to the light-emitting layer. The electrical charge injection transport layer may be made of only an electrical charge injection transport material exemplified below, may arbitrarily contain an additive (a donor, an acceptor, or the like), or may be configured such that such materials are dispersed in a polymeric material (bonding resin) or an inorganic material.

As the electrical charge injection transport material, it is possible to use known electrical charge injection transport materials for an organic EL element and an organic optic dielectric body. Such electrical charge injection transport materials are classified into hole injection transport materials and electron injection transport materials, and specific compounds thereof will be exemplified below. However, the embodiment is not limited to these materials.

As materials of the hole injection layer 216 and the hole transport layer 217, known materials are used, and examples thereof include: oxidative products or inorganic p-type semiconductor materials such as vanadium oxide ($V_2O_5$), and molybdenum oxide ($MoO_2$); aromatic tertiary amine compounds such as a porphyrin compound, N,N'-bis(3-methylphenyl)-N,N'-bis(phenyl)-benzidine (TPD), N,N'-di(naphthalene-1-yl)-N,N'-diphenyl-benzidine (α-NPD), 4,4',4"-tri(carbazole-9-yl)triphenylamine (TCTA), N,N-dicarbazolyl- 3,5-benzene (m-CP), 4,4'-(cyclohexane-1,1-diyl)bis(N,N-di-p-tolylaniline) (TAPC), 2,2'-bis(N,N-diphenylamine)-9,9'-spirobifluorene (DPAS), N1,N1'-(biphenyl-4,4'-diyl)bis(N1-phenyl-N4,N4-di-m-tolylbenzene-1,4-diamine) (DNTPD), N3,N3,N3''',N3'''-tetra-p-tolyl-[1,1':2'1'':2'',1''-quaterphenyl]-3,3''-diamine (BTPD), 4,4'-(diphenylsilanediyl)bis(N,N-di-p-tolylaniline) (DTASi), and 2,2-bis(4-carbazole-9-ylphenyl)adamantine (Ad-Cz); low-molecule-containing nitrogen compounds such as a hydrazone compound, a quinacridone compound, and a styryamine compound; high-molecular compounds such as polyaniline (PANT), polyaniline-camphorsulfonic acid (PANI-CSA), 3,4-polyethylenedioxythiophene/polystyrene sulfonate (PEDOT/PSS), a poly(triphenylamine) dielectric body (Poly-TPD), polybinylcarbazole (PVCz), poly(p-phenylenevinylene) (PPV), and poly(p-naphtharenevinylene) (PNV); and aromatic hydrocarbon compounds such as 2-methyl-9,10-bis(naphtharene-2-yl)anthracene (MADN).

As a material of the hole injection layer 216, it is preferable to use a material with a lower energy level of the highest occupied molecular orbital (HOMO) than that of a material of the hole transport layer 217 in terms of more efficient injection and transport of the holes from the positive pole. In addition, as the material of the hole transport layer 217, it is preferable to use a material with higher hole mobility than that of the material of the hole injection layer 216.

The hole injection layer 216 and the hole transport layer 217 may arbitrarily contain an additive (a donor, an acceptor, or the like).

In addition, the hole injection layer 216 and the hole transport layer 217 preferably contain the acceptor in order to further enhance a hole injection property and a hole transport property. As the acceptor, it is possible to use a known acceptor material for the organic EL element. Although specific compounds thereof will be exemplified below, the embodiment is not limited to these materials.

The acceptor may be any of an inorganic material and an organic material.

Examples of the inorganic material include gold (Au), platinum (Pt), tungsten (W), iridium (Ir), phosphoryl chloride ($POCl_3$), phosphate hexafluoride ions ($AsF_6^-$), chlorine (Cl), bromine (Br), iodine (I), banadium oxide ($V_2O_5$), and molybdenum oxide ($MoO_2$).

Examples of the organic material include: compounds containing a cyano group such as 7,7,8,8-tetracyanoquinodimethane (TCNQ), tetrafluorotetracyanoquinodimethane ($TCNQF_4$), tetracyanoethylene (TCNE), hexacyanobutadiene (HCNB), and dicyclodicyanobenzoquinone (DDQ); compounds containing a nitro group such as: trinitrofluorenone (TNF), and dinitrofluorenone (DNF); fluoranil; chloranil; and bromanil.

Among them, compounds containing a cyano group such as TCNQ, $TCNQF_4$, TONE, HCNB, and DDQ are preferable due to a high effect of increasing hole concentration.

As materials of the hole blocking layer 219, the electron transport layer 220, and the electron injection layer 221, known materials are used. Examples of a low-molecular material include: an inorganic material as an n-type semiconductor; oxadiazole derivatives such as 1,3-bis[2-(2,2'-bipyridine-6-yl)-1,3,4-oxadiazole-5-yl]benzene (Bpy-OXD) and 1,3-bis(5-(4-(tert-butyl)phenyl)-1,3,4-oxadiazole-2-yl)benzene (OXD7); triazole derivatives such as 3-(4-biphenyl)-4-phenyl-5-tert-butylphenyl-1,2,4-triazole (TAZ), a thiopyrazine dioxide derivative; a benzoquinone derivative; a naphthoquinone derivative; an anthraquinone derivative; a diphenoquinone derivative; a fluorenone derivatives; benzodifuran derivative; quinolone derivatives such as 8-hydroxy quinolinolate-lithium (Liq); fluorene derivatives such as 2,7-bis[2-(2,2'-bipyridine-6-yl)-1,3,4-oxadiazole-5-yl]-9,9-dimethylfluorene (Bpy-FOXD); benzene derivatives such as 1,3,5-tri[(3-pyridyl)-phene-3-yl]benzene (TmPyPB) and 1,3,5-tri[(3-pyridyl)-phene-3-yl]benzene (TpPyPB); benzimidazole derivatives such as 2,2'2'''-(1,3,5-benzinetriyl)-tris(1-phenyl-1-H-benzimidazole) (TPBI); pyridine derivatives such as 3,5-di(pyrene-1-yl)pyridine (PY1); biphenyl derivatives such as 3,3'5,5'-tetra[(m-pyridyl)-phene-3-yl]biphenyl (BP4 mPy); phenanthroline derivatives such as 4,7-diphenyl-1,10-phenanthroline (BPhen) and 2,9-dimethyl-4,7-diphenyl-1,10-phenanthroline (BCP); triphenylborane derivatives such as tris(2,4,6-trimethyl-3-(pyridine-3-yl)phenyl) borane (3TPYMB); tetraphenylsilane derivatives such as diphenylbis(4-(pyridine-3-yl)phenyl)silane (DPPS); poly (oxadiazole) (Poly-OXZ) and a polystyrene derivative (PSS). Particularly, as materials of the electron injection layer 221, it is possible to exemplify fluorides such as lithium fluoride (LiF) and barium fluoride ($BaF_2$); and oxides such as lithium oxide ($Li_2O$).

As a material of the electron injection layer 221, it is preferable to use a material whose energy level of a lowest unoccupied molecular orbital (LUMO) is higher than that of a material of the electron transport layer 220 in terms of more efficient injection and transport of the electrons from the negative pole. In addition, as the material of the electron transport layer 220, it is preferable to use a material whose electron mobility is higher than that of the material of the electron injection layer 221.

The electron transport layer 220 and the electron injection layer 221 may arbitrarily contain an additive (a donor, an acceptor, or the like).

In addition, the electron transport layer 220 and the electron injection layer 221 preferably contain a donor in order to further enhance an electron transport property and an electron injection property. As the donor, it is possible to use a known donor material for the organic EL element. Although specific compounds are exemplified below, the embodiment is not limited to these materials.

The donor may be any of an inorganic material and an organic material.

Examples of the inorganic material include: alkali metal such as lithium, sodium, and potassium; alkali earth metal such as magnesium and calcium; a rare earth element; aluminum (Al); silver (Ag); copper (Cu); and indium (In).

Examples of the organic material include: compounds containing an aromatic tertiary amine skeleton, condensed polycyclic compounds which may contain a substituent group such as phenanthrene, pyrene, perylene, anthracene, tetracene, or pentacene, tetrathiafulvalens (TTF), dimenzofuran, phenothiazine, and carbazole.

Examples of the compounds containing the aromatic tertiary amine skeleton include: anilines; phenylenediamines; benzidines such as N,N,N',N'-tetraphenylbenzidine, N,N'-bis-(3-methylphenyl)-N,N'-bis-(phenyl)-benzidine, N,N'-di(naphthalene-1-yl)-N,N'-diphenyl-benzidine; triphenylamines such as triphenylamine, 4,4',4''-tris(N,N-diphenyl-amino)-triphenylamine, 4,4',4''-tris(N-3-methylphenyl-N-phenyl-amino)-triphenylamine, and 4,4',4''-tris(N-(1-naphtyl)-N-phenyl-amino)-triphenylamine; and triphenyldiamines such as N,N'-di-(4-methyl-phenyl)-N,N'-diphenyl-1,4-phenylenediamine.

The above expression that a condensed polycyclic compound "contains a substituent group" represents that one or more hydrogen atom in a condensed polycyclic compound is substituted with a group (substituent group) other than a hydrogen atom, the number of substituent groups is not particularly limited, and all the hydrogen atoms may be substituted with substituent groups. In addition, a position of the substituent group is also not particularly limited.

Examples of the substituent group includes an alkyl group which contains one to ten carbon atoms, an alkoxy group which contains one to ten carbon atoms, an alkenyl group which contains two to ten carbon atoms, an alkenyloxy group which contains two to ten carbon atoms, an aryl group which contains six to fifteen carbon atoms, an aryloxy group which contains six to fifteen carbon atoms, a hydroxyl group, and a halogen atom.

The alkyl group may be any of linear, branched-chain, and cyclic alkyl groups.

Examples of the linear or branched-chain alkyl group include a methyl group, an ethyl group, an n-propyl group, an isopropyl group, an n-butyl group, an isobutyl group, a sec-butyl group, a tert-butyl group, an n-pentyl group, an isopentyl group, a neopentyl group, a tert-pentyl group, a 1-methylbutyl group, an n-hexyl group, a 2-methylpentyl group, a 3-methylpentyl group, a 2,2-dimethylbutyl group, a 2,3-dimethylbutyl group, an n-heptyl group, a 2-methylhexyl group, a 3-methylhexyl group, a 2,2-dimethylpentyl group, a 2,3-dimethylpentyl group, a 2,4-dimethylpentyl group, a 3,3-dimethylpentyl group, a 3-ethylpentyl group, a 2,2,3-trimethylbuthyl group, an n-octyl group, an isooctyl group, a nonyl group, and a decyl group.

The cyclic alkyl group may be any of a monocyclic alkyl group and a polycyclic alkyl group, and examples thereof include a cyclopropyl group, a cyclobutyl group, a cyclopentyl group, a cyclohexyl group, a cycloheptyl group, a cyclooctyl group, a cyclononyl group, a cyclodecyl group, a norbornyl group, an isobornyl group, a 1-adamantyl group, a 2-adamantyl group, and a tricyclodecyl group.

Examples of the alkoxyl group include a monovalent group in which an alkyl group is bonded to an oxygen atom.

Examples of the alkenyl group include an alkyl group, which contains two to ten carbon atoms, and in which one single bond of (C—C) between carbon atoms is substituted with a double bond (C=C).

Examples of the alkenyoxy group include a monovalent group in which an alkenyl group is bonded to an oxygen atom.

The aryl group may be any of monocyclic and polycyclic aryl groups, the number of ring members is not particularly limited, and preferable examples thereof include a phenyl group, a 1-naphthyl group, and a 2-naphthyl group.

Examples of the aryloxy group include a monovalent group in which an aryl group is bonded to an oxygen atom.

Examples of the halogen atom include a fluorine atom, a chlorine atom, a bromine atom, and an iodine atom.

Among them, the compounds containing the aromatic tertiary amine skeleton, the condensed polycyclic compounds which may contain a substituent group, and alkali metal are preferable as the donor due to a higher effect of increasing the electron concentration.

The light-emitting layer 218 may be configured only of an organic light-emitting material exemplified below, may be made of a combination of a light-emitting dopant and a host material, or may arbitrarily contain a hole transport material, an electron transport material, an additive (a donor, an acceptor, or the like), and the like. In addition, a configuration in which these materials are dispersed in a polymeric material (bonding resin) or an inorganic material is also applicable. The material of the light-emitting layer 218 is preferably the material in which the light-emitting dopant is dispersed in the host material in terms of light emission efficiency and durability.

As the organic light-emitting material, it is possible to use known light-emitting materials for the organic EL element.

These light-emitting materials are classified into low-molecular light-emitting materials and high-molecular light-emitting materials. Although specific compounds thereof will be exemplified below, the embodiment is not limited to these materials.

Examples of the low-molecular light-emitting material (including host materials) used in the light-emitting layer 218 include: aromatic didimethylidene compounds such as 4,4'-bis(2,2'-diphenylvinyl)-biphenyl (DPVBi); oxadiazole compounds such as 5-methyl-2-[2-[4-(5-methyl-2-benzooxazolyl)phenyl]vinyl]benzooxazole; triazole derivatives such as 3-(4-biphenyl)-4-phenyl-5-t-butylphenyl-1,2,4-triazole (TAZ); styrylbenzene compounds such as 1,4-bis(2-methylstyryl)benzene; fluorescent organic materials such as a thiopyrazinedioxide derivative, a benzoquinone derivative, a naphthoquinone derivative, an anthraquinone derivative, a diphenoquinone derivative, and a fluorenone derivative; fluorescence-emitting organic metal complexes such as an azomethine-zinc complex, an (8-hydroxyquinolinato)aluminum complex ($Alq_3$); BeBq (bis(benzoquinolinato)beryllium complex); 4,4'-bis(2,2-di-p-tolyl-vinyl)-biphenyl (DT-VBi); tris(1,3-diphenyl-1,3-propanediono) (monophenanthroline) Eu(III) ($Eu(DBM)_3(Phen)$); a diphenylethylene derivative; triphenylamine derivatives such as tris[4-(9-phenylfluorene-9-yl)phenyl]amine (TFTPA); a diaminocarbazole derivative; a bisstyryl derivative; an aromatic diamine derivative; a quinacridone-based compound; a perylene-based compound; coumalin-based compound; a distyrylarylene derivative (DPVBi); an oligothiophene derivative (BMA-3T); silane derivatives such as 4,4'-di(triphenylsilyl)-biphenyl (BSB), diphenyl-di(o-tolyl)silane (UGH1), 1,4-bistriphenylsylylbenzene (UGH2), 1,3-bis(triphenylsilyl)benzene (UGH3), and triphenyl-(4-(9-phenyl-9H-fluorene-9-yl)phenyl)silane (TPSi—F); carbazole derivatives such as 9,9-di(4-dicarbazole-benzyl)fluorene (CPF), 3,6-bis(triphenylsilyl)carbazole (mCP), 4,4'-bis(carbazole-9-yl)biphenyl (CBP), 4,4'-bis(carbazole-9-yl)-2,2'-dimethylbiphenyl (CDBP), N,N-dicarbazolyl-3,5-benzene (m-CP), 3-(diphenylphosphoryl)-9-phenyl-9H-carbazole (PPO1), 3,6-di(9-carbazolyl)-9-(2-ethylhexyl)carbazole (TCz1), 9,9'-(5-(triphenylsilyl)-1,3-phenylene)bis(9H-carbazole) (SimCP), bis(3,5-di(9H-carbazole-9-yl)phenyl)diphenylsilane (SimCP2), 3-(diphenylphosphoryl)-9-(4-diphenylphosphoryl)phenyl)-9H-carbazole (PPO21), 2,2-bis(4-carbazolylphenyl)-1,1-biphenyl (4CzPBP), 3,6-bis(diphenylphosphoryl)-9-phenyl-9H-carbazole (PPO2), 9-(4-tert-butylphenyl)-3,6-bis(triphenylsilyl)-9H-carbazole (CzSi), 3,6-bis[(3,5-diphenyl)phenyl]-9-phenyl-carbazole (CzTP), 9-(4-tert-butylphenyl)-3,6-ditrityl-9H-carbazole (CzC), 9-(4-tert-butylphenyl)-3,6-bis(9-(4-methoxyphenyl)-9H-fluoren-9-yl)-9H-carbazole (DFC), 2,2'-bis(4-carbazole-9-yl)phenyl)-biphenyl (BCBP), and 9,9'-((2,6-diphenylbenzo[1,2-b:4,5-b']difuran-3,7-diyl)bis(4,1-phenylene))bis(9H-carbazole) (CZBDF); aniline derivatives such as 4-(diphenylphosphoryl)-N,N-diphenylaniline (HM-A1); fluorene derivatives such as 1,3-bis(9-phenyl-9H-fluorene-9-yl)benzene (mDPFB), 1,4-bis(9-phenyl-9H-fluorene-9-yl)benzene (pDPFB), 2,7-bis(carbazole-9-yl)-9,9-dimethylfluorene (DMFL-CBP), 2-[9,9-di(4-methylphenyl)-fluorene-2-yl]-9,9-di(4-methylphenyl)fluorene (BDAF), 2-(9,9-spirobifluorene-2-yl)-9,9-spirobifluorene (BSBF), 9,9-bis[4-(pyrenyl)phenyl]-9H-fluorene (BPPF), 2,2'- dipyrenyl-9,9-spirobifluorene (Spiro-Pye), 2,7-dipyrenyl-9,9-spirobifluorene (2,2'-Spiro-Pye), 2,7-bis[9,9-di(4-methylphenyl)-fluorene-2-yl]-9,9-di(4-methylphenyl)fluorene (TDAF), 2,7-bis(9,9-spirobifluorene-2-yl)-9,9-spirobifluorene (TSBF), and 9,9-spirobifluorene-2-yl-diphenyl-phosphine oxide (SPPO1); pyrene derivatives such as 1,3-di(pyrene-1-yl)benzene (m-Bpye); benzoate derivatives such as propane-2,2'-diylbis(4,1-phenylene)dibenzoate (MMA1); phosphine oxide derivatives such as 4,4'-bis(diphenylphosphine oxide)biphenyl (PO1) and 2,8-bis(diphenylphosphoryl)dibenzo[b,d]thiophene (PPT); terphenyl derivatives such as 4,4"-di(triphenylsilyl)-p-terphenyl (BST); and triazine derivatives such as 2,4-bis(phenoxy)-6-(3-methyldiphenylamino)-1,3,5-triazine (BPMT).

Examples of the high-molecular light emitting material used in the light-emitting layer 218 include: polyphenylenevinylene derivatives such as poly(2-decyloxy-1,4-phenylene) (DO-PPP), poly[2,5-bis-[2-(N,N,N-triethylammonium)ethoxy]-1,4-phenyl-alto-1,4-phenylene]dibromide (PPP-NEt$^{3+}$), poly[2-(2'-ethylhexyloxy)-5-methoxy-1,4-phenylenevinylene] (MEH-PPV), poly[5-methoxy-(2-propanoxysulfonide)-1,4-phenylenevinylene] (MPS-PPV), and poly[2,5-bis-(hexyloxy)-1,4-phenylene-(1-cyanovinylene)] (CN-PPV); polyspiro derivatives such as poly(9,9-dioctylfluorene) (PDAF); and carbazole derivatives such as poly(N-vinylcarbazole) (PVK).

It is preferable to use the low-molecular light-emitting material as the organic light-emitting material and to use a phosphorescent material with high light emission efficiency in terms of low power consumption.

As the light-emitting dopant used in the light-emitting layer 218, it is possible to use a known dopant for the organic EL element. Examples of an ultraviolet light-emitting material as such a dopant include fluorescence-emitting materials such as p-quaterphenyl, 3,5,3,5-tetra-tert-butylsexiphenyl, and 3,5,3,5-tetra-tert-butyl-p-quinquephenyl. In addition, examples of a blue light-emitting material include fluorescence-emitting materials such as a styryl derivative; and phosphorescent light-emitting organic metal complexes such as bis[(4,6-difluorophenyl)-pyridinato-N,C2']picolinateiridium(III) (FIrpic) and bis(4',6'-difluorophenylpolydinato)tetrakis(1-pyrazole)borate iridium(III) (FIr6). Moreover, examples of a green light-emitting material include tris(2-phenylpyridinato)iridium (Ir(ppy)$_3$).

Although the materials of the respective layers which configure the organic EL layer 214 were described above, the host material can also be used as the hole transport material or the electron transport material, and the hole transport material and the electron transport material can also be used as the host material, for example.

As a formation method of the respective layers, namely the hole injection layer 216, the hole transport layer 217, the light-emitting layer 218, the hole blocking layer 219, the electron transport layer 220, and the electron injection layer 221, a known wet process, a dry process, a laser transfer method, or the like is used.

Examples of the wet process include: application methods such as a spin coating method, a dipping method, a doctor blade method, an ejection coating method, and a spray coating method in which liquid obtained by dissolving or dispersing the above materials that form the respective layers in a solvent is used; and printing methods such as an ink jet method, a relief printing method, an intaglio printing method, a screen printing method, and a micro-gravure printing method.

The liquid used in the above application method or the printing method may contain an additive for adjusting physical properties of the liquid, such as a leveling agent or a viscosity adjusting agent.

As the dry process, a resistive heating deposition method, an electron beam (EB) deposition method, a molecular beam epitaxy (MBE) method, a sputtering method, or an organic vapor phase deposition (OVPD) method using the materials that form the above respective layers is used.

A film thickness of each of the layers, namely the hole injection layer 216, the hole transport layer 217, the light-emitting layer 218, the hole blocking layer 219, the electron transport layer 220, and the electron injection layer 221 is generally from about 1 nm to about 1000 nm and is preferably from 10 nm to 200 nm. If the film thickness is less than 10 nm, it is not possible to obtain physical properties (an electron injection property, a transport property, and a blocking property) which are originally required. In addition, there is a concern in that a defective pixel is generated due to foreign matter such as dust. In contrast, if the film thickness exceeds 200 nm, a drive voltage rises due to a resistive component in the organic EL layer 214, which results in an increase in power consumption.

The edge cover 222 can be formed by a known method such as an EB deposition method, a sputtering method, an ion-plating method, or a resistive heating deposition method by using an insulating material and can be patterned by a known dry method, or a photolithography method as a wet method. However, the embodiment is not limited to these formation methods.

In addition, although a known material is used as the insulating material which configures the edge cover 222, the insulating material is not particularly limited in the embodiment.

Since it is necessary for the edge cover 222 to transmit light, examples of the insulating material which forms the edge cover 222 include SiO, SiON, SiN, SiOC, SiC, HfSiON, ZrO, HfO, and LaO.

The film thickness of the edge cover 222 is preferably from 100 nm to 2000 nm. If the film thickness is less than 100 nm, an insulating property is not sufficient, and leakage occurs between the first electrode 213 and the second electrode 215, which may become a reason for an increase in power consumption and non-light emission. In contrast, if the film thickness exceeds 2000 nm, a film formation process requires time, which may become a reason for a decrease in production efficiency and disconnection of the second electrode 215 due to the edge cover 222.

Here, the organic EL element 212 preferable has a microcavity structure (optical micro resonator structure) based on an interference effect between the first electrode 213 and the second electrode 215 or a microcavity structure (optical micro resonator structure) based on a dielectric multilayered film. If the first electrode 213 and the second electrode 215 configure the micro resonator structure, it is possible to collect the light emission from the organic EL layer 214 in the front direction (light extraction direction) by the interference effect between the first electrode 213 and the second electrode 215. It is possible to cause the light emission from the organic EL layer 214 to have a directivity at this time, to thereby reduce a loss of light emission which escapes to a surrounding area, and to enhance light emission efficiency thereof. With such a configuration, it is possible to more efficiently deliver the light emission energy caused in the organic EL layer 214 to the phosphor layers and to enhance front luminance of the display device.

In addition, it is also possible to adjust a light emission spectrum of the organic EL layer 214 by the interference effect between the first electrode 213 and the second electrode 215 and to achieve adjustment to a desired light emission peak wavelength and a half width. With such a configuration, it is possible to achieve control for a spectrum with which the red phosphor and the green phosphor can more effectively be excited, and to enhance color purity of the blue pixel.

In addition, the display device according to the embodiment is electrically connected to external drive circuits (a scanning line electrode circuit, a data signal electrode circuit, and a power circuit).

Here, as the substrate 211 which configures the organic EL element substrate 210, a substrate obtained by coating a glass substrate with an insulating material is used, a substrate obtained by coating a metal substrate or a plastic substrate with an insulating material is more preferably used, and a substrate obtained by coating a metal substrate or a plastic substrate with an insulating material is further preferably used.

In addition, the display device according to the embodiment may be configured such that the organic EL element substrate 210 is directly connected to the external circuits and is driven, or such that a switching circuit such as a TFT is arranged in a pixel and the external drive circuits (the scanning line electrode circuit (source driver), the data signal electrode circuit (gate driver), and the power circuit) for driving the organic EL element substrate 210 are electrically connected to wiring to which the TFT or the like is connected.

According to the embodiment, it is preferable to provide color filters between the phosphor substrate and the organic EL element substrate 210. As the color filters, it is possible to use conventional color filters.

By providing the color filters as described above, it is possible to enhance the color purity of the red pixel, the green pixel, and the blue pixel and to enlarge a color reproduction range of the display device. In addition, since a blue color filter formed on the blue scattering body layer, a green color filter formed on the green phosphor layer, and a red color filter formed on the red phosphor layer absorb an excitation light component included in external light, it is possible to reduce or prevent light emission of the phosphor layers due to the external light and to reduce or prevent an increase in contrast.

Furthermore, the blue color filter formed on the blue scattering body layer, the green color filter formed on the green phosphor layer, and the red color filter formed on the red phosphor layer can prevent leakage of the excitation light, which is not absorbed by the phosphor layers and is likely to penetrate therethrough, to the outside. Therefore, it is possible to prevent a decrease in display color purity, which is caused by color mixture of the light emission from the phosphor layers and the excitation light According to the display device of the embodiment, it is possible to realize a display device which has significantly enhanced conversion efficiency due to an increase in light extraction efficiency, has an excellent view angle property, and is capable of reducing power consumption.

(2) Second Embodiment

Figure 14:
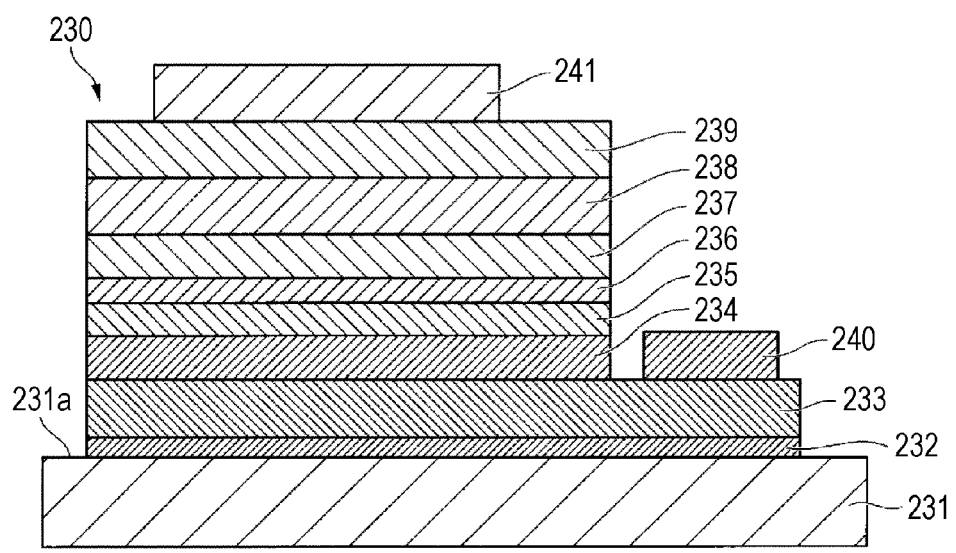
FIG. 14 is a schematic cross-sectional view showing an LED substrate which configures the display device according to the present invention.

FIG. 14 is a schematic cross-sectional view showing an LED substrate which configures a second embodiment of a display device according to the embodiment.

The display device according to the embodiment is substantially configured of a phosphor substrate configured of the substrate 77 including the light-scattering body film 73, the red phosphor film 74, the green phosphor film 75, the light absorption layer 76, the barrier 101, the wavelength selecting transflective film 111, the low-refractive-index film 121, and the like of the aforementioned light-emitting device according to the first to fourth embodiments formed thereon and an LED substrate (light source) 230 which is attached to the phosphor substrate via the flattening film 72 and the like of the aforementioned light-emitting device according to the first to fourth embodiments.

The LED substrate 230 is substantially configured of a substrate 231, a first buffer layer 232, an n-type contact layer 233, a second n-type clad layer 234, a first n-type clad layer 235, an active layer 236, a first p-type clad layer 237, a second p-type clad layer 238, a second buffer layer 239, a negative pole 240, and a positive pole 241. The first buffer layer 232, the n-type contact layer 233, the second n-type clad layer 234, the first n-type clad layer 235, the active layer 236, the first p-type clad layer 237, the second p-type clad layer 238, and the second buffer layer 239 are laminated in order on one surface 231a of the substrate 231. The negative pole 240 is formed on the n-type contact layer 233. The positive pole 241 is formed on the second buffer layer 239.

In addition, it is possible to use another known LED such as a blue light-emitting inorganic LED can be used as the LED, the specific configuration thereof is not limited to the configuration as described above.

Hereinafter, a detailed description will be given of the respective constituent elements of the LED substrate 230.

The active layer 236 is a layer for emitting light by recombining of electrons and holes, and it is possible to use a known active layer material for an LED as an active layer material. Although examples of such an active layer include ultraviolet active layer materials such as AlGaN, InAlN, $In_aAl_bGa_{1-a-b}N$ ($0 \leq a$, $0 \leq b$, $a+b \leq 1$) and blue active layer materials such as $In_zGa_{1-z}N$ ($0 < z < 1$), the embodiment is not limited to these materials.

In addition, the active layer 236 with a single-quantum well structure or a multi-quantum well structure is used. Although the active layer with the quantum well structure may be any of an n type and a p type, a non-doped (impurity non-added) active layer is particularly preferable since a half width of a light emission wavelength is narrowed due to interband light emission and light emission with satisfactory color purity can be obtained.

In addition, the active layer 236 may be doped with at least one of a donor impurity and an acceptor impurity. If a crystal property of the active layer doped with the impurity is the same as that of the non-doped active layer, it is possible to further enhance interband light emission intensity as compared with that of the non-doped active layer by doping the donor impurity. If the active layer is doped with the acceptor impurity, it is possible to shift the peak wavelength to a low energy side by about 0.5 eV as compared with the peak wavelength of the interband light emission while the half width is widened. If the active layer is doped with both the acceptor impurity and the donor impurity, it is possible to further enhance the light emission intensity as compared with the light emission intensity of the active layer which is doped only with the acceptor impurity. In a case where the active layer doped with the acceptor impurity is formed, in particular, it is preferable to adjust the conductive type of the active layer to an n type by also doping the active layer with the donor impurity such as Si.

As the second n-type clad layer 234 and the first n-type clad layer 235, it is possible to use a known n-type clad layer material for an LED. The second n-type clad layer 234 and the first n-type clad layer 235 may have any of a single layered structure and a multilayered structure. In a case where the second n-type clad layer 234 and the first n-type clad layer 235 are configured of n-type semiconductors with larger band gap energy than that of the active layer 236, a potential barrier with respect to the holes is created between the clad layers, namely the second n-type clad layer 234 and the first n-type clad layer 235, and the active layer 236 and the holes can be trapped in the active layer 236. Although it is possible to form the second n-type clad layer 234 and the first n-type clad layer 235 by n-type $In_xGa_{1-x}N$ (0≤x<1), for example, the embodiment is not limited thereto.

As the first p-type clad layer 237 and the second p-type clad layer 238, it is possible to use a known p-type clad layer material for an LED, and any of a single layer structure and a multilayered structure may be employed. In a case where the first p-type clad layer 237 and the second p-type clad layer 238 are configured of p-type semiconductors with larger band gap energy than that of the active layer 236, a potential barrier with respect to the electrons is created between the clad layers, namely the first p-type clad layer 237 and the second p-type clad layer 238, and the active layer 236, and the electrons can be trapped in the active layer 236. Although it is possible to form the first p-type clad layer 237 and the second p-type clad layer 238 by $Al_yGa_{1-y}N$ (0≤y≤1), the embodiment is not limited thereto.

As the n-type contact layer 233, it is possible to use a known contact layer material for an LED, and it is possible to form the n-type contact layer 233 made of an n-type GaN as a layer which is in contact with the second n-type clad layer 234 and the first n-type clad layer 235 and forms an electrode, for example. In addition, it is also possible to form a p-type contact layer made of p-type GaN as a layer which is in contact with the first p-type clad layer 237 and the second p-type clad layer 238 and forms an electrode. However, it is not particularly necessary to form the p-type contact layer as long as the second n-type clad layer 234 and the second p-type clad layer 238 are formed of GaN, and it is also possible to cause the second clad layers (the second n-type clad layer 234 and the second p-type clad layer 238) to function as contact layers.

Although it is possible to use a known film formation process for an LED as a formation method of the above respective layers used in the embodiment, the embodiment is not particularly limited thereto. For example, it is possible to form the respective layers on a substrate of sapphire (including a C plane, an A plane, and an R plane), SiC (including 6H—SiC and 4H—SiC), spinel ($MgAl_2O_4$, particularly a (111) plane thereof), ZnO, Si, or GaAs or a single crystal substrate of another oxidative product (such as NGO) by a vapor phase growth such as MOVPE (organic metal vapor phase growth method), MBE (molecular beam vapor phase growth method), or HDVPE (hydride vapor phase growth method).

According to the display device according to the embodiment, it is possible to realize a display device which has significantly enhanced conversion efficiency due to an increase in light extraction efficiency, has an excellent view angle property, and is capable of reducing power consumption.

(3) Third Embodiment

Figure 15:
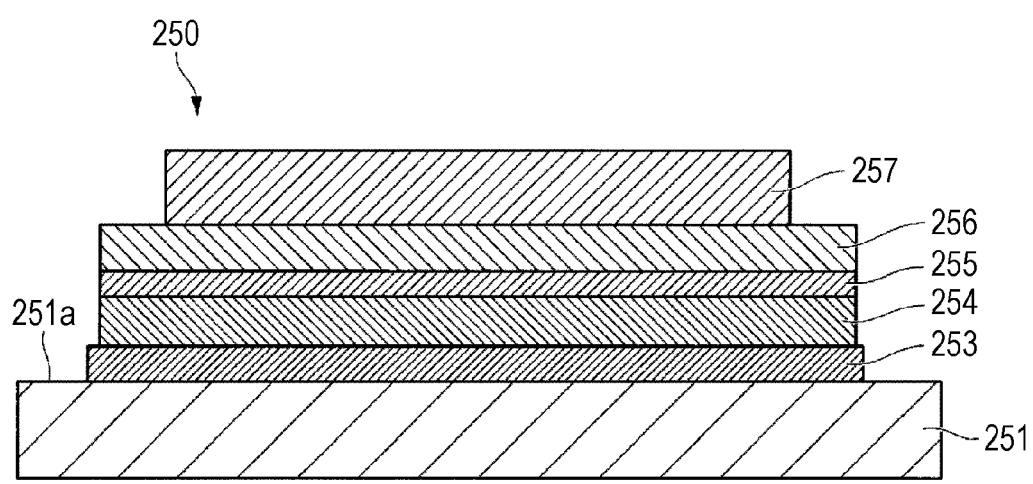
FIG. 15 is a schematic cross-sectional view showing an inorganic EL element substrate which configures the display device according to the present invention.

FIG. 15 is a schematic cross-sectional view showing an inorganic EL element substrate which configures a third embodiment of a display device according to the embodiment.

The display device according to the embodiment is substantially configured of a phosphor substrate configured of the substrate 77 including the light-scattering body film 73, the red phosphor film 74, the green phosphor film 75, the light absorption layer 76, the barrier 101, the wavelength selecting transflective film 111, the low-refractive-index film 121, and the like of the aforementioned light-emitting device according to the first to sixth embodiments formed thereon and an inorganic EL element substrate (light source) 250 which is attached to the phosphor substrate via the flattening film 72 and the like of the aforementioned light-emitting device according to the first to sixth embodiments.

The inorganic EL element substrate 250 is substantially configured of a substrate 251 and an organic EL element 252 which is provided on one surface 251a of the substrate 251.

The inorganic EL element 252 is configured of a first electrode 253, a first dielectric body layer 254, a light-emitting layer 255, a second dielectric body layer 256, and a second dielectric body layer 257 which are laminated in order on the one surface 251a of the substrate 251.

The first electrode 253 and the second electrode 257 function as a pair of a positive pole and a negative pole of the inorganic EL element 252.

In addition, although it is possible to use a known inorganic EL element, for example, a blue light-emitting inorganic EL element as the inorganic EL element 252, a specific configuration is not limited to the above configuration.

Hereinafter, a specific description will be given of the respective constituent members which configure the inorganic EL element substrate 250 and formation methods thereof. However, the embodiment is not limited to these constituent members and the formation methods.

As the substrate 251, the same substrate as the substrate 211 which configures the aforementioned organic EL element substrate 210 is used.

The first electrode 253 and the second electrode 257 function as a pair of a positive pole and a negative pole of the inorganic EL element 252. That is, the second electrode 257 functions as a negative pole in a case where the first electrode 253 is made to function as a positive pole, and the second electrode 257 functions as a positive pole in a case where the first electrode 253 is made to function as a negative pole.

As the first electrode 253 and the second electrode 257, examples of a transparent electrode material include metal such as aluminum (Al), gold (Au), platinum (Pt), and nickel (Ni), an oxidative product (ITO) made of indium (In) and tin (Sn), an oxidative product ($SnO_2$) made of tin (Sn), and an oxidative product (IZO) made of indium (In) and zinc (Zn). However, the embodiment is not limited to these materials. It is preferable to use a transparent electrode of ITO or the like as the electrode on the light extraction side and to use a reflective electrode made of aluminum or the like as the electrode on the side opposite to the light extraction direction.

The first electrode 253 and the second electrode 257 can be formed with the use of the above material by a known method such as an EB deposition method, a sputtering method, an ion plating method, or a resistive heating deposition method. However, the embodiment is not limited to these formation methods. In addition, it is also possible to pattern the electrodes which are formed by a photolithography method or a laser peeling method or to form patterned electrodes by a combination with a shadow mask as necessary.

A film thickness of each of the first electrode 253 and the second electrode 257 is preferably 50 nm or more.

If the film thickness is less than 50 nm, there is a concern in that wiring resistance increases and a drive voltage rises.

As the first dielectric body layer 254 and the second dielectric body layer 256, it is possible to use a known dielectric body material for an inorganic EL element. Examples of such a dielectric body material include tantalum pentoxide ($Ta_2O_5$), silicon oxide ($SiO_2$), silicon nitride ($Si_3N_4$), aluminum oxide ($Al_2O_3$), aluminum titanate ($AlTiO_3$), barium titanate ($BaTiO_3$), and strontium titanate ($SrTiO_3$). However, the embodiment is not limited to these dielectric materials.

In addition, the first electric body layer 254 and the second dielectric body layer 256 may have a single layer structure made of one kind selected from the above dielectric body materials or may have a multilayered structure in which two or more kinds are laminated.

In addition, a film thickness of each of the first dielectric body layer 254 and the second dielectric body layer 256 is preferably from about 200 nm to about 500 nm.

As the light-emitting layer 255, it is possible to use a known light-emitting material for an inorganic EL element. As such a light emitting material, examples thereof include $ZnF_2$:Gd as an ultraviolet light-emitting material, $BaAl_2S_4$:Eu, $CaAl_2S_4$:Eu, $ZnAl_2S_4$:Eu, $Ba_2SiS_4$:Ce, ZnS:Tm, SrS:Ce, SrS:Cu, CaS:Pb, and $(Ba,Mg)Al_2S_4$:Eu as blue light-emitting materials. However, the embodiment is not limited to these light-emitting materials.

In addition, a film thickness of the light-emitting layer 255 is preferably from about 300 nm to about 1000 nm.

According to the display device of the embodiment, it is possible to realize a display device which has significantly enhanced conversion efficiency due to an increase in light extraction efficiency, has an excellent view angle property, and is capable of reducing power consumption.

In addition, the organic EL element substrate, the LED substrate, and the inorganic EL element substrate were exemplified as configurations of the light sources in the aforementioned first, second, and third embodiments, respectively. In these configuration examples, it is preferable to provide a sealing film or a sealing substrate which seals light-emitting element such as an organic EL element, an LED, or an inorganic EL element.

The sealing film and the sealing substrate can be formed with a known material by a known sealing method. Specifically, it is possible to form the sealing film by applying resin to the surface on the opposite side to the substrate which configures the light source by using a spin coating method, ODF, a lamilating method, or the like. Alternatively, it is also possible to form the sealing film or to attach the sealing substrate by forming an inorganic film of SiO, SiON, SiN, or the like by a plasma CVD method, an ion plating method, an ion beam method, a sputtering method, or the like and then applying resin by using a spin coating method, ODF, a lamilating method, or the like.

By such a sealing film or the sealing substrate, it is possible to prevent mixture of oxygen and moisture into the light-emitting element from the outside, and a life time of the light source is extended.

In addition, it is also possible to bond the light source to the phosphor substrate with general ultraviolet curable resin, thermoset resin, or the like.

In addition, in a case where the light source is directly formed on the florescent body substrate, a method of sealing inert gas such as nitrogen gas or argon gas with a glass plate, a metal plate, or the like is exemplified. Furthermore, it is preferable to mix a moisture absorbent such as barium oxide into the sealed inert gas since it is possible to more effectively reduce the mixture of moisture into the organic EL element.

However, the embodiment is not limited to these members and the formation methods. In addition, in a case where light is extracted from the opposite side to the substrate, it is necessary to use a light transmissive material for both the sealing film and the sealing substrate.

(4) Fourth Embodiment

Figure 16:
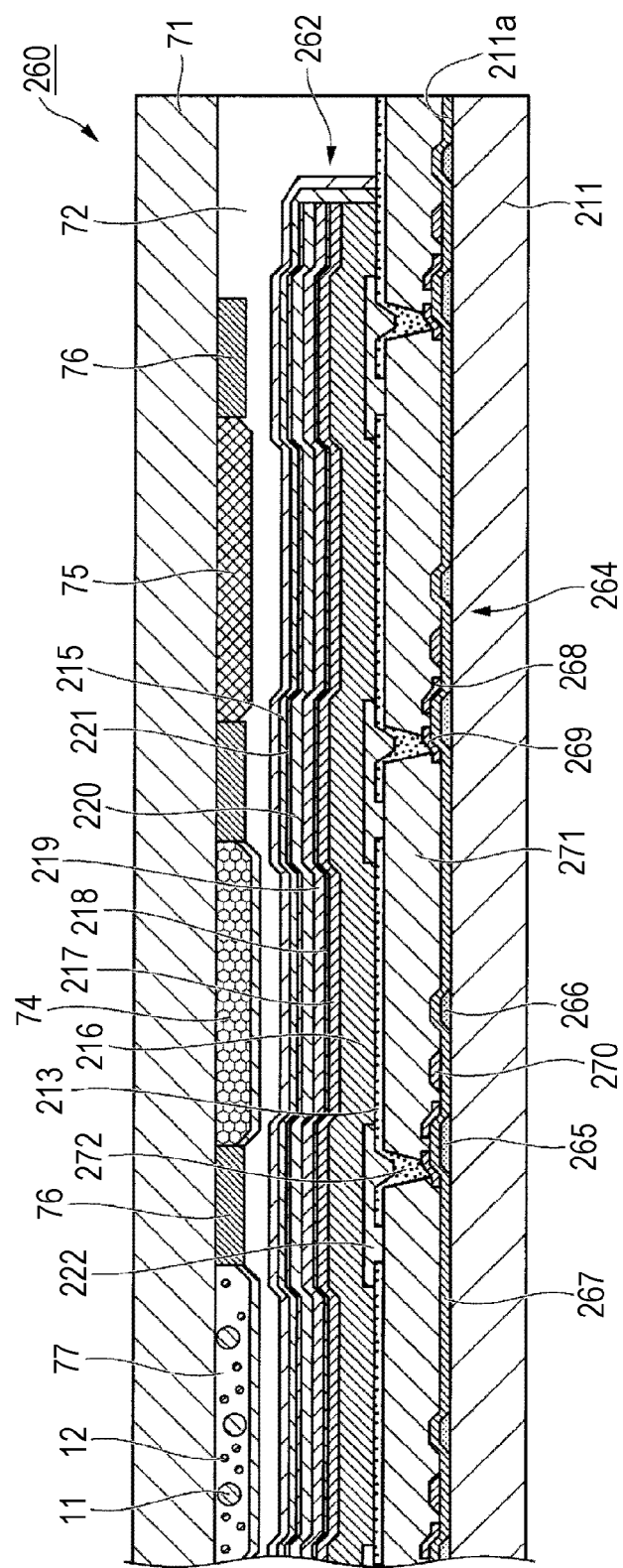
FIG. 16 is a schematic cross-sectional view showing an organic EL display which configures the display device according to the present invention.
Figure 17:
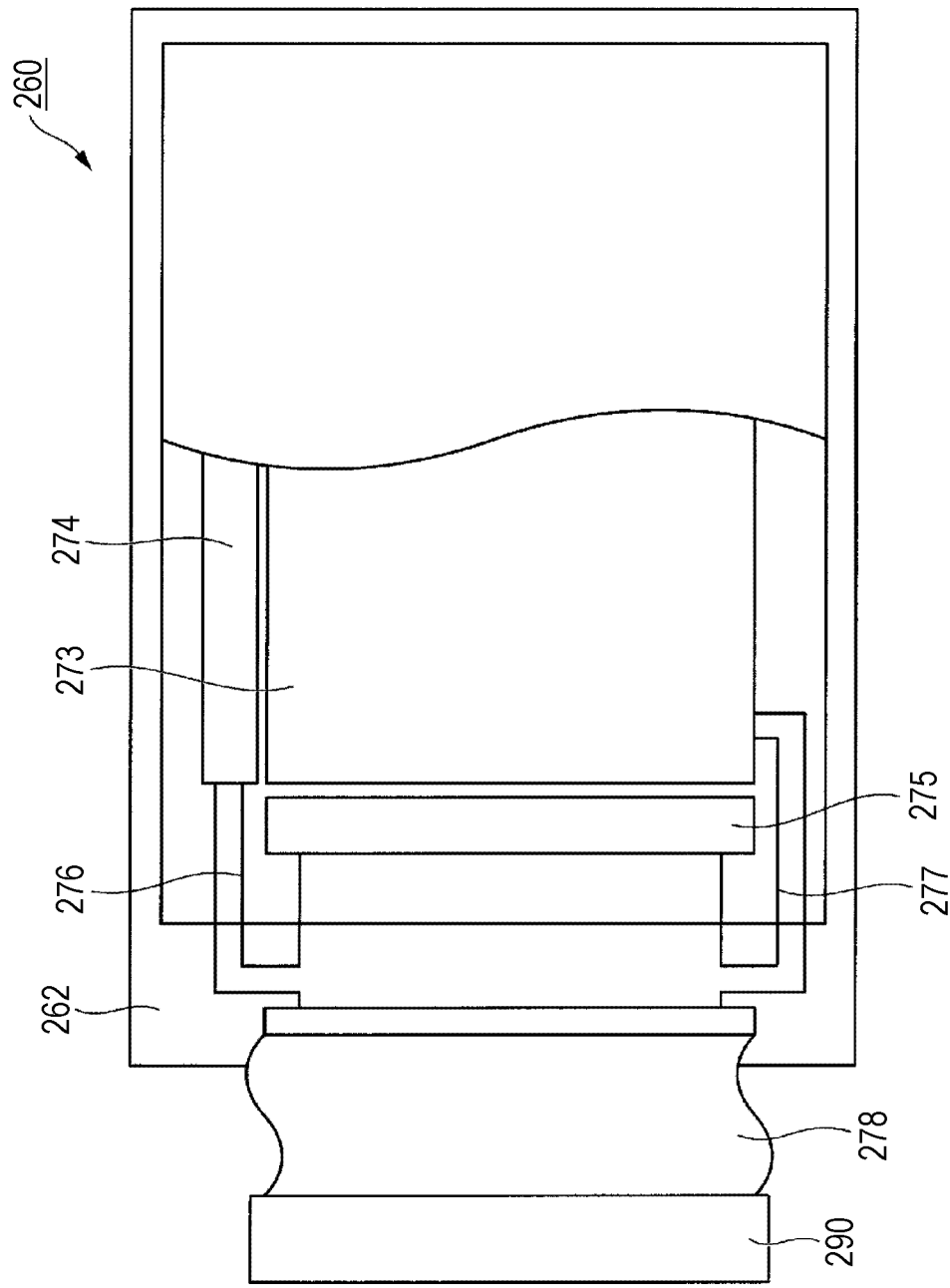
FIG. 17 is a schematic planar view showing the organic EL display which configures the display device according to the present invention.

FIG. 16 is a schematic cross-sectional view showing a fourth embodiment of a display device according to the embodiment. FIG. 17 is a schematic planar view showing the fourth embodiment of the display device according to the embodiment. In FIGS. 16 and 17, the same reference numerals will be given to the same constituent elements as those in the light-emitting device 70 shown in FIG. 7 and the organic EL element substrate 210 shown in FIG. 13, and descriptions thereof will be omitted.

A display device 260 according to the embodiment is substantially configured of a phosphor substrate 261 with the same configuration as that of the substrate 77, on which the light-scattering body film 73, the red phosphor film 74, the green phosphor film 75, the light absorption layer 76, the barrier 101, the wavelength selecting transflective film 111, the low-refractive-index film 121, and the like are formed, of the aforementioned light-emitting device according to the first to sixth embodiments and an organic EL element substrate (light source) 262 of an active matrix drive type, which is attached to the phosphor substrate 261 via the flattening film 12 of the aforementioned light-emitting device according to the first to sixth embodiments.

For the organic EL element substrate 262, an active matrix drive scheme using a TFT is used as means for switching whether or not to irradiate each of a red pixel PR, a green pixel PG, and a blue pixel PB with light.

(Active Matrix Drive-Type Organic EL Element Substrate)

Hereinafter, a detailed description will be given of the organic EL element substrate 262 of the active matrix drive type.

In the organic EL element substrate 262, a TFT 264 is formed on one surface 211a of the substrate 211. That is, a gate electrode 265 and gate lines 266 are formed on the one surface 211a of the substrate 211. A gate insulating film 267 is formed on the one surface 211a of the substrate 211 so as to cover the gate electrode 265 and the gate line 266. An active layer (omitted in the drawing) is formed on the gate insulating film 267. A source electrode 268, a drain electrode 269, and data lines 270 are formed on the active layer. A flattening film 271 is formed so as to cover the source electrode 268, the drain electrode 269, and the data lines 270.

In addition, the flattening film 271 may not have a single layer structure and may be configured of a combination of another interlayer insulating film and a flattening film. In addition, a contact hole 272 which reaches the drain electrode 269 is formed so as to penetrate through the flattening film 271 or the interlayer insulating film. The first electrode 213 of the organic EL element 212 which is electrically connected to the drain electrode 269 via the contact hole 272 is formed on the flattening film 271. The configuration of the organic EL element 212 is the same as that in the aforementioned first embodiment.

The TFT 264 is formed on the one surface 211a of the substrate 211 in advance before forming the organic EL element 212 and functions as a pixel switching element and an organic EL driving element.

A known TFT is exemplified as the TFT 264, and it is possible to form the TFT 264 by using a known material, a structure, and a formation method. In addition, according to the embodiment, it is also possible to use a metal-insulating body-metal (MIM) diode instead of the TFT 264.

As a material of the active layer which configures the TFT 264, the same material as that in the aforementioned first embodiment is used.

As a formation method of the active layer which configures the TFT 264, the same method as that in the aforementioned first embodiment is used.

The gate insulating film 267 which configures the TFT 264 can be formed by using a known material. As a gate insulating film 267, it is possible to exemplify $SiO_2$ formed by a PECVD method, an LPCVD method, or the like or $SiO_2$ obtained by thermal oxidation of a polysilicon film.

In addition, the data lines 270, the gate lines 266, the source electrode 268, and the drain electrode 269 which configure the TFT 264 can be formed by using a known conductive material. Examples of the material of the data lines 270, the gate lines 266, the source electrode 268, and the drain electrode 269 include tantalum (Ta), aluminum (Al) and copper (Cu).

Although the TFT 264 can be configured as described above, the embodiment is not limited to these materials, structures, and formation methods.

As the interlayer insulating film used in the embodiment, the same interlayer insulating films as those in the aforementioned first embodiment are exemplified.

In addition, as the formation method of the interlayer insulating film, the same methods as those in the aforementioned first embodiment are exemplified.

In a case where the light emission from the organic EL element 212 is extracted from the opposite side to the substrate 211 (the side of the second electrode 215), it is preferable to use a light-blocking insulating film which also has a light blocking property for the purpose of preventing occurrence of variations in an electric property of the TFT 264 due to external light which is incident on the TFT 264 formed on one surface of the substrate 211. In addition, it is also possible to use a combination of the above interlayer insulating film and the light-blocking insulating film. As a material of the light-blocking insulating film, the same materials as those in the aforementioned first embodiment are exemplified.

There is a concern in that phenomena such as deficiency or disconnection of the first electrode 213 and the second electrode 215, deficiency of the organic EL layer 214, short-circuiting between the first electrode 213 and the second electrode 215, and a decrease in pressure resistance occur due to irregularity formed on the surface of the display device 260 due to the TFT 264, various kinds of wiring, the electrodes, and the like formed on the one surface 211a of the substrate 211. In order to prevent such phenomena, it is desirable to provide the flattening film 271 on the interlayer insulating film.

The flattening film 271 can be formed by using a known material. As the material of the flattening film 271, the same materials as those in the aforementioned first embodiment are exemplified.

In addition, the flattening film 271 may have any of a single layer structure and a multilayered structure.

In addition, a sealing film 273 which seals the organic EL element 212 is provided on a surface (a surface which faces the phosphor substrate 261) of the organic EL element 212.

In addition, the display device 260 is provided with a pixel unit 273 which is formed on the organic EL element substrate 262, a gate signal-side drive circuit 274, a data signal-side drive circuit 275, signal wiring 276, a current supply line 277, a flexible printed wiring board (hereinafter, also abbreviated as an "FPC") 278 which is connected to the organic EL element substrate 262, and an external drive circuit 290 as shown in FIG. 17.

The organic EL element substrate 262 is electrically connected to the external drive circuit 290 including a scanning line electrode circuit, a data signal electrode circuit, and a power circuit via an FPC 279 in order to drive the organic EL element 212. According to the embodiment, the switching circuits such as a TFT 264 are arranged in the pixel unit 274. The data signal-side drive circuit 275 and the gate signal-side drive circuit 274 for driving the organic EL element 212 are respectively connected to the wiring such as data lines 270 and gate lines 266 to which the TFT 264 and the like are connected. The external drive circuit 290 is connected to these drive circuits via the signal wiring 267. In the pixel unit 274, a plurality of gate lines 266 and a plurality of data lines 270 are arranged, and the TFT 264 is arranged at an intersecting portion between the gate lines 266 and the data lines 270.

The organic EL element 212 is driven by a voltage drive digital gradation scheme. Two TFTs, namely a switching TFT and a driving TFT, are arranged for each pixel. The driving TFT and the first electrode 213 of the organic EL element 212 are electrically connected via the contact hole 272 formed in the flattening film 271. In addition, a capacitor (omitted in the drawing) for adjusting a gate potential of the driving TFT to a constant potential is arranged in one pixel so as to be connected to a gate electrode of the driving TFT.

However, the embodiment is not particularly limited thereto, and a drive scheme may be the aforementioned voltage drive digital gradation scheme or a current drive analog gradation scheme. In addition, the number of TFTs is also not particularly limited, and the organic EL element 212 may be driven by the aforementioned two TFTs, or the organic EL element 212 may be driven by using two or more TFTs with compensation circuits incorporated in the pixel for the purpose of preventing variations in properties (mobility and a threshold voltage) of the TFTs 264.

According to the display device 260 of the embodiment, it is possible to realize a display device which has significantly enhanced conversion efficiency due to an increase in light extraction efficiency, has an excellent view angle property, and is capable of reducing power consumption.

Since the organic EL element substrate 262 of the active matrix driving type is employed, in particular, in the embodiment, it is possible to realize the display device with excellent display quality. In addition, it is possible to extent a light emission time of the organic EL element 212 as compared with passive driving, to reduce a drive current to obtain desired luminance, and to thereby reduce power consumption. Furthermore, since light is extracted from the opposite side to the organic EL element substrate 262 (the side of the phosphor substrate 261) according to the configuration, it is possible to widen the light emission region regardless of a formation region of the TFTs, the various kinds of wiring, and the like ad to raise an aperture ratio of the pixels.

(5) Fifth Embodiment

Figure 18:
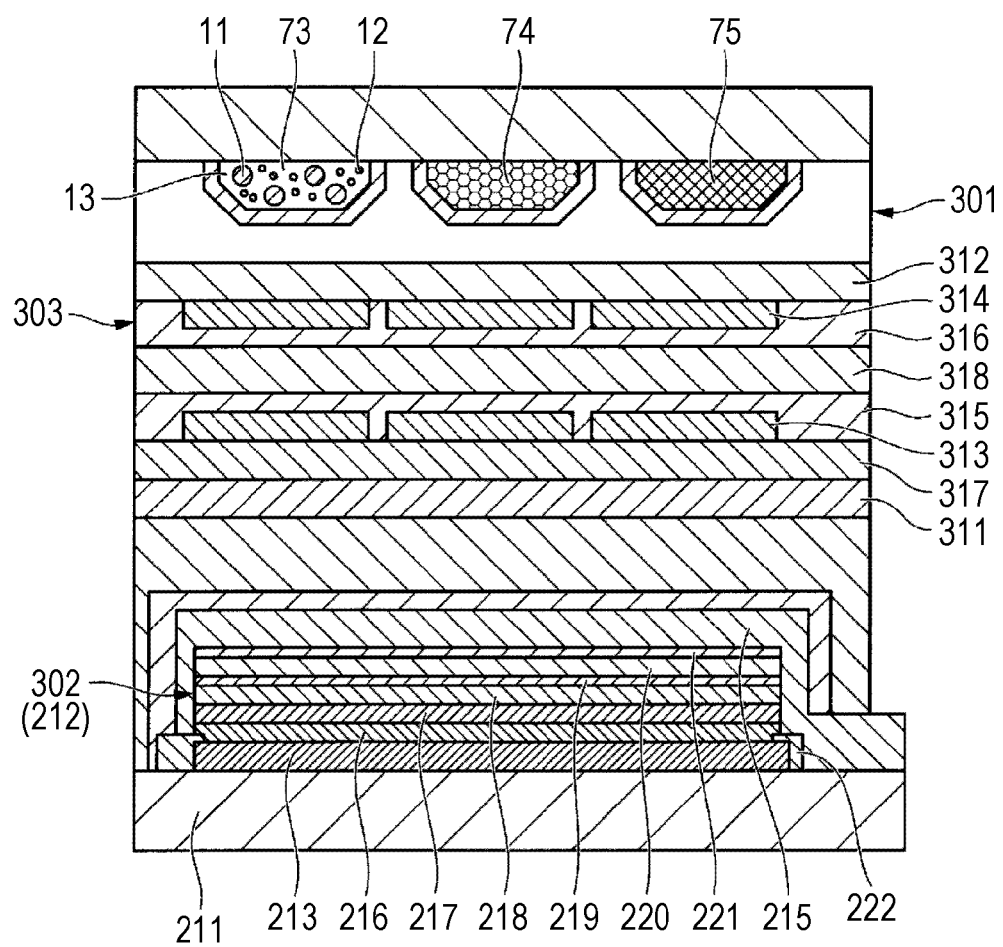
FIG. 18 is a schematic cross-sectional view of the display device according to the present invention.

FIG. 18 is a schematic cross-sectional view showing a fifth embodiment of a display device according to the embodiment. In FIG. 18, the same reference numerals are given to the same constituent elements as those in the light-emitting device 70 shown in FIG. 7 and those in the organic EL element substrate 210 shown in FIG. 13, and the description thereof will be omitted.

A display device 300 according to the embodiment is substantially configured of a phosphor substrate 301 with the same configuration as that of the substrate 77, on which the light-scattering body film 73, the red phosphor film 74, the green phosphor film 75, the light absorption layer 76, the barrier 101, the wavelength selecting transflective film 111, the low-refractive-index film 121, and the lie of the aforementioned light-emitting device according to the first to sixth embodiments are formed, an organic EL substrate (light source) 302, and a liquid crystal element 303.

The organic EL element 212 which configures the organic EL element substrate 302 is not divided for each pixel and functions as a planar light source common to all the pixels.

In addition, the liquid crystal element 303 is configured so as to be able to control a voltage to be applied to the liquid crystal layer by using a pair of electrodes for each pixel and controls transmittance of light, which is emitted from the entire surface of the organic EL element 212, for each pixel. That is, the liquid crystal element 303 has a function as a light shutter which selectively transmits light from the organic EL element substrate 302 for each pixel.

As the liquid crystal element 303, it is possible to use a known liquid crystal element. The liquid crystal element 303 is provided with a pair of polarizers 311 and 312, transparent electrodes 313 and 314, orientation films 315 and 316, and a substrate 317, for example, and is configured such that a liquid crystal 318 is pinched between the orientation films 315 and 316.

Furthermore, an optical anisotropic layer may be provided between a liquid crystal cell and any of the polarizers 311 and 312, or alternatively, the optical anisotropic layers may be provide between the liquid crystal cell and both the polarizers 311 and 312. According to the display device 300, the polarizers are preferably provided on the light extraction side.

As the polarizers 311 and 312, it is possible to use a combination of a conventional linear polarizer and a λ/4 plate. By providing the polarizers 311 and 312, it is possible to prevent reflection of external light from the electrodes in the display device 300 and reflection of external light at the surface of the substrate or the sealing substrate and to enhance contrast of the display device 300.

In addition, the polarizers 311 and 312 whose extinction ratio at a wavelength of 435 nm or more and 480 nm or less is 10000 or more are preferably used.

As a type of the liquid cell is not particularly limited and can be appropriately selected in accordance with a purpose. Examples of the liquid cell include a TN mode, a VA mode, an OCB mode, an ISP mode, and an ECB mode.

In addition, the liquid crystal element 303 may be passively driven or may be actively driven by using a switching element such as a TFT.

According to the display device of the embodiment, it is possible to realize a display device 300 which has significantly enhanced conversion efficiency due to an increase in light extraction efficiency, has an excellent view angle property, and is capable of reducing power consumption.

In addition, according to the embodiment, it is possible to further reduce the power consumption by the combination of the pixel switching of the liquid crystal element 303 and the organic EL element substrate 302 which functions as a planar light source.

(6) Sixth Embodiment

Figure 19:
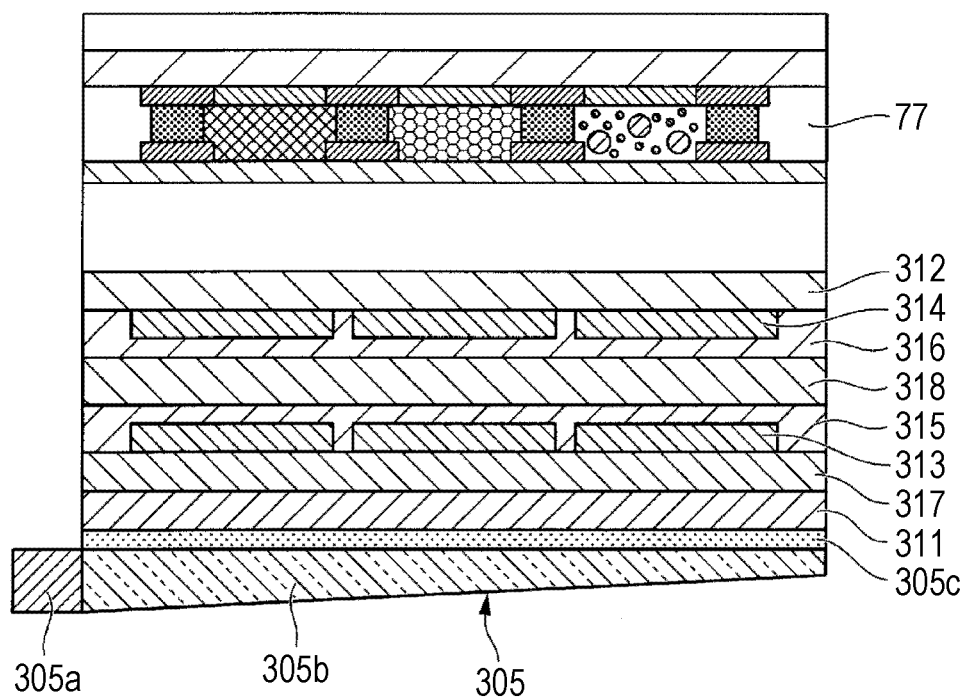
FIG. 19 is a schematic cross-sectional view of the display device according to the present invention.

FIG. 19 is a schematic cross-sectional view showing a sixth embodiment of a display device according to the embodiment. In FIG. 19, the same reference numerals are given to the same constituent elements as those in the light-emitting device 70 shown in FIG. 7 and those in the liquid crystal element 303 shown in FIG. 18, and the description thereof will be omitted.

A display device 305 according to the embodiment is substantially configured of the phosphor substrate 271 with the same configuration as that of the substrate 77, on which the light-scattering body film 73, the red phosphor film 74, the green phosphor film 75, the light absorption layer 76, the barrier 101, the wavelength selecting transflective film 111, the low-refractive-index film 121, and the like of the aforementioned light-emitting device according to the first to sixth embodiments are formed, the liquid crystal element 303, and a backlight unit 305.

In the backlight unit 305, a light source is arranged on a bottom surface or a side surface of the backlight unit 305. In a case where the light source is arranged on the side surface of the backlight unit 305, the backlight unit 305 is configured of a reflective sheet, a light source, a light guiding plate, a first diffusing sheet, a prism sheet, and a second diffusing sheet, for example. In addition, a luminance improving film may be arranged between the backlight unit 305 and the backlight-side polarizer 311.

Here, a backlight unit 305 which is substantially configured of a light source 305a, a light guiding plate 305b, and a luminance improving film 305c is exemplified. The light source 305a is arranged on the side surface of the backlight unit 305. The light guiding plate 305b guides light from the light source 305a in a plane direction of the liquid crystal element 303. The luminance improving film 305c causes light to efficiently be incident on the liquid crystal element 303 from the light guiding plate 305b.

According to the display device 305, it is possible to realize a display device which has significantly enhanced conversion efficiency due to an increase in light extraction efficiency, has an excellent view angle property, and is capable of reducing power consumption.

In addition, according to the embodiment, it is possible to further reduce the power consumption by the combination of the pixel switching of the liquid crystal element 303 and the backlight unit 305 which functions as the planar light source.

Mobile Phone

Figure 20:
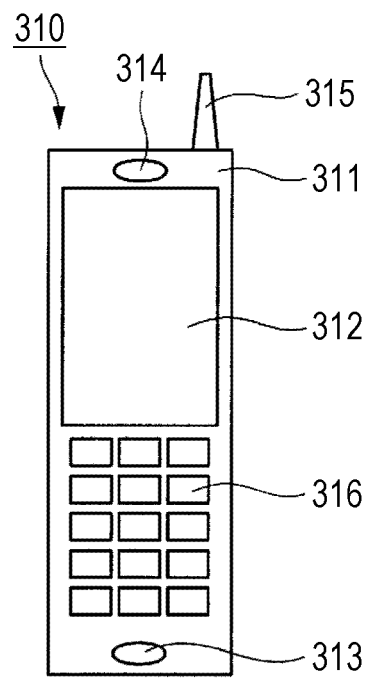
FIG. 20 is an external view showing a mobile phone as an application example of the display device according to the present invention.

The display device according to the aforementioned first to fifth embodiments can be applied to a mobile phone shown in FIG. 20, for example.

A mobile phone 310 is provided with a main body 311, a display unit 312, a sound input unit 313, a sound output unit 314, an antenna 315, an operation switch 316, and the like. In addition, the display device according to the aforementioned first to fifth embodiments can be preferably applied as the display unit 312. By applying the display device according to the aforementioned first to fifth embodiments to the display unit 312 in the mobile phone 310, it is possible to display a high-luminance video image with small power consumption.

Thin-Type Television

Figure 21:
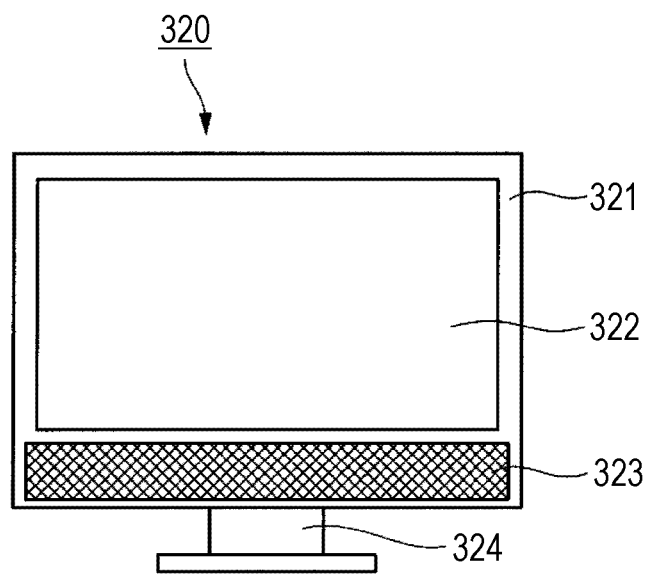
FIG. 21 is an external view showing a thin-type television as an application example of the display device according to the present invention.

The display device according to the aforementioned first to fifth embodiments can be applied to a thin-type television shown in FIG. 21, for example.

A thin-type television 320 is provided with a main body cabinet 321, a display unit 322, a speaker 323, a stand 324, and the like. In addition, the display device according to the aforementioned first to fifth embodiments can be preferably applied to the display unit 322. By applying the display device according to the aforementioned first to fifth embodiments to the display unit 322 in the thin-type television 320, it is possible to display a high-luminance video image with small power consumption.

Illumination Device (1) First Embodiment

Figure 22:
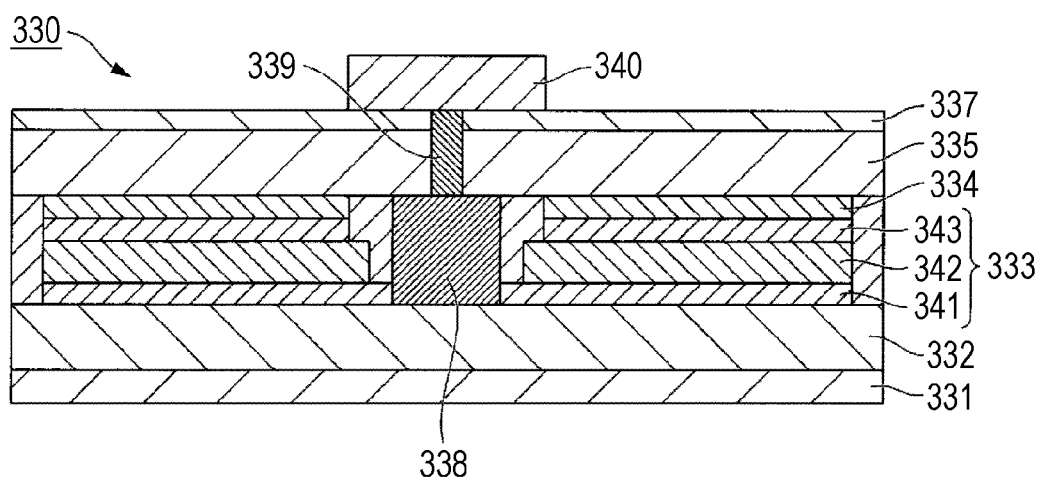
FIG. 22 is a schematic cross-sectional view showing an embodiment of an organic EL illumination device according to the present invention.

FIG. 22 is a schematic cross-sectional view showing a first embodiment of an illumination device according to the embodiment.

An illumination device 330 according to the embodiment is substantially configured of an optical film 331, a light-scattering body substrate 332, an organic EL element 333, a heat diffusing sheet 334, a sealing substrate 335, sealing resin 336, a heat releasing material 337, a drive circuit 338, wiring 339, and a hook ceiling 340.

The organic EL element 333 is substantially configured of a positive pole 341, an organic EL layer 342, and a negative pole 343.

Since a phosphor substrate with the same configuration as that of the substrate 77, on which the light-scattering body film 73, the red phosphor film 74, the green phosphor film 75, the light absorption layer 76, the barrier 81, the wavelength selecting transflective film 91, the low-refractive-index film 101, and the like of the aforementioned light-emitting device according to the first to fourth embodiments are formed, is used as the light-scattering body substrate 332 in the illumination device 330, it is possible to realize a bright illumination device of low power consumption.

(2) Second Embodiment

Figure 23:
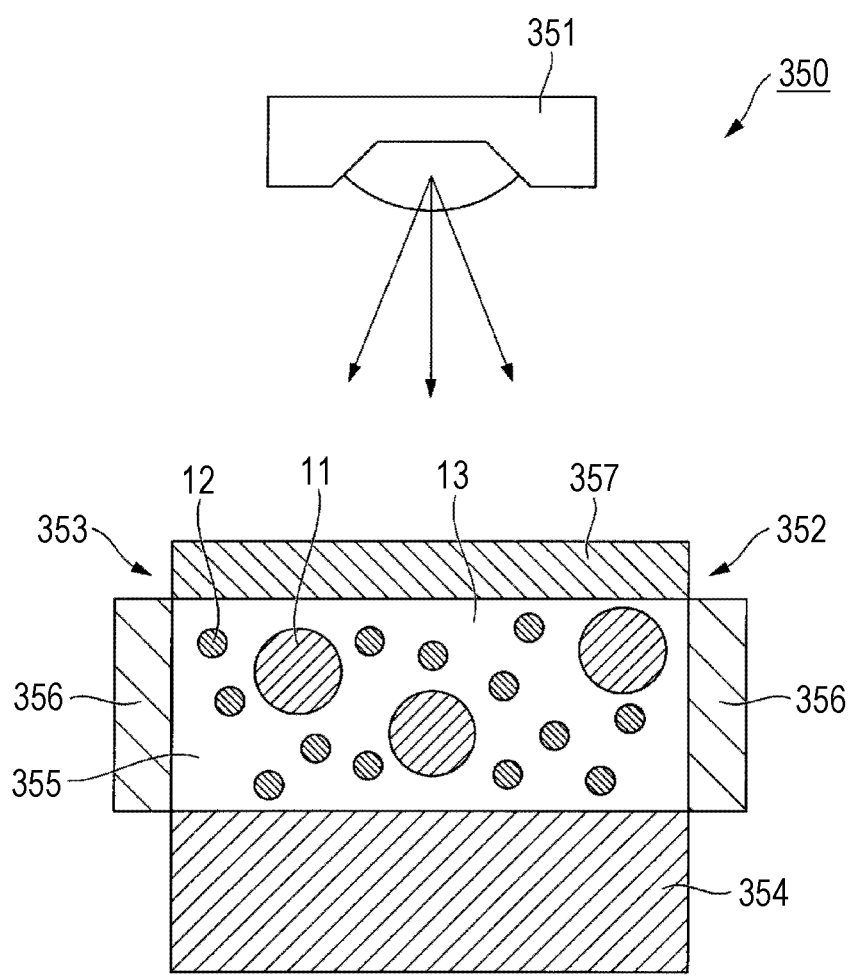
FIG. 23 is a schematic cross-sectional view showing an embodiment of an illumination device according to the present invention.

FIG. 23 is a schematic cross-sectional view showing a second embodiment of an illumination device according to the embodiment.

An illumination device 350 is provided with light-scattering body device 353 which is substantially configured of a light source 351 which emits incident light and a light-scattering body substrate 352.

The light-scattering body substrate 352 is substantially configured of a substrate 354, a light-scattering body film 355, a barrier 356, and a low-refractive-index film 357. The light-scattering body film 355 is formed on one surface of the substrate 354. The light-scattering body film 355 is arranged so as to face the light source 351. The light-scattering body film 355 scatters the incident light. The barrier 356 surrounds a side surface of the light-scattering body film 355 along a stacking direction of the light source 351 and the substrate 354. The low-refractive-index film 357 is formed on the light-scattering body film 355 on a side of an incident surface of the incident light from the light source. The low-refractive-index film 357 has a refractive index which is smaller than that of the light-scattering body film 355.

At least a part, which faces the light-scattering body film 355, of the barrier 356 has a light-scattering property.

Examples of a configuration in which the barrier 356 has the light-scattering property include a configuration in which the barrier 356 is formed of a material containing resin and light-scattering particles. Alternatively, a configuration in which a light-scattering layer (light-scattering film) made of a material containing resin and light-scattering particles is provided on the side surface of the barrier 356 is exemplified.

As the light source 351, the same light source as the light source 41 of the aforementioned light-scattering body device according to the first to third embodiments is exemplified.

As the substrate 354, the same substrate as the substrate 31 of the aforementioned light-scattering body device according to the first to third embodiments is exemplified.

As the light-scattering body film 355, the same light-scattering body film as the light-scattering body film 20 of the aforementioned light-scattering body device according to the first to third embodiments is exemplified.

As the barrier 356, the same barrier as the barrier 15 of the aforementioned light-scattering device according to the first to third embodiments is exemplified.

As the low-refractive-index film 357, the same low-refractive-index film as the low-refractive-index film 61 of the aforementioned light-scattering body device according to the third embodiment is exemplified.

A description will be given of light emission from the illumination device 350 with reference to FIG. 23.

If light is incident on the light-scattering body film 355 from the light source 351 and the incident light is brought into contact with the light-scattering particles in the illumination device 350, the light is scattered in arbitrary directions based on grain sizes and refractive indexes of the particles as described above. Then, a part of components, which are directed to the light extraction side (front direction, the side of the substrate 354), among the light which has been scattered (scattered light) can be extracted to the outside as effective light. In addition, scattered light components, which advance in the side surface direction of the light-scattering body film 355, among the scattered light are scattered at the side surface of the barrier 356 with the light-scattering property, and a part of the scattered light can be extracted to the outside as effective light emission. In contrast, scattered light (backward scattered light), which is scattered in a direction opposite to the substrate 354, among the scattered light emitted from the light-scattering body film 355 is reflected by the low-refractive-index film 357, is returned to the inside of the light-scattering body film 355, and is recycled to components which can be extracted on the side of the substrate 354 again.

A light-scattering material which forms the light-scattering body film according to the embodiment is made of first particles with a scattering angle θ of scattered light with respect to the incident direction of the incident light, which varies in a narrow range, that is, the first particles with a narrow scattering profile with which the light is scattered within the critical angle, and second particles with a smaller grain size and a higher refractive index as compared with the first particles and with a wide scattering profile with which the light is scattered within a wide range. Therefore, it is possible to significantly efficiently extract the incident light to the outside at a wide view angle.

Furthermore, according to the illumination device 350 it is possible to enhance efficiency of using light by scattering the scattered light components which are directed in the side surface direction of the light-scattering body film 355 by the barrier 356 with the light-scattering property and recycling the scattered light components and by reflecting the scattered light components which are directed in the backward direction of the light-scattering body film 355 by the low-refractive-index film 357 and recycling the scattered light components. Accordingly, the illumination device 350 is a bright illumination device of low power consumption.

Although a case where the respective layers configuring the phosphor substrate 352 have horizontal surface shapes was exemplified in FIG. 23, the embodiment is not limited thereto. The respective layers which configure the phosphor substrate 352 may have curved shapes which are projected toward the light extraction side (the front direction, the side of the substrate 354) as shown in FIG. 21.

Storage Container

Figure 24:
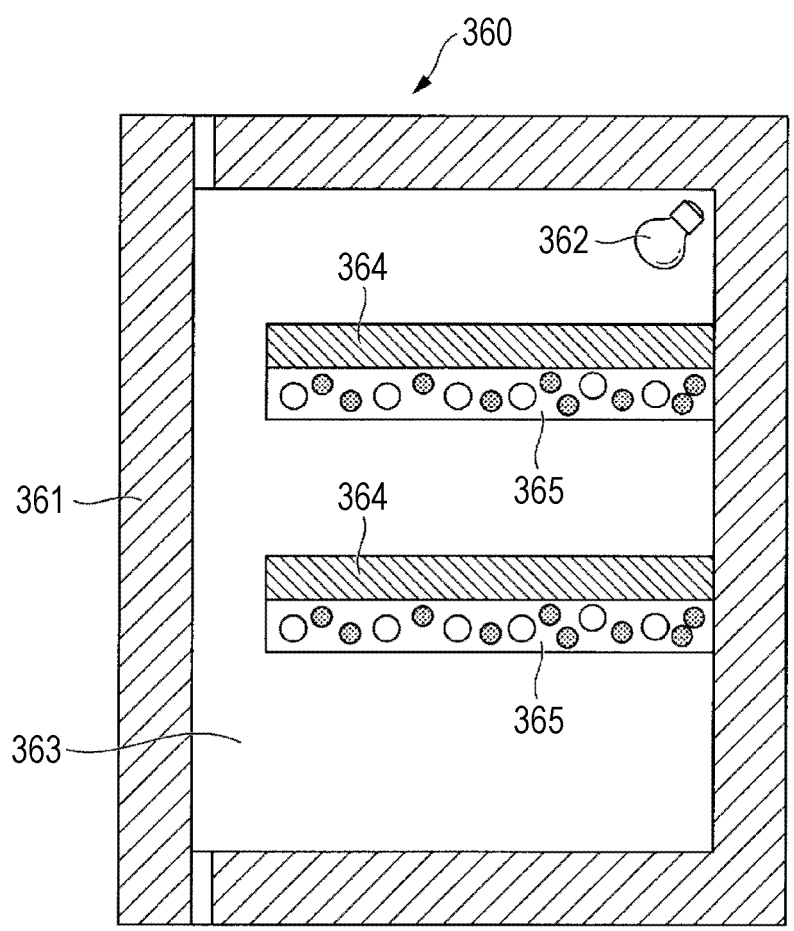
FIG. 24 is a schematic cross-sectional view showing an embodiment of a storage container according to the present invention.

FIG. 24 is a schematic cross-sectional view showing a storage container according to the embodiment.

A storage container 360 according to the embodiment is substantially configured of an opening and closing door 361, a reservoir chamber 363, an interior lamp 362 which irradiates the inside of the reservoir chamber 363, a rack member 364, and a light-scattering body film 365. The interior lamp 362 may be configured such that ON and OFF are controlled in conjunction with opening and closing the opening and closing door 361. In the reservoir chamber 363, an item is stored at a predetermined temperature. The item stored in the reservoir chamber 363 may be placed on a planar portion of the rack member 364. The light-scattering body film 365 is formed on at least a part of the rack member 364.

The interior lamp 362 may be selected in accordance with the item to be saved in the reservoir chamber 363 and is not particularly limited. Examples thereof include a fluorescent lamp, an illumination device including an LED, an illumination device including an inorganic EL element, and an illumination device including an organic EL element.

As the light-scattering body film 365, the same light-scattering body film as the light-scattering body film 20 of the aforementioned light-scattering body device according to the first to third embodiments is exemplified.

At least a part of the rack member 364 includes a material which transmits light emitted from the interior lamp 362. As the material which transmits the light, the same material as that of the aforementioned base material 31 can be used.

If the light which is incident on the light-scattering body film 365 from the interior lamp 362 via the rack member 364 is brought into contact with the light-scattering particles in the storage container 360, the light is scattered in arbitrary directions based on the grain sizes and the refractive indexes of the particles as described above. By the scattering effect of the light-scattering body film 365, it is possible to scatter the light emitted from the interior lamp 362 in the entire reservoir chamber 363. Therefore, according to the embodiment, it is possible to provide a storage container capable of maintaining the inside of the reservoir chamber 363 to be bright by efficiently using the light from the interior lamp 362.

In addition, a technical scope of the aspects of the present invention is not limited to the aforementioned embodiments, and various modifications can be made without departing from the gist of the aspects of the present invention.

For example, the display device described in the aforementioned embodiments preferably includes the polarizers provided on the light extraction side. As the polarizers, it is possible to use a combination of a conventional linear polarizer and a λ/4 plate. By providing such polarizers, it is possible to prevent reflection of external light from the electrodes in the display device or reflection of external light by the surface of the substrate or the sealing substrate and to enhance contrast of the display device. In addition, specific descriptions related to the shapes, the numbers, the arrangement, the materials, the formation methods, and the like of the respective constituent elements in the phosphor substrate and the display device are not limited to the aforementioned embodiments, and modifications can appropriately be made.

EXAMPLES

Hereinafter, a further specific description will be given of aspects of the present invention based on examples and comparative examples in the related art. However, the aspects of the present invention are not limited to the examples shown below.

Comparative Example 1

A glass substrate with a thickness of 0.7 mm was washed with water, was subjected to pure water ultrasonic washing for ten minutes, was subjected to acetone ultrasonic washing for ten minutes, was subjected to isopropyl alcohol vapor washing for five minutes, and was dried at 100° C. for one hour.

Then, a light-scattering body film with a film thickness of 10 μm was formed on one surface of the glass substrate.

Here, in order to form the light-scattering body film, 5.23 g of titanium oxide "R-25" with an average grain size of 200 nm, which was manufactured by Sakai Chemical Industry Co., Ltd., was added to 30 g of resin "LuxPrint 8155" manufactured by Teijin Dupont Films Japan as a binder for dispersing the light-scattering particles first, and the mixture was sufficiently ground and mixed by an automatic mortar for thirty minutes and was then subjected to pre-stirring at a stirring speed of 3000 rpm for fifteen minutes at an opening system room temperature by using a dispersion and stirring apparatus "Filmix 40-40 Type" manufactured by Primix Corporation.

Subsequently, the light-scattering body film with the film thickness of 10 μm was formed on one surface of the glass substrate by using a commercially available spin coater.

Then, the resulting object was heated and dried in a vacuum oven (under a condition of 200° C.) for fifteen minutes, the light-scattering body film was formed, and a light-scattering body substrate according to Comparative Example 1, which was configured of the glass substrate and the light-scattering body film formed on one surface thereof, was obtained.

Thereafter, light of 460 nm as incident light from a self-made blue directional surface light source (backlight) on which a commercially available blue LED was mounted was made to be incident from a rear surface (film surface side) of the light-scattering body substrate according to Comparative Example 1, and a property of the light outgoing from a front surface (glass surface side) of the light-scattering body substrate was observed. At this time, it was confirmed that the incident light with a directivity was scattered at a wide view angle due to the light-scattering body substrate and that intensity of the scattered light significantly decreased with respect to the incident light.

In addition, light of 460 nm as incident light from the blue directional surface light source (backlight) was made to be incident from the rear surface (film surface side) of the light-scattering body substrate according to Comparative Example 1, and a luminance view angle property of the scattered light, which was extracted from the front surface (glass surface side) of the light-scattering body substrate, at 25° C. was measured by using a commercially available luminance view angle measurement apparatus (Ez-contrast manufactured by ELDIM). As a result, a relative luminance value ($L_{60}/L_0$) in a direction at a view angle of 60° with respect to a luminance value of a view angle of 0° (normal line direction) of the blue directional surface light source for the incident light was 0.03 while the relative luminance value after passing through the light-scattering body substrate was 0.86.

In addition, total beam transmittance ([the number of photons outgoing from the light-scattering body substrate/the number of photons which were incident on the light-scattering body substrate]×100) when blue light of 460 nm was made to be incident from the rear surface (film surface side) of the light-scattering body substrate according to Comparative Example 1 was measured by using a commercially available total beam measurement apparatus (integrating sphere) (HalfMoon manufactured by Otsuka Electronics Co., Ltd.). As a result, the total beam transmittance T was 13.8%.

Comparative Example 2

A glass substrate with a thickness of 0.7 mm was washed with water, was subjected to pure water ultrasonic washing for ten minutes, was subjected to acetone ultrasonic washing for ten minutes, was subjected to isopropyl alcohol vapor washing for five minutes, and was dried at 100° C. for one hour.

Then, a light-scattering body film with a film thickness of 10 μm was formed on one surface of the glass substrate.

Here, in order to form the light-scattering body film, 1.35 g of Techpolymer "SBX-4" with an average grain size of 4 μm, which was manufactured by Sekisui Plastics Co., Ltd, was added to 30 g of resin "LuxPrint 8155" manufactured by Teijin Dupont Films Japan as a binder for dispersing the light-scattering particles first, and the mixture was sufficiently ground and mixed by an automatic mortar for thirty minutes and was then subjected to pre-stirring at a stirring speed of 2000 rpm for fifteen minutes at an opening system room temperature by using a dispersion and stirring apparatus "Filmix 40-40 Type" manufactured by Primix Corporation.

Subsequently, the light-scattering body film with the film thickness of 10 μm was formed on one surface of the glass substrate by using a commercially available spin coater.

Then, the resulting object was heated and dried in a vacuum oven (under a condition of 200° C.) for fifteen minutes, the light-scattering body film was formed, and a light-scattering body substrate according to Comparative Example 2, which was configured of the glass substrate and the light-scattering body film formed on one surface thereof, was obtained.

Thereafter, light of 460 nm as incident light from a self-made blue directional surface light source (backlight) on which a commercially available blue LED was mounted was made to be incident from a rear surface (film surface side) of the light-scattering body substrate according to Comparative Example 2, and a property of the light outgoing from a front surface (glass surface side) of the light-scattering body substrate was observed. At this time, it was confirmed that the incident light with a directivity was scattered due to the light-scattering body substrate while not scattered at a wide view angle as compared with Comparative Example 1 and that intensity of the scattered light did substantially not decrease with respect to the incident light.

In addition, light of 460 nm as incident light from the blue directional surface light source (backlight) was made to be incident from the rear surface (film surface side) of the light-scattering body substrate according to Comparative Example 2, and a luminance view angle property of the scattered light, which was extracted from the front surface (glass surface side) of the light-scattering body substrate, at 25° C. was measured by using a commercially available luminance view angle measurement apparatus (Ez-contrast manufactured by ELDIM). As a result, a relative luminance value ($L_{60}/L_0$) in a direction at a view angle of 60° with respect to a luminance value of a view angle of 0° (normal line direction) of the blue directional surface light source for the incident light was 0.03 while the relative luminance value after passing through the light-scattering body substrate was 0.62.

In addition, total beam transmittance ([the number of photons outgoing from the light-scattering body substrate/the number of photons which were incident on the light-scattering body substrate]×100) when blue light of 460 nm was made to be incident from the rear surface (film surface side) of the light-scattering body substrate according to Comparative Example 1 was measured by using a commercially available total beam measurement apparatus (integrating sphere) (HalfMoon manufactured by Otsuka Electronics Co., Ltd.). As a result, the total beam transmittance T was 93.6%.

Example 1

In the same manner as in the comparative examples, a glass substrate with a thickness of 0.7 mm was washed with water, was subjected to pure water ultrasonic washing for ten minutes, was subjected to acetone ultrasonic washing for ten minutes, was subjected to isopropyl alcohol vapor washing for five minutes, and was dried at 100° C. for one hour.

Then, a light-scattering body film with a film thickness of 10 μm was formed on one surface of the glass substrate.

Here, in order to form the light-scattering body film, 3.59 g of Techpolymer "SBX-4" with an average grain size of 4 μm, which was manufactured by Sekisui Plastics Co., Ltd, and 1.27 g of titanium oxide "R-25" with an average grain size of 200 nm, which was manufactured by Sakai Chemical Industry Co., Ltd., were added to 30 g of resin "LuxPrint 8155" manufactured by Teijin Dupont Films Japan as binders for dispersing the light-scattering particles first, and the mixture was sufficiently ground and mixed by an automatic mortar for thirty minutes and was then subjected to pre-stirring at a stirring speed of 6000 rpm for fifteen minutes at an opening system room temperature by using a dispersion and stirring apparatus "Filmix 40-40 Type" manufactured by Primix Corporation.

Subsequently, the light-scattering body film with the film thickness of 10 μm was formed on one surface of the glass substrate by using a commercially available spin coater.

Then, the resulting object was heated and dried in a vacuum oven (under a condition of 200° C.) for fifteen minutes, the light-scattering body film was formed, and a light-scattering body substrate according to Example 1, which was configured of the glass substrate and the light-scattering body film formed on one surface thereof, was obtained.

Thereafter, light of 460 nm as incident light from a self-made blue directional surface light source (backlight) on which a commercially available blue LED was mounted was made to be incident from a rear surface (film surface side) of the light-scattering body substrate according to Example 1, and a property of the light outgoing from a front surface (glass surface side) of the light-scattering body substrate was observed. At this time, it was confirmed that the incident light with a directivity was scattered at a wide view angle due to the light-scattering body substrate and that intensity of the scattered light did substantially not decrease with respect to the incident light.

In addition, light of 460 nm as incident light from the blue directional surface light source (backlight) was made to be incident from the rear surface (film surface side) of the light-scattering body substrate according to Example 1, and a luminance view angle property of the scattered light, which was extracted from the front surface (glass surface side) of the light-scattering body substrate, at 25° C. was measured by using a commercially available luminance view angle measurement apparatus (Ez-contrast manufactured by ELDIM). As a result, a relative luminance value ($L_{60}/L_0$) in a direction at a view angle of 60° with respect to a luminance value of a view angle of 0° (normal line direction) of the blue directional surface light source for the incident light was 0.03 while the relative luminance value after passing through the light-scattering body substrate was 0.84.

In addition, total beam transmittance ([the number of photons outgoing from the light-scattering body substrate/the number of photons which were incident on the light-scattering body substrate]×100) when blue light of 460 nm was made to be incident from the rear surface (film surface side) of the light-scattering body substrate according to Example 1 was measured by using a commercially available total beam measurement apparatus (integrating sphere) (HalfMoon manufactured by Otsuka Electronics Co., Ltd.). As a result, the total beam transmittance T was 56.7%.

Example 2

In the same manner as in Example 1, a glass substrate with a thickness of 0.7 mm was washed with water, was subjected to pure water ultrasonic washing for ten minutes, was subjected to acetone ultrasonic washing for ten minutes, was subjected to isopropyl alcohol vapor washing for five minutes, and was dried at 100° C. for one hour.

Then, a light-scattering body film with a film thickness of 10 μm was formed on one surface of the glass substrate.

Here, in order to form the light-scattering body film, 1.51 g of Techpolymer "SBX-4" with an average grain size of 4 μm, which was manufactured by Sekisui Plastics Co., Ltd, 1.51 g of cross-lined PS particles "XX-35BM" with an average grain size of 0.8 μm, which was manufactured by Sekisui Plastics Co., Ltd., and 1.27 g of titanium oxide "R-25" with an average grain size of 200 nm, which was manufactured by Sakai Chemical Industry Co., Ltd., were added to 30 g of resin "LuxPrint 8155" manufactured by Teijin Dupont Films Japan as binders for dispersing the light-scattering particles first, and the mixture was sufficiently ground and mixed by an automatic mortar for thirty minutes and was then subjected to pre-stirring at a stirring speed of 6000 rpm for fifteen minutes at an opening system room temperature by using a dispersion and stirring apparatus "Filmix 40-40 Type" manufactured by Primix Corporation.

Subsequently, the light-scattering body film with the film thickness of 10 μm was formed on one surface of the glass substrate by using a commercially available spin coater.

Then, the resulting object was heated and dried in a vacuum oven (under a condition of 200° C.) for fifteen minutes, the light-scattering body film was formed, and a light-scattering body substrate according to Example 2, which was configured of the glass substrate and the light-scattering body film formed on one surface thereof, was obtained.

Thereafter, light of 460 nm as incident light from a self-made blue directional surface light source (backlight) on which a commercially available blue LED was mounted was made to be incident from a rear surface (film surface side) of the light-scattering body substrate according to Example 2, and a property of the light outgoing from a front surface (glass surface side) of the light-scattering body substrate was observed. At this time, it was confirmed that the incident light with a directivity was scattered at a wide view angle due to the light-scattering body substrate and that intensity of the scattered light did substantially not decrease with respect to the incident light.

In addition, light of 460 nm as incident light from the blue directional surface light source (backlight) was made to be incident from the rear surface (film surface side) of the light-scattering body substrate according to Example 2, and a luminance view angle property of the scattered light, which was extracted from the front surface (glass surface side) of the light-scattering body substrate, at 25° C. was measured by using a commercially available luminance view angle measurement apparatus (Ez-contrast manufactured by ELDIM). As a result, a relative luminance value ($L_{60}/L_0$) in a direction at a view angle of 60° with respect to a luminance value of a view angle of 0° (normal line direction) of the blue directional surface light source for the incident light was 0.03 while the relative luminance value after passing through the light-scattering body substrate was 0.85.

In addition, total beam transmittance ([the number of photons outgoing from the light-scattering body substrate/the number of photons which were incident on the light-scattering body substrate]×100) when blue light of 460 nm was made to be incident from the rear surface (film surface side) of the light-scattering body substrate according to Example 2 was measured by using a commercially available total beam measurement apparatus (integrating sphere) (HalfMoon manufactured by Otsuka Electronics Co., Ltd.). As a result, the total beam transmittance T was 54.3%.

Example 3

In the same manner as in Example 1, a glass substrate with a thickness of 0.7 mm was washed with water, was subjected to pure water ultrasonic washing for ten minutes, was subjected to acetone ultrasonic washing for ten minutes, was subjected to isopropyl alcohol vapor washing for five minutes, and was dried at 100° C. for one hour.

Then, a light-scattering body film with a film thickness of 10 μm was formed on one surface of the glass substrate.

Here, in order to form the light-scattering body film, 3.33 g of hollow nanosilica with an average grain size of 130 nm, which was manufactured by Nittetsu Mining Co., Ltd., and 1.13 g of titanium oxide "SSP-M" with an average grain size of 50 nm, which was manufactured by Sakai Chemical Industry Co., Ltd., were added to 30 g of resin "LuxPrint 8155" manufactured by Teijin Dupont Films Japan as binders for dispersing the light-scattering particles first, and the mixture was sufficiently ground and mixed by an automatic mortar for thirty minutes and was then subjected to pre-stirring at a stirring speed of 6000 rpm for fifteen minutes at an opening system room temperature by using a dispersion and stirring apparatus "Filmix 40-40 Type" manufactured by Primix Corporation.

Subsequently, the light-scattering body film with the film thickness of 10 μm was formed on one surface of the glass substrate by using a commercially available spin coater.

Then, the resulting object was heated and dried in a vacuum oven (under a condition of 200° C.) for fifteen minutes, the light-scattering body film was formed, and a light-scattering body substrate according to Example 3, which was configured of the glass substrate and the light-scattering body film formed on one surface thereof, was obtained.

Thereafter, light of 460 nm as incident light from a self-made blue directional surface light source (backlight) on which a commercially available blue LED was mounted was made to be incident from a rear surface (film surface side) of the light-scattering body substrate according to Example 3, and a property of the light outgoing from a front surface (glass surface side) of the light-scattering body substrate was observed. At this time, it was confirmed that the incident light with a directivity was scattered at a wide view angle due to the light-scattering body substrate and that intensity of the scattered light did substantially not decrease with respect to the incident light.

In addition, light of 460 nm as incident light from the blue directional surface light source (backlight) was made to be incident from the rear surface (film surface side) of the light-scattering body substrate according to Example 3, and a luminance view angle property of the scattered light, which was extracted from the front surface (glass surface side) of the light-scattering body substrate, at 25° C. was measured by using a commercially available luminance view angle measurement apparatus (Ez-contrast manufactured by ELDIM). As a result, a relative luminance value ($L_{60}/L_0$) in a direction at a view angle of 60° with respect to a luminance value of a view angle of 0° (normal line direction) of the blue directional surface light source for the incident light was 0.03 while the relative luminance value after passing through the light-scattering body substrate was 0.78.

In addition, total beam transmittance ([the number of photons outgoing from the light-scattering body substrate/the number of photons which were incident on the light-scattering body substrate]×100) when blue light of 460 nm was made to be incident from the rear surface (film surface side) of the light-scattering body substrate according to Example 3 was measured by using a commercially available total beam measurement apparatus (integrating sphere) (HalfMoon manufactured by Otsuka Electronics Co., Ltd.). As a result, the total beam transmittance T was 53.9%.

Example 4

In the same manner as in the comparative examples, a glass substrate with a thickness of 0.7 mm was washed with water, was subjected to pure water ultrasonic washing for ten minutes, was subjected to acetone ultrasonic washing for ten minutes, was subjected to isopropyl alcohol vapor washing for five minutes, and was dried at 100° C. for one hour.

Then, a barrier (light-scattering film) was formed on the glass substrate. Hereinafter, a detailed description will be given of a formation method of the barrier.

First, a white photosensitive composition made of epoxy-based resin (refractive index: 1.59), acrylic resin (refractive index: 1.49), rutile-type titanium oxide (refractive index: 2.71, grain size: 250 nm), a photopolymerization initiator, and an aromatic solvent was stirred and mixed, and a negative-type resist was prepared.

Then, a low-refractive-index material layer formed on one surface of the glass substrate was coated with the negative-type resist by a spin coater method.

Thereafter, the resulting object was prebaked at 80° C. for ten minutes, and a coating film with a film thickness of 50 μm was formed.

After the coating film was covered with a mask capable of forming a desired image pattern, the coating film was irradiated with and exposed to an i beam (300 mJ/cm$^2$).

Then, the resulting object was developed by using an alkali developer, and a structural object with the pixel pattern shape with a barrier formed thereon was obtained.

Then, the resulting object was post-baked at 140° C. for sixty minutes and a barrier for sectioning pixels was formed by using a hot air circulation-type drier.

Then, the light-scattering body film was formed in an opening portion surrounded by the barrier.

Here, the light-scattering body film with the film thickness of 10 μm was formed in the opening portion with the use of the same light-scattering body as that in Example 1 by a dispenser method, and a light-scattering body substrate according to Example 4, which was configured of the glass substrate, the light-scattering body film formed on one surface thereof, and the barrier, was obtained.

Thereafter, light of 460 nm as incident light from a self-made blue directional surface light source (backlight) on which a commercially available blue LED was mounted was made to be incident from a rear surface (film surface side) of the light-scattering body substrate according to Example 4, and a property of the light outgoing from a front surface (glass surface side) of the light-scattering body substrate was observed. At this time, it was confirmed that the incident light with a directivity was scattered at a wide view angle due to the light-scattering body substrate and that intensity of the scattered light did substantially not decrease with respect to the incident light.

In addition, light of 460 nm as incident light from the blue directional surface light source (backlight) was made to be incident from the rear surface (film surface side) of the light-scattering body substrate according to Example 1, and a luminance view angle property of the scattered light, which was extracted from the front surface (glass surface side) of the light-scattering body substrate, at 25° C. was measured by using a commercially available luminance view angle measurement apparatus (Ez-contrast manufactured by ELDIM). As a result, a relative luminance value ($L_{60}/L_0$) in a direction at a view angle of 60° with respect to a luminance value of a view angle of 0° (normal line direction) of the blue directional surface light source for the incident light was 0.03 while the relative luminance value after passing through the light-scattering body substrate was 0.86.

In addition, total beam transmittance ([the number of photons outgoing from the light-scattering body substrate/the number of photons which were incident on the light-scattering body substrate]×100) when blue light of 460 nm was made to be incident from the rear surface (film surface side) of the light-scattering body substrate according to Example 2 was measured by using a commercially available total beam measurement apparatus (integrating sphere) (HalfMoon manufactured by Otsuka Electronics Co., Ltd.). As a result, the total beam transmittance T was 60.1%.

Example 5

In the same manner as in the comparative examples, a glass substrate with a thickness of 0.7 mm was washed with water, was subjected to pure water ultrasonic washing for ten minutes, was subjected to acetone ultrasonic washing for ten minutes, was subjected to isopropyl alcohol vapor washing for five minutes, and was dried at 100° C. for one hour.

Then, a barrier (light-scattering film) was formed on the glass substrate. Hereinafter, a detailed description will be given of a formation method of the barrier.

First, a white photosensitive composition made of epoxy-based resin (refractive index: 1.59), acrylic resin (refractive index: 1.49), rutile-type titanium oxide (refractive index: 2.71, grain size: 250 nm), a photopolymerization initiator, and an aromatic solvent was stirred and mixed, and a negative-type resist was prepared.

Then, a low-refractive-index material layer formed on one surface of the glass substrate was coated with the negative-type resist by a spin coater method.

Thereafter, the resulting object was prebaked at 80° C. for ten minutes, and a coating film with a film thickness of 50 μm was formed.

After the coating film was covered with a mask capable of forming a desired image pattern, the coating film was irradiated with and exposed to an i beam (300 mJ/cm$^2$).

Then, the resulting object was developed by using an alkali developer, and a structural object with the pixel pattern shape with a barrier formed thereon was obtained.

Then, the resulting object was post-baked at 140° C. for sixty minutes and the barrier for sectioning pixels was formed by using a hot air circulation-type drier.

Then, the light-scattering body film was formed in an opening portion surrounded by the barrier.

Here, the light-scattering body film with the film thickness of 10 μm was formed in the opening portion with the use of the same light-scattering body as that in Example 1 by a dispenser method.

Then, a low-refractive-index layer with a film thickness of 50 μm was formed on the surface opposite to the light-scattering body film and the glass substrate by the sputtering method, and a light-scattering body substrate according to Example 5, which was configured of the glass substrate, the light-scattering body film formed on one surface thereof, the barrier, and the low-refractive-index film formed on the surface, which is opposite to the glass substrate, of the light-scattering body film, was obtained. As a material of the low-refractive-index film, fluorine resin with a refractive index from about 1.35 to about 1.4 was used.

Thereafter, light of 460 nm as incident light from a self-made blue directional surface light source (backlight) on which a commercially available blue LED was mounted was made to be incident from a rear surface (film surface side) of the light-scattering body substrate according to Example 5, and a property of the light outgoing from a front surface (glass surface side) of the light-scattering body substrate was observed. At this time, it was confirmed that the incident light with a directivity was scattered at a wide view angle due to the light-scattering body substrate and that intensity of the scattered light did substantially not decrease with respect to the incident light.

In addition, light of 460 nm as incident light from the blue directional surface light source (backlight) was made to be incident from the rear surface (film surface side) of the light-scattering body substrate according to Example 1, and a luminance view angle property of the scattered light, which was extracted from the front surface (glass surface side) of the light-scattering body substrate, at 25° C. was measured by using a commercially available luminance view angle measurement apparatus (Ez-contrast manufactured by ELDIM). As a result, a relative luminance value ($L_{60}/L_0$) in a direction at a view angle of 60° with respect to a luminance value of a view angle of 0° (normal line direction) of the blue directional surface light source for the incident light was 0.03 while the relative luminance value after passing through the light-scattering body substrate was 0.86.

In addition, total beam transmittance ([the number of photons outgoing from the light-scattering body substrate/the number of photons which were incident on the light-scattering body substrate]×100) when blue light of 460 nm was made to be incident from the rear surface (film surface side) of the light-scattering body substrate according to Comparative Example 1 was measured by using a commercially available total beam measurement apparatus (integrating sphere) (HalfMoon manufactured by Otsuka Electronics Co., Ltd.). As a result, the total beam transmittance T was 63.5%.

The relative luminance ratios and the total beam transmittance of the light-scattering body substrates according to Comparative Examples 1 and 2 and Examples 1 to 5 which were described above in detail and comparison results of the respective examples and the comparative examples will be shown in Table 1.

TABLE 1

|  | Relative Luminance Ratio ($L_{60}/L_0$) | Relative Luminance Ratio (Comparison with Comparative Example 1) | Total Beam Transmittance (%) | Total Beam Transmission Ratio (Comparison with Comparative Example 1) |
|---|---|---|---|---|
| Comparative Example 1 | 0.86 | — | 13.8 | — |
| Comparative Example 2 | 0.62 | 0.72 times | 93.6 | 6.78 times |
| Example 1 | 0.84 | 0.98 times | 56.7 | 4.11 times |
| Example 2 | 0.85 | 0.99 times | 54.3 | 3.93 times |
| Example 3 | 0.78 | 0.91 times | 53.9 | 3.91 times |
| Example 4 | 0.86 | 1.0 times | 60.1 | 4.35 times |
| Example 5 | 0.86 | 1.0 times | 63.5 | 4.60 times |

Example 6

Blue Organic EL+Phosphor Scheme

In the same manner as in the comparative examples, glass substrate with a thickness of 0.7 mm was washed with water, was subjected to pure water ultrasonic washing for ten minutes, was subjected to acetone ultrasonic washing for ten minutes, was subjected to isopropyl alcohol vapor washing for five minutes, and was dried at 100° C. for one hour.

Then, a low-refractive-index film with a film thickness of 50 μm was formed on one surface of the glass substrate by the sputtering method.

As a material of the low-refractive-index film, fluorine resin with a refractive index from about 1.35 to about 1.4 was used.

Then, a barrier (light-scattering film) was formed on the glass substrate. Hereinafter, a detailed description will be given of a formation method of the barrier.

First, a white photosensitive composition made of epoxy-based resin (refractive index: 1.59), acrylic resin (refractive index: 1.49), rutile-type titanium oxide (refractive index: 2.71, grain size: 250 nm), a photopolymerization initiator, and an aromatic solvent was stirred and mixed, and a negative-type resist was prepared.

Then, a low-refractive-index material layer formed on one surface of the glass substrate was coated with the negative-type resist by a spin coater method.

Thereafter, the resulting object was prebaked at 80° C. for ten minutes, and a coating film with a film thickness of 50 μm was formed.

After the coating film was covered with a mask capable of forming a desired image pattern, the coating film was irradiated with and exposed to an i beam (300 mJ/cm$^2$).

Then, the resulting object was developed by using an alkali developer, and a structural object with the pixel pattern shape with a barrier formed thereon was obtained.

Then, the resulting object was post-baked at 140° C. for sixty minutes and the barrier for sectioning pixels was formed by using a hot air circulation-type drier.

Then, a red phosphor film, a green phosphor film, and a blue scattering body film were formed in an opening portion surrounded by the barrier. Hereinafter, a detailed description will be given of a formation method of the red phosphor film, the green phosphor film, and the blue scattering body film.

In order to form the red phosphor film, 15 g of ethanol and 0.22 g of γ-glycidoxypropylethoxysilane were added to 0.16 g of aerosil with an average grain size of 5 nm first, and the mixture was stirred at an opening system room temperature for one hour. The mixture and 20 g of red phosphor $K_5Eu_{2.5}(WO_4)_{6.25}$ were moved to a mortar, were sufficiently ground and mixed, were heated in an oven at 70° C. for two hours, and were further heated in an oven at 120° C. for two hours, and $K_5Eu_{2.5}(WO_4)_{6.25}$ with an enhanced surface was obtained.

Then, 30 g of polyvinyl alcohol dissolved in a mixture solution (300 g) of water/dimethyl sulfoxide=1/1 was added to 10 g of $K_5Eu_{2.5}(WO_4)_{6.25}$ with the enhanced surface, the mixture was stirred by a dispersion machine, and a coating fluid for forming the red phosphor was prepared.

Then, the inside of the predetermined opening portion of the barrier was coated with the coating fluid for forming the red phosphor by the dispenser method.

Then, the resulting object was heated and dried in a vacuum oven (under conditions of 200° C. and 10 mmHg) for four hours, and the red phosphor film with a film thickness of 50 μam was formed.

In order to form the green phosphor film, 15 g of ethanol and 0.22 g of γ-glycidoxypropylethoxysilane were added to 0.16 g of aerosil with an average grain size of 5 nm first, and the mixture was stirred at an opening system room temperature for one hour. The mixture and 20 g of green phosphor $Ba_2SiO_4:Eu^{2+}$ were moved to a mortar, were sufficiently ground and mixed, were heated in an oven at 70° C. for two hours, and were further heated in an oven at 120° C. for two hours, and $Ba_2SiO_4:Eu^{2+}$ with an enhanced surface was obtained.

Then, 30 g of polyvinyl alcohol dissolved in a mixture solution (300 g) of water/dimethyl sulfoxide=1/1 was added to 10 g of $Ba_2SiO_4:Eu^{2+}$ with the enhanced surface, the mixture was stirred by a dispersion machine, and a coating fluid for forming the green phosphor was prepared.

Then, the inside of the predetermined opening portion of the barrier was coated with the coating fluid for forming the green phosphor by the dispenser method.

Then, the resulting object was heated and dried in a vacuum oven (under conditions of 200° C. and 10 mmHg) for four hours, and the green phosphor film with a film thickness of 50 μm was formed.

In order to form the blue scattering body film, 3.59 g of Techpolymer "SBX-4" with an average grain size of 4 μm, which was manufactured by Sekisui Plastics Co., Ltd, and 1.27 g of titanium oxide "R-25" with an average grain size of 200 nm, which was manufactured by Sakai Chemical Industry Co., Ltd., were added to 30 g of resin "LuxPrint 8155" manufactured by Teijin Dupont Films Japan as binders for dispersing the light-scattering particles first, the mixture was sufficiently ground and mixed by an automatic mortar for thirty minutes and was then subjected to pre-stirring at a stirring speed of 6000 rpm for fifteen minutes at an opening system room temperature by using a dispersion and stirring apparatus "Filmix 40-40 Type" manufactured by Primix Corporation, and a coating fluid for forming the blue scattering body was prepared.

Then, the inside of the predetermined opening portion of the barrier was coated with the coating fluid for forming the blue scattering body by the dispenser method.

Then, the resulting object was heated and dried in a vacuum oven (200° C.) for four hours, and the blue scattering body film with a film thickness of 50 μm was formed.

Next, a dielectric body multilayered film, which was produced by alternately forming six layers of titanium oxide ($TiO_2$: refractive index=2.30) and silicon oxide ($SiO_2$: refractive index=1.47), was formed to have a film thickness of 100 nm as a wavelength selecting transflective film on the surface on the red phosphor film, the green phosphor film, and the blue scattering body film on an excitation light incident side by the sputtering method, and a phosphor substrate which was configured of the glass substrate, and the low-refractive-index film, the red phosphor film, the green phosphor film, the blue scattering body film, the barrier, and the wavelength transflective film which were formed on one surface of the glass substrate was obtained.

In contrast, a reflective electrode with a thickness of 100 nm, which was made of silver, was formed on a glass substrate with a thickness of 0.7 mm by the sputtering method, and a first electrode (positive pole) was formed by forming a film of transparent indium-tin oxide (ITO) with a film thickness of 20 nm on the reflective electrode by the sputtering method.

Thereafter, patterning for 90 stripes was performed for widths of the first electrodes of 160 μm and 200 μm by the conventional photolithography method.

Next, 200 nm of $SiO_2$ was laminated on the first electrode by the sputtering method, and patterning is performed by the conventional photolithography method so as to cover only an edge portion of the first electrode.

Here, a structure in which a short side of the first electrode corresponding to 10 μm from the end thereof is covered with $SiO_2$ was employed.

This object was washed with water, was subjected to pure water ultrasonic washing for ten minutes, was subjected to acetone ultrasonic washing for ten minutes, was subjected to isopropyl alcohol vapor washing for five minutes, and was dried at 120° C. for one hour.

Then, the substrate with the first electrode formed thereon was fixed to a substrate holder in an inline-type resistive heating vapor apparatus, a pressure was lowered to vacuum of $1 \times 10^{-4}$ Pa or less, and the respective layers which configure an organic EL layer including an organic light-emitting layer were formed. Hereinafter, a detailed description will be given of a formation method of the respective layers which configure the organic EL layer.

First, 1,1-bis-di-4-tolylamino-phenyl-cyclohexane (TAPC) was used as a hole injection material, and a hole injection layer with a film thickness of 100 nm was formed by the resistive heating vapor method.

Then, N,N'-di-I-naphthyl-N,N'-diphenyl-1,1'-biphenyl-1, 1'-biphenyl-4,4'-diamine (NPD) was used as a hole transport material, and a hole transport layer with a film thickness of 40 nm was formed by the resistive heating vapor method.

Next, a blue organic light-emitting layer (thickness: 30 nm) was formed at a desired pixel position on the hole transport layer. The blue organic light-emitting layer was formed by co-deposition of 1,4-bis-triphenylsilyl-benzene (UGH-2) (host material) and bis[(4,6-difluorophenyl)-pyridinato-N,C2']picolinate iridium (III) (Flrpic) (blue phosphorescent light-emitting dopant) at deposition speeds of 0.15 nm/sec and 0.02 nm/sec, respectively.

Next, a hole blocking layer (thickness: 10 nm) was formed on the organic light-emitting layer by using 2,9-dimethyl-4,7-diphenyl-1,10-phenanthroline (BCP).

Next, an electron transport layer (thickness: 30 nm) was formed on the hole blocking layer by using tris(8-hydroxyquinoline)aluminum ($Alq_3$).

Next, an electron injection layer (thickness: 0.5 nm) was formed on the electron transport layer by using lithium fluoride.

The respective layers which configure the organic EL layer were formed by the above processing.

Thereafter, a semi-transparent electrode was formed as a second electrode.

First, the substrate was fixed to a chamber for metal deposition, and a shadow mask for forming the semi-transparent electrode and the substrate were aligned. As the shadow mask, a mask with an opening portion provided therein so as to be able to form the second electrode with a width of 500 µm in a stripe shape at a pitch of 600 µm in a direction in which the second electrode faces the stripe of the first electrode was used.

Then, magnesium silver was formed in a predetermined pattern (thickness: 1 nm) by co-deposition of magnesium and silver on the surface of the electron injection layer at deposition speeds of 0.01 nm/sec and 0.09 nm/sec, respectively by the vacuum deposition method.

Furthermore, silver was formed thereon in a predetermined pattern (thickness: 19 nm) at a deposition speed of 0.1 nm/sec for the purpose of enhancing the interference effect and preventing a decrease in voltage due to wiring resistance at the second electrode.

The semi-transparent electrode was formed by the above processing.

Here, a microcavity effect (interference effect) appears between the first electrode and the second electrode, and it becomes possible to enhance the front luminance. With such a configuration, it is possible to efficiently deliver the light emission energy from the organic EL layer to the light extraction side. In addition, a light emission peak was adjusted to 460 nm and the half width was adjusted to 50 nm by the microcavity effect in the same manner.

Next, an inorganic protective layer with a thickness of 3 µm, which was made of $SiO_2$, was patterned and formed on a sealing area of 2 mm in vertical and horizontal directions from an end of the display portion by the plasma CVD method with a use of a shadow mask.

The organic EL element substrate with the organic EL element formed thereon was obtained by the above processing.

Next, the organic EL element substrate and the phosphor substrate created as described above were positioned based on a positioning marker formed outside a pixel arrangement position. In addition, the phosphor substrate was coated with thermoset resin in advance.

After the organic EL element substrate and the phosphor substrate were positioned, both the substrates were brought into close contact via the thermoset resin were heated at 80° C. for two hours to cure the thermoset resin, and the organic EL element substrate and the phosphor substrate were attached to each other. In addition, the process of attaching both the substrates was performed in a dry air environment (moisture amount: −80° C.) in order to prevent the organic layer from deteriorating due to the moisture.

Finally, a terminal formed in a surrounding area was connected to an external power source, and an organic EL display device according to Example 6 was completed.

Here, the blue light-emitting organic EL element was obtained as an excitation light source which was able to be arbitrarily switched, by applying a desired current from the external power source to the desired stripe-shaped electrode. By converting blue light into red light through the red phosphor film and converting blue light into green light through the green phosphor film, it was possible to obtain red and green isotropic light emission. It was possible to obtain blue isotropic light emission through the blue scattering body film. With such a configuration, it was possible to play full-color display and to obtain a satisfactory image, namely an image with a satisfactory view angle property.

Example 7

Active Drive-type Blue Organic EL+Phosphor Scheme

A phosphor substrate was produced in the same manner as in Example 6.

An amorphous silicon semiconductor film was formed on a glass substrate with a size of 100 mm×100 mm by using the PECVD method.

Then, a polycrystalline silicon semiconductor film was formed by performing crystallization processing.

Then, the polycrystalline silicon semiconductor film was patterned into a plurality of island shapes by using the photolithography method.

Then, a gate insulating film and a gate electrode layer were formed in this order on the patterned polycrystalline silicon semiconductor layer, and patterning was performed by using the photolithography method.

Thereafter, source and drain regions were formed by doping an impurity element such as phosphorus to the patterned polycrystalline silicon semiconductor film, and a TFT element was produced. Thereafter, a flattening film was formed. The flattening film was formed by laminating a silicon nitride film formed by the PECVD method and an acrylic resin layer formed by the spin coater method in this order.

Hereinafter, a detailed description will be given of the formation method of the flattening film.

First, a contact hole which communicates with the source region and/or the drain region was formed by collectively etching a silicon nitride film and a gate insulating film after the silicon nitride film was formed, and source wiring was then formed.

Thereafter, an active matrix substrate was completed by forming an acrylic resin layer and forming a contact hole, which communicates with the drain region, at the same position as that of the contact hole in the drain region, which was bored in the gate insulating film and the silicon nitride film.

The function as the flattening film was realized by the acrylic resin layer. In addition, a capacitor for adjusting a gate potential of the TFT to a constant potential was formed by disposing an insulating film such as an interlayer insulating film between a drain of a switching TFT and a source of a driving TFT.

A contact hole which electrically connects the driving TFT, the first electrode of the red light-emitting organic EL element, the first electrode of the green light-emitting organic EL element, and the first electrode of the blue light-emitting organic EL element so as to penetrate through the flattening layer was formed in the active matrix substrate.

Then, a first electrode (positive pole) of each pixel was formed by the sputtering method so as to be electrically connected to the contact hole which was provided so as to penetrate through the flattening layer connected to the TFT for driving the respective light-emitting pixels.

The first electrode was formed by laminating an Al (aluminum) film with a film thickness of 150 nm and IZO (indium oxide-zinc oxide) with a film thickness of 20 nm.

Next, the first electrode was patterned into a shape corresponding to each pixel by the conventional photolithography method.

Here, an area of the first electrode was set to 300 μm×160 μm. In addition, the substrate was formed to have a size of 100×100. A display unit was formed to have a size of 80 mm×80 mm, a sealing area with a width of 2 mm was provided in upper and lower portions and left and right portions of the display unit, and a terminal extraction unit with a width of 2 mm was further provided outside the sealing area on a side of a shorter side of the display unit. On a folding side on a side of a longer side of the display unit, a terminal extraction unit with a width of 2 mm was provided.

Next, $SiO_2$ with a thickness of 200 nm was laminated on the first electrode by the sputtering method, and a pattern of covering only an edge portion of the first electrode was formed by the photolithography method in the related art.

Here, a structure in which four sides corresponding to 10 μm from ends of the first electrode were covered with $SiO_2$ was employed, and an edge cover was obtained.

Next, the active matrix substrate with the first electrode formed thereon was washed.

As a washing method of the active matrix substrate, ultrasonic washing was performed for ten minutes by using acetone and isopropyl alcohol, for example, and UV-ozone washing was then performed for thirty minutes.

Then, the active matrix substrate with the first electrode formed thereon was fixed to a substrate holder in an inline-type resistive heating vapor apparatus, a pressure was lowered to vacuum of $1\times10^{-4}$ Pa or less, and the respective layers which configure an organic EL layer including an organic light-emitting layer were formed. Hereinafter, a detailed description will be given of a formation method of the respective layers which configure the organic EL layer.

First, 1,1-bis-di-4-tolylamino-phenyl-cyclohexane (TAPC) was used as a hole injection material, and a hole injection layer with a film thickness of 100 nm was formed by the resistive heating vapor method.

Then, N,N'-di-1-naphthyl-N,N'-diphenyl-1,1'-biphenyl-1,1'-biphenyl-4,4'-diamine (NPD) was used as a hole transport material, and a hole transport layer with a film thickness of 40 nm was formed by the resistive heating vapor method.

Next, a blue organic light-emitting layer (thickness: 30 nm) was formed at a desired pixel position on the hole transport layer. The blue organic light-emitting layer was formed by co-deposition of 1,4-bis-triphenylsilyl-benzene (UGH-2) (host material) and bis[(4,6-difluorophenyl)-pyridinato-N,C2']picolinate iridium (III) (Flrpic) (blue phosphorescent light-emitting dopant) at deposition speeds of 0.15 nm/sec and 0.02 nm/sec, respectively.

Next, a hole blocking layer (thickness: 10 nm) was formed on the organic light-emitting layer by using 2,9-dimethyl-4,7-diphenyl-1,10-phenanthroline (BCP).

Next, an electron transport layer (thickness: 30 nm) was formed on the hole blocking layer by using tris(8-hydroxyquinoline)aluminum ($Alq_3$).

Next, an electron injection layer (thickness: 0.5 nm) was formed on the electron transport layer by using lithium fluoride (LiF).

The respective layers which configure the organic EL layer were formed by the above processing.

Thereafter, a semi-transparent electrode was formed as a second electrode.

First, the active matrix substrate with the organic EL layer formed thereon was fixed to a chamber for metal deposition, and a shadow mask for forming the semi-transparent electrode and the active matrix substrate were aligned. As the shadow mask, a mask with an opening portion provided therein so as to be able to form the second electrode with a width of 2 mm in a stripe shape in a direction in which the second electrode faces the stripe of the first electrode was used.

Then, magnesium silver was formed in a predetermined pattern (thickness: 1 nm) by co-deposition of magnesium and silver on the surface of the electron injection layer at deposition speeds of 0.01 nm/sec and 0.09 nm/sec, respectively by the vacuum deposition method.

Furthermore, silver was formed thereon in a predetermined pattern (thickness: 19 nm) at a deposition speed of 0.1 nm/sec for the purpose of enhancing the interference effect and preventing a decrease in voltage due to wiring resistance at the second electrode.

The semi-transparent electrode was formed by the above processing.

Here, the microcavity effect (interference effect) appeared between the first electrode and the second electrode, and it became possible to enhance the front luminance. With such a configuration, it was possible to efficiently deliver the light emission energy from the organic EL layer to the light extraction side. In addition, a light emission peak was adjusted to 460 nm and the half width was adjusted to 50 nm by the microcavity effect in the same manner.

Next, an inorganic protective layer with a thickness of 3 μm, which was made of $SiO_2$, was patterned and formed on a sealing area of 2 mm in vertical and horizontal directions from ends of the display unit by the plasma CVD method with the use of a shadow mask.

The active drive-type organic EL element substrate with the organic EL element formed thereon was obtained by the above processing.

Next, the active drive-type organic EL element substrate and the phosphor substrate created as described above were positioned based on a positioning marker formed outside a pixel arrangement position.

In addition, the phosphor substrate was coated with thermoset resin in advance.

After the active drive-type organic EL element substrate and the phosphor substrate were positioned, both the substrates were brought into close contact via the thermoset resin and were heated at 90° C. for two hours to cure the thermoset resin, and the organic EL element substrate and the phosphor substrate were attached to each other. In addition, the process of attaching both the substrates was performed in a dry air environment (moisture amount: −80° C.) in order to prevent the organic layer from deteriorating due to the moisture.

Next, a polarizer was attached to the substrate in the light extraction direction, and the active drive-type organic EL element was obtained.

Finally, an active drive-type organic EL display device provided with the display unit with a size of 80 mm×80 mm was completed by connecting a terminal formed on the side of the shorter side to a power circuit via a source driver and connecting a terminal formed on the side of the longer side to an external power source via a gate driver.

Here, the blue light-emitting organic EL element was obtained as an excitation light source which was able to be arbitrarily switched, by applying a desired current from the external power source to the desired stripe-shaped electrode. By converting blue light into red light through the red phosphor film and converting blue light into green light through the green phosphor film, it was possible to obtain red and green isotropic light emission. It was possible to obtain blue isotropic light emission through the blue scattering body film. With such a configuration, it was possible to perform full-color display and to obtain a satisfactory image, namely an image with a satisfactory view angle property.

Example 8

Blue LED+Phosphor Scheme

A phosphor substrate was produced in the same manner as in Example 6.

TMG (trimethylgallium) and $NH_3$ were used, and a buffer layer made of GaN was grown at 550° C. on a C plane of a sapphire substrate set in a reaction container so as to have a film thickness of 60 nm.

Next, a temperature was raised up to 1050° C., and an n-type contact layer made of Si-doped n-type GaN was grown by using $SiH_4$ gas in addition to TMG and $NH_3$ to have a film thickness of 5 μm.

Next, TMA (trimethylaluminum) was added to the raw material gas, and a second clad layer made of Si-doped n-type $Al_{0.3}Ga_{0.7}N$ layer was grown at the same temperature, namely at 1050° to have a film thickness of 0.2 μm.

Next, the temperature was lowered to 850° C., and a first n-type clad layer made of Si-doped n-type $In_{0.01}Ga_{0.99}N$ was grown by using TMG, TMI (trimethylindium), $NH_3$, and $SiH_4$ to have a film thickness of 60 nm.

Next, an active layer made of non-doped $In_{0.05}Ga_{0.95}N$ was grown at 850° C. by using TMG, TMI, and $NH_3$ to have a film thickness of 5 nm. Furthermore, a first p-type clad layer made of Mg-doped p-type $In_{0.01}Ga_{0.99}N$ was grown at 850° C. by newly using CPMg (cyclopentadienylmagnesium) in addition to TMG, TMI, and $NH_3$ to have a film thickness of 60 nm.

Next, the temperature was raised up to 1100° C., and a second p-type clad layer made of Mg-doped p-type $Al_{0.3}Ga_{0.7}N$ was grown by using TMG, TMA, $NH_3$, and CPMg so as to have a film thickness of 150 nm.

Then, a p-type contact layer made of Mg-doped p-type GaN was grown at 1100° C. by using TMG, $NH_3$, and CPMg so as to have a film thickness of 600 nm.

After completion of the above operation, the temperature was lower to a room temperature, and the wafer was extracted from the reaction container and was then annealed at 720° C. to obtain a low-resistance p-type layer.

Next, a mask with a predetermined shape was formed on the surface of the p-type contact layer as the uppermost layer, and etching was performed until the surface of the n-type contact layer was exposed.

After the etching, a negative electrode made of titanium (Ti) and aluminum (Al) was formed on the surface of the n-type contact layer, and a positive electrode made of nickel (Ni) and gold (Au) was formed on the surface of the p-type contact layer.

After the positive electrode was formed, the wafer was split into a chip with a square shape of 350 μm, the LED chip was fixed to a separately prepared substrate, on which wiring for connection to the external circuit was formed, with UV curable resin, the LED chip and the wiring on the substrate were electrically connected, and a light source substrate configured of the blue LED was obtained.

Next, the light substrate and the phosphor substrate created as described above were positioned based on a positioning marker formed outside a pixel arrangement position. In addition, the phosphor substrate was coated with thermoset resin in advance.

After the light source substrate and the phosphor substrate were positioned, both the substrates were brought into close contact via the thermoset resin and were heated at 80° C. for two hours to cure the thermoset resin, and the organic EL element substrate and the phosphor substrate were attached to each other. In addition, the process of attaching both the substrates was performed in a dry air environment (moisture amount: −80° C.) in order to prevent the organic layer from deteriorating due to the moisture.

Finally, a terminal formed in a surrounding area was connected to an external power source, and an LED display device according to Example 8 was completed.

Here, the blue light-emitting organic EL element was obtained as an excitation light source which was able to be arbitrarily switched, by applying a desired current from the external power source to the desired stripe-shaped electrode. By converting blue light into red light through the red phosphor film and converting blue light into green light through the green phosphor film, it was possible to obtain red and green isotropic light emission. It was possible to obtain blue isotropic light emission through the blue scattering body film. With such a configuration, it was possible to play full-color display and to obtain a satisfactory image, namely an image with a satisfactory view angle property.

Example 9

Blue Organic EL+Liquid Crystal+Phosphor Scheme

A low-refractive-index layer with a film thickness of 50 μm was formed on one surface of a glass substrate with a thickness of 0.7 mm by the sputtering method.

As a material of the low-refractive-index layer, fluorine resin with a refractive index from about 1.35 to about 1.4 was used.

Next, a barrier (light-scattering film) was formed on the low-refractive-index layer. Hereinafter, a detailed description will be given of a formation method of the barrier.

First, a white photosensitive composition made of epoxy-based resin (refractive index: 1.59), acrylic resin (refractive index: 1.49), rutile-type titanium oxide (refractive index: 2.71, grain size: 250 nm), a photopolymerization initiator, and an aromatic solvent was stirred and mixed, and a negative-type resist was prepared.

Then, a low-refractive-index material layer formed on one surface of the glass substrate was coated with the negative-type resist by the spin coater method.

Thereafter, the resulting object was prebaked at 80° C. for ten minutes, and a coating film with a film thickness of 50 μm was formed.

After the coating film was covered with a mask capable of forming a desired image pattern, the coating film was irradiated with and exposed to an i beam (300 mJ/cm$^2$).

Then, the resulting object was developed by using an alkali developer, and a structural object with the pixel pattern shape with a barrier formed thereon was obtained.

Then, the resulting object was post-baked at 140° C. for sixty minutes and the barrier for sectioning pixels was formed by using a hot air circulation-type drier.

Then, a red phosphor film, a green phosphor film, and a blue scattering body film were formed in an opening portion surrounded by the barrier. Hereinafter, a detailed description will be given of a formation method of the red phosphor film, the green phosphor film, and the blue scattering body film.

In order to form the red phosphor film, [2-[2-[4-(dimethylamino)phenyl]ethenyl]-6-methyl-4H-pyran-4-ylidene]-propanedinitrile (DCM) (0.02 mol/kg (solid content ratio)) was mixed into epoxy-based thermoset resin first, the mixture was stirred by a stirrer, and a coating fluid for forming the red phosphor was prepared.

Then, the inside of the predetermined opening portion of the barrier was coated with the fluid for forming the red phosphor by the dispenser method.

Then, the resulting object was heated and dried in a vacuum oven (under a condition of 150° C.) for one hour, and the red phosphor film with a film thickness of 10 μm was formed.

Here, a cross-sectional shape of the red phosphor film was a semicircular shape due to an effect of water repellent processing of a low-reflective layer.

In order to form the green phosphor film, 2,3,6,7-tetrahydro-11-oxo-1H,5H,11H-[1]benzopyrano[6,7,8-ij]quinolizine-10-carboxylic acid (coumalin 519) (0.02 mol/kg (solid content ratio)) was mixed into epoxy-based thermoset resin, the mixture was stirred by a stirrer, and a coating fluid for forming the green phosphor was prepared.

Then, the inside of the predetermined opening portion of the barrier was coated with the fluid for forming the green phosphor by the dispenser method.

Then, the resulting object was heated and dried in a vacuum oven (under a condition of 150° C.) for one hour, and the green phosphor film with a film thickness of 10 μm was formed.

Here, a cross-sectional shape of the green phosphor film was a semicircular shape due to the effect of water repellent processing of the low-reflective layer.

In order to form the blue phosphor film, 3.59 g of Techpolymer "SBX-4" with an average grain size of 4 μm, which was manufactured by Sekisui Plastics Co., Ltd, and 1.27 g of titanium oxide "R-25" with an average grain size of 200 nm, which was manufactured by Sakai Chemical Industry Co., Ltd., were added to 30 g of resin "LuxPrint 8155" manufactured by Teijin Dupont Films Japan as binders for dispersing the light-scattering particles first. The mixture was sufficiently ground and mixed by an automatic mortar for thirty minutes and was then subjected to pre-stirring at a stirring speed of 6000 rpm for fifteen minutes at an opening system room temperature by using a dispersion and stirring apparatus "Filmix 40-40 Type" manufactured by Primix Corporation, and a coating fluid for forming the blue scattering body was prepared.

Then, the inside of the predetermined opening portion of the barrier was coated with the fluid for forming the blue phosphor by the dispenser method.

Then, the resulting object was heated and dried in a vacuum oven (under a condition of 150° C.) for one hour, and the blue phosphor film with a film thickness of 10 μm was formed.

Here, a cross-sectional shape of the blue phosphor was a semicircular shape due to the effect of water repellent processing of the low-reflective layer.

Next, a dielectric body multilayered film, which was produced by alternately forming six layers of titanium oxide ($TiO_2$: refractive index=2.30) and silicon oxide ($SiO_2$: refractive index=1.47) by the EB deposition method, was formed to have a film thickness of 100 nm as a wavelength selecting transflective film on the surface on the red phosphor film, the green phosphor film, and the blue phosphor film on an excitation light incident side by the sputtering method.

Then, a flattening film was formed on the wavelength selecting transflective film by the spin coating method, and a phosphor substrate which was configured of the glass substrate, and the low-refractive-index film, the red phosphor film, the green phosphor film, the blue scattering body film, the barrier, and the wavelength transflective film formed on one surface of the glass substrate was obtained.

Next, a switching element configured of a TFT was formed on the glass substrate by the conventional method.

Next, an ITO transparent electrode with a film thickness of 100 nm was formed so as to be in electrical contact with the TFT via the contact hole.

Next, a transparent electrode was patterned by an ordinary photolithography method at the same pitch as that of the pixels in the organic EL unit created in advance.

Next, an orientation film was formed by a printing method.

Next, the substrate with the TFT formed thereon and the phosphor substrate are bonded via a spacer with a thickness of 10 μm, a space between both the substrate was filled with a liquid crystal material in a TN mode, and the liquid crystal and phosphor unit was completed.

In contrast, a reflective electrode with a film thickness of 100 nm, which was made of silver, was formed on a glass substrate with a thickness of 0.7 mm by the sputtering method, and a first electrode (positive pole) was formed on the reflective electrode by forming a film of transparent indium-tin oxide (ITO) with a film thickness of 20 nm by the sputtering method.

Thereafter, patterning was performed such that the width of the first electrode was adjusted to a desired size by the conventional photolithography method.

Next, 200 nm of $SiO_2$ was laminated on the first electrode by the sputtering method, and patterning is performed by the conventional photolithography method so as to cover only an edge portion of the first electrode.

Here, a structure in which a short side of the first electrode corresponding to 10 μm from the end thereof is covered with $SiO_2$ was employed.

This object was washed with water, was subjected to pure water ultrasonic washing for ten minutes, was subjected to acetone ultrasonic washing for ten minutes, was subjected to isopropyl alcohol vapor washing for five minutes, and was dried at 120° C. for one hour.

Then, the substrate with the first electrode formed thereon was fixed to a substrate holder in an inline-type resistive heating vapor apparatus, a pressure was lowered to vacuum of $1\times10^{-4}$ Pa or less, and the respective layers which configure an organic EL layer including an organic light-emitting layer were formed. Hereinafter, a detailed description will be given of a formation method of the respective layers which configure the organic EL layer.

First, 1,1-bis-di-4-tolylamino-phenyl-cyclohexane (TAPC) was used as a hole injection material, and a hole injection layer with a film thickness of 100 nm was formed by the resistive heating vapor method.

Then, carbazolebiphenyl (CBP) was used as a hole transport material, and a hole transport layer with a film thickness of 10 nm was formed by the resistive heating vapor method.

Then, a near-ultraviolet organic light-emitting layer (thickness: 30 nm) was formed at a desired pixel position on the hole transport layer. The near-ultraviolet organic light-emitting layer was formed by depositing 3,5-bis(4-t-butyl-phenyl)-4-phenyl-[1,2,4]-triazole (TAZ) (near-ultraviolet phosphorescent light-emitting material) at a deposition speed of 0.15 nm/sec.

Next, a hole blocking layer (thickness: 20 nm) was formed on the organic light-emitting layer by using 2,9-dimethyl-4,7-diphenyl-1,10-phenanthroline (BCP).

Next, an electron transport layer (thickness: 30 nm) was formed on the hole blocking layer by using tris(8-hydroxyquinoline)aluminum ($Alq_3$).

Next, an electron injection layer (thickness: 0.5 nm) was formed on the electron transport layer by using lithium fluoride (LiF).

The respective layers which configure the organic EL layer were formed by the above processing.

Thereafter, a semi-transparent electrode was formed as a second electrode.

First, the substrate was fixed to a chamber for metal deposition, and a shadow mask for forming the semi-transparent electrode and the substrate were aligned. As the shadow mask, a mask with an opening portion provided therein so as to be able to form the second electrode with a width of 500 μm in a stripe shape at a pitch of 600 μm in a direction in which the second electrode faces the stripe of the first electrode was used.

Then, magnesium silver was formed in a predetermined pattern (thickness: 1 nm) by co-deposition of magnesium and silver on the surface of the electron injection layer at deposition speeds of 0.01 nm/sec and 0.09 nm/sec, respectively by the vacuum deposition method.

Furthermore, silver was formed thereon in a predetermined pattern (thickness: 19 nm) at a deposition speed of 0.1 nm/sec for the purpose of enhancing the interference effect and preventing a decrease in voltage due to wiring resistance at the second electrode.

The semi-transparent electrode was formed by the above processing.

The microcavity effect (interference effect) appeared between the first electrode and the second electrode, and it became possible to enhance the front luminance. With such a configuration, it was possible to efficiently deliver the light emission energy from the organic EL layer to the light extraction side. In addition, a light emission peak was adjusted to 370 nm and the half width was adjusted to 30 nm by the microcavity effect in the same manner.

Next, an inorganic protective layer with a thickness of 3 μm, which was made of $SiO_2$, was patterned and formed on a sealing area of 2 mm in vertical and horizontal directions from ends of the display unit by the plasma CVD method with the use of a shadow mask.

The organic EL element substrate with the organic EL element formed thereon was obtained by the above processing.

The organic EL element substrate and the phosphor substrate created as described above were positioned based on a positioning marker formed outside a pixel arrangement position. In addition, the phosphor substrate was coated with thermoset resin in advance.

After the organic EL element substrate and the phosphor substrate were positioned, both the substrates were brought into close contact via the thermoset resin and were heated at 80° C. for two hours to cure the thermoset resin, and the organic EL element substrate and the phosphor substrate were attached to each other. In addition, the process of attaching both the substrates was performed in a dry air environment (moisture amount: −80° C.) in order to prevent the organic layer from deteriorating due to the moisture.

Finally, a terminal formed in a surrounding area was connected to an external power source, and an organic EL display device according to Example 9 was completed.

Here, the blue light-emitting organic EL element was obtained as an excitation light source which was able to be arbitrarily switched, by applying a desired current from the external power source to the desired stripe-shaped electrode. By converting blue light into red light through the red phosphor film and converting blue light into green light through the green phosphor film, it was possible to obtain red and green isotropic light emission. It was possible to obtain blue isotropic light emission through the blue scattering body film. With such a configuration, it was possible to play full-color display and to obtain a satisfactory image, namely an image with a satisfactory view angle property.

Example 10

Blue Backlight+Liquid Crystal+Phosphor Scheme

A liquid crystal and a phosphor substrate portion were produced in the same manner as in Example 9.

Then, a directional blue backlight was combined on a liquid crystal side of the liquid crystal and phosphor substrate.

A directional blue backlight which was configured of a light source, a light guiding plate, a reflective sheet, a luminance improving sheet, and a collecting lens was used. As the light source, an LED "NFSC036C" manufactured by Nichia Corporation so as to have a peak wavelength of 465 nm was used and was arranged on the side surface of the light guiding plate. As the light guiding plate, a light guiding plate obtained by forming polycarbonate resin into a wedge shape by injection molding was used (the LED was provided on a side, on which a cross-sectional area was larger, of the wedge-shaped light guiding plate). At the bottom surface of the light guiding plate, a reflective sheet "ESR" manufactured by 3M Japan Limited. On the upper surface side (outgoing surface side) of the light guiding plate, a luminance improving film "DBEFD400" manufactured by 3M Japan Limited and a collecting Fresnel lens "CF3-0.1" manufactured by Nihon Tokushu Kogaku Jushi Co., Ltd. are mounted in this order, and the desired directional blue backlight was completed.

Finally, a terminal formed in a surrounding area was connected to an external power source, and a liquid crystal display device according to Example 10 was completed.

Here, outgoing light from the directional blue backlight was obtained as an excitation light source which was able to be arbitrarily switched, by applying a desired current from the external power source to the desired stripe-shaped electrode. By converting blue light into red light through the red phosphor film and converting blue light into green light through the green phosphor film, it was possible to obtain red and green isotropic light emission. It was possible to obtain blue isotropic light emission through the blue scattering body film. With such a configuration, it was possible to play full-color display and to obtain a satisfactory image, namely an image with a satisfactory view angle property.

INDUSTRIAL APPLICABILITY

The aspects of the present invention can be applied to a light-scattering body, a light-scattering body film, a light-scattering body substrate, a light-scattering body device, a light-emitting device, various display devices and illumination devices which use the same.

REFERENCE SIGNS LIST

10: light-scattering body
11: first particle
12: second particle
13: light-transmitting resin
20: light-scattering body film

The invention claimed is:

1. A light-emitting device comprising: an excitation light source which emits blue light; and a substrate, which is arranged so as to face the excitation light source, and on which a red phosphor film that forms a red pixel emitting red fluorescence by being excited with the blue light, a green phosphor film that forms a green pixel emitting green fluorescence by being excited with the blue light, and a blue scattering body film that forms a blue pixel scattering the blue light are formed,
wherein the substrate with the blue scattering body film formed thereon is configured of a light-scattering body device,
the light-scattering body device comprises: a light source; and the light-scattering body substrate which is arranged so as to face the light source,
the light-scattering body substrate comprises at least a light-scattering body film,
the light-scattering body film comprises at least the light-scattering body, and
the light-scattering body comprises at least light-transmitting resin; and first particles and second particles which are dispersed in the light-transmitting resin,
wherein an average grain size Da of the first particles is greater than an average grain size Db of the second particles, a refractive index na of the first particles is smaller than a refractive index nb of the second particles, and the average grain size Db of the second particles is within a range of 150 nm≤Db≤300 nm.

2. The light-emitting device according to claim 1, wherein at least one of the red phosphor film and the green phosphor film further includes a light-scattering body, wherein the light-scattering body includes at least light-transmitting resin and first particles and second particles which are dispersed in the light-transmitting resin, and
wherein an average grain size Da of the first particles is greater than an average grain size Db of the second particles, a refractive index na of the first particles is smaller than a refractive index nb of the second particles, and the average grain size Db of the second particles is within a range of 150 nm≤Db≤300 nm.

3. The light-emitting device according to claim 1, further comprising: a barrier with a light reflecting property which is formed along at least one side surface in a film thickness direction of the red phosphor film and the green phosphor film.

4. The light-emitting device according to claim 1, further comprising: a wavelength selecting transflective film provided on a side of incident surfaces, on which the blue light is incident, of the red phosphor film and the green phosphor film, the wavelength selecting transflective film transmitting at least light in a predetermined wavelength region around a peak wavelength of the blue light and reflecting at least light in a predetermined wavelength region around a light emission peak wavelength of the phosphor films.

5. The light-emitting device according to claim 1, further comprising: a low-refractive-index film provided between the phosphor films and the substrate, the low-refractive-index film having a refractive index smaller than that of the substrate.

6. The light-emitting device according to claim 1, further comprising: a light absorption layer provided in at least one of locations between the red phosphor film and the green phosphor film and between the red phosphor film and the blue scattering body film, which are adjacent to each other.

7. The light-emitting device according to claim 3, wherein at least a region, which is in contact with the light-scattering film, of the barrier has a light-scattering property.

8. The light-emitting device according to claim 5, wherein the refractive index of the low-refractive-index film is within a range of 1 or more and 1.5 or less.

9. The light-emitting device according to claim 5, wherein the low-refractive-index film is in the form of gas.

10. The light-emitting device according to claim 6, wherein the light absorption layer is formed on at least one of an upper surface and a lower surface of the barrier.

11. A display device comprising: at least a light-emitting device, wherein
the light-emitting device comprises: an excitation light source which emits blue light; and a substrate, which is arranged so as to face the excitation light source, and on which a red phosphor film that forms a red pixel emitting red fluorescence by being excited with the blue light, a green phosphor film that forms a green pixel emitting green fluorescence by being excited with the blue light, and a blue scattering body film that forms a blue pixel scattering the blue light are formed, the substrate with the blue scattering body film formed thereon is configured of a light-scattering body device, the light-scattering body device comprises: a light source; and the light-scattering body substrate which is arranged so as to face the light source, the light-scattering body substrate comprises at least a light-scattering body film, the light-scattering body film comprises at least the light-scattering body, and the light-scattering body comprises at least light-transmitting resin; and first particles and second particles which are dispersed in the light-transmitting resin, wherein an average grain size Da of the first particles is greater than an average grain size Db of the second particles, a refractive index na of the first particles is smaller than a refractive index nb of the second particles, and the average grain size Db of the second particles is within a range of 150 nm Db 300 nm.

12. The display device according to claim 11, further comprising: an active matrix drive element corresponding to the excitation light source.

13. The display device according to claim 11, wherein the excitation light source is one of a light-emitting diode, an organic electroluminescence element, and an inorganic electroluminescence element.

14. The display device according to claim 11, further comprising: a liquid crystal element which is provided between the excitation light source and the substrate, the liquid crystal element being able to control transmittance of the blue light, wherein the excitation light source is a plane-shaped light source.

15. The display device according to claim 11, wherein the excitation light source emits blue light with a directivity.

16. The display device according to claim 11, further comprising: a polarizer which is provided between the excitation light source and the substrate, the polarizer having an extinction ratio of 10000 or more at a wavelength of 435 nm or more and 480 nm or less.

17. The display device according to claim 11, further comprising: color filters between the substrate and the red phosphor film, the green phosphor film, and the blue scattering body film.

18. An illumination device comprising: a light-emitting device, wherein the light-emitting device comprises: an excitation light source which emits blue light; and a substrate, which is arranged so as to face the excitation light source, and on which a red phosphor film that forms a red pixel emitting red fluorescence by being excited with the blue light, a green phosphor film that forms a green pixel emitting green fluorescence by being excited with the blue light, and a blue scattering body film that forms a blue pixel scattering the blue light are formed, the substrate with the blue scattering body film formed thereon is configured of a light-scattering body device, the light-scattering body device comprises: a light source; and the light-scattering body substrate which is arranged so as to face the light source, the light-scattering body substrate comprises at least a light-scattering body film, the light-scattering body film comprises at least the light-scattering body, and the light-scattering body comprises at least light-transmitting resin; and first particles and second particles which are dispersed in the light-transmitting resin, wherein an average grain size Da of the first particles is greater than an average grain size Db of the second particles, a refractive index na of the first particles is smaller than a refractive index nb of the second particles, and the average grain size Db of the second particles is within a range of 150 nm≤Db≤300 nm.

* * * * *